US007901995B2

(12) United States Patent
Cherian

(10) Patent No.: US 7,901,995 B2
(45) Date of Patent: Mar. 8, 2011

(54) INTERCONNECTIONS RESISTANT TO WICKING

(76) Inventor: Gabe Cherian, Sun Valley, ID (US)

( * ) Notice: Subject to any disclaimer, the term of this patent is extended or adjusted under 35 U.S.C. 154(b) by 644 days.

(21) Appl. No.: 11/689,558

(22) Filed: Mar. 22, 2007

(65) Prior Publication Data

US 2007/0284706 A1 Dec. 13, 2007

Related U.S. Application Data

(62) Division of application No. 10/937,647, filed on Sep. 8, 2004, now Pat. No. 7,196,402, which is a division of application No. 10/075,060, filed on Feb. 11, 2002, now Pat. No. 6,884,707.

(51) Int. Cl.
*H01L 21/60* (2006.01)
(52) U.S. Cl. .................. 438/123; 257/E23.031
(58) Field of Classification Search .............. 257/666, 257/695, E23.031, E23.045, E23.046, E23.047, 257/E23.048; 438/123, 611, 612, 613, 614, 438/615, 616, 617
See application file for complete search history.

(56) References Cited

U.S. PATENT DOCUMENTS

| 4,827,611 A * | 5/1989 | Pai et al. ............... 29/843 |
| 6,670,215 B2 * | 12/2003 | Miyazaki et al. ........ 438/106 |
| 7,239,008 B2 * | 7/2007 | Nakamura ............... 257/666 |
| 7,408,242 B2 * | 8/2008 | Yamanaka et al. ....... 257/666 |

* cited by examiner

*Primary Examiner* — Roy K Potter

(57) ABSTRACT

The present invention relates generally to permanent interconnections between electronic devices, such as integrated circuit packages, chips, wafers and printed circuit boards or substrates, or similar electronic devices. More particularly it relates to high-density electronic devices.

The invention describes means and methods that can be used to counteract the undesirable effects of thermal cycling, shock and vibrations and severe environment conditions in general.

For leaded devices, the leads are oriented to face the thermal center of the devices and the system they interact with.

For leadless devices, the mounting elements are treated or prepared to control the migration of solder along the length of the elements, to ensure that those elements retain their desired flexibility.

40 Claims, 49 Drawing Sheets

| STEP 1 | STEP 2 | STEP 3 | STEP 4 |
| FIG. 64-B | FIG. 64-C | FIG. 64-D | FIG. 64-E |

INTERCONNECTIONS RESISTANT TO WICKING

CROSS-REFERENCE TO RELATED APPLICATIONS

This application is a DIVISIONAL UTILITY PATENT APPLICATION, BASED ON patent application Ser. No. 10/937,647, now U.S. Pat. No. 7,196,402 ENTITLED "INTERCONNECTIONS", which was filed on Sep. 8, 2004, which in turn is a DIVISIONAL UTILITY PATENT APPLICATION, BASED ON patent application Ser. No. 10/075,060, ENTITLED "INTERCONNECTIONS", which was filed on Mar. 11, 2002, the latter having been granted the U.S. Pat. No. 6,884,707 B1, issued Apr. 26, 2005.

This application is claiming the priority and benefits of the same references, which were claimed by the two mother applications. These references are the following six patent applications, which are three provisional patent applications and two non-provisional utility patent applications, all of which are incorporated herein in their entirety by reference:

1) Provisional Patent Application Ser. No. 60/231,387, filed Sep. 8, 2000, entitled "Probers", which will be referred to as Ref1, and 2) Provisional Patent Application Ser. No. 60/257,673, filed Dec. 22, 2000, entitled "Probes and Sockets", which will be referred to as Ref2, and 3) Provisional Patent Application Ser. No. 60/268,467, filed Feb. 12, 2001, entitled "Probes, Sockets, Packages & Columns", which will be referred to as Ref3, and 4) Non-Provisional Utility patent application Ser. No. 09/947,240, filed Sep. 5, 2001, entitled "Interconnection Devices", which will be referred to as Ref4.

5) Non-Provisional Utility patent application Ser. No. 10/075,060, filed Mar. 17, 2003, entitled "Interconnections", which will be referred to as Ref5. This application has been granted the U.S. Pat. No. 6,884,707 B1, issued Apr. 26, 2005.

6) Non-Provisional Utility patent application Ser. No. 10/937,647, filed Sep. 8, 2004, entitled "Interconnections", which will be referred to as Ref6.

This application is a "Divisional" of Ref6.

NOTE

I will refer in this application to certain pages, drawings or sketches that are included in the above References. I would like to explain here the numbering system that was used in those references, so that it will be clear which page or drawing I would be referring to later on. I will use Reference 3 to illustrate.

Reference 3 covers 4 product groups. They are Test Sockets or simply Sockets, Wafer Probes or simply Probes, Micro-Columns or simply Columns and Plastic Packages or simply Packages. The pages are identified as such. The pages of the Test Sockets are identified by TS, the Wafer Probes by WP, the Micro-Columns by MC, the Plastic Packages by PP.

Each one of these groups' documents was divided into three sections. The Specifications, the Drawings and the Additional Documents. The pages were identified as such as well. The pages in the Specifications sections by S, the Drawings by D, and the Additional Documents either by AD or by A.

So for example, page 7 in the Specifications of the Micro-Column group would be marked thus: "MC-S-7".

PS: The mother application has been revised slightly, during its prosecution. The changes stem from the fact that the drawings did not include any reference numerals when they were filed originally. So, I had to correct the drawings to show the required reference numerals, and consequently, I amended the specification to show those reference numerals in the specification as well. So, the specification included in this Divisional Application reflects those amendments. As a result, the pages have expanded slightly, so the page numbering has been altered slightly.

Also, the drawings attached to this Divisional Application are the corrected drawings, too.

ADDITIONAL LITERATURE REFERENCES

References # A-1 through A-3 relate more to Group One, "Leaded" packages, while References # A-4 through A-6 relate more to Group Tow, "Leadless" Packages. Reference # A-2 has some bearing on Group Two also. A copy of these articles can be provided upon request.

Reference # A-1: "Evaluating the Moisture Barrier" by J. J. Licari, Ph.D., Advanced Packaging Magazine, July-August 1997. A copy of the article is shown in Ref3, pages PP-AD-34 through 36, for ease of reference.

The article mainly describes a new moisture sensor that can be incorporated in plastic packages, to determine whether and when moisture has penetrated far enough into the package to damage the chip and its functionality. I am not citing this article to elaborate on the merits of the sensor, but to use some of the statements in that article that alludes to the problems with plastic packages. I will paraphrase below some of those statements:

The key to successfully encapsulating or molding single chip or multichip modules (MOM) with polymeric materials (plastics) is to select types and formulations that exhibit low moisture vapor transmission rates, low water absorption, high purity (absence of chloride, sodium or other ions) and CTEs closely matching those of the substrates and devices. Besides the plastic, another important factor in achieving reliable plastic encapsulated modules (PEM) is the integrity of the device passivation. Although considerable progress has been made in all these areas over the past 20 years, there is still a risk in using PEMs over hermetically sealed packages, especially in high reliability military, space and medical applications, exposed to temperature cycling or burn-in, triggered by small amounts of condensed moisture.

However, using this failure mechanism in a beneficial way detects the penetration of moisture and ionic contaminants through plastic or into a hermetically sealed enclosure. The failure of the MSC is an alert that moisture has penetrated the circuit surface and that the circuit is at risk due to corrosion or other moisture-induced failure.

Once the chip fails due to moisture ingress, it . . .

The benefit of using such chips in expensive MCMs is to ensure that modules in dormant storage or harsh humid environments have not permeated enough water to risk the reliability of the total circuit and system.

Screening and selecting plastic encapsulants, molding compounds and coatings for their ability to protect electronic circuits and devices from moisture.

Detecting moisture penetration during accelerated testing or dormant storage of PEMs or hermetically sealed MCMs.

Reference # A-2: "How Plasma-Enhanced Surface Modification Improves the Production of Microelectronics and Optoelectronics", by Dr. James D. Getty, March Plasma Systems, Concord, Calif., in CHIP SCALE REVIEW Magazine, January-February 2002, pp. 72 through 75.

The thrust of this article is to show the many uses of plasma in manufacturing. The reason this article is important is that the manufacturing methods listed in the article are those that can be used to create the features mentioned in the specifications of Group 2 in this application.

Another interesting point is that some of these same methods have been used to try to improve the reliability of leaded plastic packages. Let me quote the following:

"The ability to form good adhesion with package components and to remain bonded is of paramount importance, since delamination along the interfaces is a major reliability issue for plastic-encapsulated microcircuits.

Plasma treatment has been demonstrated to improve the bond strength at the plastic encapsulant, gold-plated copper leadframe interface via an enhanced chemical compatibility with the molding compound.[2] Initial studies have also indicated that plasma treatment of nickel surfaces with water-based plasma improves the adhesion of the mold compound to the nickel surface." This is leading to the third Literature Reference listed here, which was cited two lines above.

Reference # A-3: "Bonding Strengths at Plastic Encapsulant-Gold-Plated Copper Leadframe Interface," by S. Yi, J. Kim et al., Microelectronics Reliability, January 2000, p. 1212.

In addition to all that was mentioned in that article, I know that there have been other thoughts as to the reasons, why plastic packages are considered less reliable than ceramic packages. I do not have, however, at this time, any more specific articles I can refer to about this subject. I suspect a person skilled in the art knows or can find out about these other reasons. One main reason, however, is the occurrence of micro-cracks at the interface between the legs and the encapsulating plastic of the package body, as I will explain later below.

Reference # A-4: "Use of Discrete Solder Columns to Mount LCCC's on Glass/Epoxy Printed Circuit Boards", by Gabe Cherian, Raychem Corporation, Menlo Park, Calif., Fourth Annual International Electronics Packaging Conference, International Electronics Packaging Society (IEPS), Baltimore, Md., Oct. 29-31, 1984, pp. 701-710.

Reference # A-5: "Solder Columns for Surface Mounting of Leadless Ceramic Chip Carriers on Glass/Epoxy Printed Circuit Boards", by Gabe Cherian, Raychem Corporation, Menlo Park, Calif., 1985 International Symposium on Microelectronics, International Society for Hybrid Microelectronics (ISHM), Anaheim, Calif., Nov. 11-14, 1985, pp. 17-22.

Reference # A-6: "New Solder Column Alloy Improves Reliability of Chip Carrier Assemblies", by Gabe Cherian, Craig Wynn and Harry White, Raychem Corporation, Menlo Park, Calif., 18th International SAMPE Technical Conference "Materials For Space—The Gathering Momentum", Society for the Advancement of Material and Process Engineering (SAMPE), Seattle, Wash., Oct. 7-9, 1986, pp. 1056-1070.

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

The invention, as covered by Ref4, Non-provisional patent application Ser. No. 09/947,240, filed Sep. 5, 2001, entitled Interconnection Devices, generally relates to interconnection devices that make what is referred to as "temporary" interconnections, which are considered non-permanent. It relates more particularly to electrical connectors, sockets, probes, etc., and more particularly relates to high-density electrical connectors used in test and burn-in done on miniaturized electrical components. More details on this are covered in the original Application, Ref4.

The present invention generally relates to what is referred to as "permanent" interconnections, which include solderable interconnections, and/or mounting of electronic components on boards or on substrates, or on other electronic components and the like.

The present invention is presented in two groups, simply to make it easy to follow, although the two groups can be combined under the one category of permanent interconnections.

The first group relates to leaded electronic components, which have already "leads" or "legs", and/or electronic components that can be provided with leads to make them look as leaded. It mainly covers the leads of such components and the shapes and orientation of these leads, to enhance the performance of such components. This is generally referred to as "permanent" interconnection.

The second group of the present invention covers in particular interconnections between "lead-less" electronic components and boards and/or substrates, or other similar lead-less components. This is also generally referred to as "permanent" interconnection.

The invention utilizes many of the definitions and items described in the referenced provisional applications as well as the referenced patent application, and it expands on them in the section entitled "DEFINITIONS".

2. General Background and Prior Art, Applicable to Both Groups

The important background that is common to both groups is the problems resulting from exposing electronic assemblies to varying temperatures, such as thermal cycling or power cycling, or simply from being exposed to harsh environment, including hot and cold temperature environment or to excessive stresses due to shock and vibration.

In the case of leaded electronic components, the first group, like DIP Packages, it has been known that plastic packages are not as reliable as ceramic packages. Plastic packages do not last as long as Ceramic packages. The Military, the Airline Industry and the Telecommunication Industry require that component last some ten to twenty years without failure. These industries specify ceramic leaded components most of the time, because their experience leads them to believe that ceramic components can satisfy these long operating lives, better than plastic components. It has been stated that one of the reasons why plastic leaded components fail prematurely, as compared to ceramic, beside the fact that the plastic materials themselves are not considered "hermetic", is the occurrence of micro-cracks between the plastic material and the leads or rather the legs. The legs are made of metal, most of the time out of Alloy 22 or other similar metals, which ideally has a TCE that closely matches the TCE of Silicon. Regardless of the material, the legs are usually relatively stiff. After a component is assembled/soldered to its board, it has been noticed that some micro-cracks develop between the legs and the surrounding plastic material. The cracks start at the outside edges of the plastic, right next to the legs, and gradually the cracks migrate inwards and become larger, until they allow moisture and outside atmospheric gases to migrate inwards also towards the chip inside the package. This migration of undesirable materials can damage the chip or at least can make the chip "age" faster. The end result is the failure of the package. It is also believed that thermal cycling accelerates such micro-cracks. The present invention proposes certain solutions that are believed to be able to improve this situation. These solutions will be described later below.

In the case of leadless electronic components, the second group, like the BGAs and the LCCCs, it has been know for a while that soldering such components directly to substrates or to PCBs is not the right thing to do. It can lead to premature failure. This is especially true, when the component is relatively large, i.e. approx. ¼ inch or larger on the side, and when the material of the component is different than that of the substrate, e.g. when the component is silicon or ceramic, while the substrate is FR4, and when the temperature can vary considerably during the life of the assembly. For this reason, several designs have been proposed in the past to counteract the unfavorable effect of such conditions. For example, the inventor, Gabe Cherian, together with other co-inventors, had invented what was called "CCMD", Chip Carrier Mounting Device, which was later called "Solder Columns" or "Solder Quick". This is covered by U.S. Pat. Nos. 4,664,309, 4,705,205 and 4,712,721. Other attempts have been made by other inventors, which were more or less successful.

The additional problem nowadays is the fact that many of the components are being miniaturized. The center distances between contact pads are getting smaller and smaller, and the old inventions can no longer keep up with such miniaturization. For example, BGAs have center distances down to 0.020" (approx. 0.5 mm) and when we consider Chip Scale Packaging, the center distances can be even smaller. The Cherian Solder Columns were originally designed and built to work with 0.050" (approx. 1.25 mm) center distances. Cherian Solder Columns cannot readily be simply scaled down to size. For this reason, the present invention has addressed this problem and offers solutions as will be described later.

DEFINITIONS

For the purpose of the following invention description, I will use certain words or terms that may be peculiar to this application. They will be explained in the following definitions, or as I go along during the application.
Standard Integrated Circuit Packages:
  LCCC: Leadless Ceramic Chip Carrier
  BGA: Ball Grid Array Package
  PGAP: Pin Grid Array Package
  SIP: Single In-Line Package
Bending or Flexing Leads Across Flats, Across Face, Across Edge:

FIG. 1 shows two leads at a corner of a leaded package. Usually the leads of leaded electronic devices are made out of flat sheet metal, with a relatively small thickness compared to the width of the lead. The lead 101 on the right hand side of the figure is being bent "across the flats" or "across the face". This is my definition. It implies that the flat wide section of the lead is facing the bending direction 103 and 105. The lead 107 on the left-hand side of the figure is being bent "across the edge". This definition implies that the bending direction 109 and 111 is against the edge of the lead.

Lead Nomenclature, include the following, see FIG. 7, which gives the nomenclature of all these terms used in this specification: Lead Base 183, Foot 185, Heel 187, Twist 189, Stem 191, Taper 193, Pin 195 and End 197, FIG. 7.

Lead or Leg 181, FIG. 7: A connecting element that is provided on an electronic device, to mount the device or Attach it to another electronic device or a printed circuit board or substrate.

Fold Vs. Twist:

I have tried to explain the difference between fold and twist, using words only, and I could not. So, I reverted to using drawings, as in FIGS. 41 and 42.

The sketch in FIG. 41-A shows an elongated flat piece of material, strip 501. The "generatrix" lines 503 that show the form of the strip, along the whole length of the strip, are "parallel" to each other. For example, generatrix 507 anywhere at the right end of the strip is parallel to generatrix 509 at anywhere else along the length of the strip as well as at the left end of the strip.

The sketch in FIG. 41-B shows a "twist". We start at the right end 511 of the strip, in a similar position as in the sketch in FIG. 41-A. We will say that the strip at this end is in plane 513. Then we deform the strip for a certain length, and end up at the left end 515 of the strip, where the material now lays in a new plane 517. We will call this new plane, plane 517. We can see two things. First, plane 517 makes an angle "Theta" 519 with plane 513. Second, we see that the generatrix 523 is not parallel to generatrix 521 anymore. Generatrix 523 lays in plane 517 and generatrix 521 lays in plane 513. Thus the angle between generatrix 523 and generatrix 521 is the same "Theta" angle 519, that is the angle between the two planes. The transition between the right end 511 of the strip and the left end 515 is what I call "twist" 525.

The sketch in FIG. 41-C shows a "fold" 531. Here the generatrices are always parallel to each other, regardless of how much we fold the strip.

The sketch in FIG. 42-A shows a strip 541 that starts flat 543, and then it is twisted 545 and then folded 547.

The sketch in FIG. 42-B shows a strip 551 that starts flat 553, and then it is folded 555 and then twisted 557.

Group One
Interconnections for "Leaded" Components
Group Specific Background of the Invention:

The July-August 1997 issue of Advanced Packaging Magazine published an article entitled: "Evaluating the Moisture Barrier" by J. J. Licari, Ph.D. See Reference #A-1.

The article mainly describes a new moisture sensor that can be incorporated in plastic packages, to determine whether and when moisture has penetrated far enough into the package to damage the chip and its functionality. I am not citing this article to elaborate on the merits of the sensor, but to use some of the statements in that article that alludes to the problems with plastic packages. I have paraphrased some of those statements in the section "ADDITIONAL LITERATURE REFERENCES" at the beginning of this application.

In addition to all that was mentioned in that article, I know that there have been other thoughts as to the reasons, why plastic packages are considered less reliable than ceramic packages. I have cited Reference #A-3 as another possible source of information on this issue.

I do not have, however, at this time, any more specific articles I can refer to regarding this. I suspect a person skilled in the art knows or can find out about these other reasons. One main reason is the occurrence of micro-cracks at the interface between the legs and the encapsulating plastic of the package body, as I have explained at the beginning of these specifications.

PRIOR ART

As far as I know, there has never been any prior art covering anything similar to the concepts offered in this present invention. I am not aware of any. I am sorry; I could not find any.

BRIEF SUMMARY OF THE INVENTION

Purpose of the Invention

The object of the invention is to introduce certain changes and/or improvements in the "Integrated Circuit Packages", especially those made of Plastic, and assemblies that incorporate such packages and/or chips, so that they become more reliable and can better withstand the undesirable effects of thermal cycling and power cycling. The same proposed changes would also make such assemblies, more reliable and enabling them to better withstand stresses induced by shock and vibrations.

Summary of the Invention Concept

The invention intends to:

Provide "Flexible Leads" to interconnect packages to printed circuit boards or substrates.

Make the leads with a rectangular cross-section, such that the small thickness (T) will be flexible with less stiffness than the width of the cross-section (W).

Place the leads with rectangular cross-sections, in an orientation, such that the more flexible section of the column would be in the direction of the largest thermal expansion or contraction. This translates into orienting the faces of the columns towards the thermal center of the package or the assembly.

The main change, that I am proposing, is to change the "ORIENTATION" of the package leads, so that they would have their most flexible face, orientated towards what I call the "THERMAL CENTER" of the package. (I explain this later in the Specifications).

I also propose similar changes for Ceramic & Cerdip packages, as well as SIP packages.

I also introduce/propose Sockets and Connectors, that would "MATCH" the proposed improved packages.

I also introduce designs for printed circuit boards and/or substrate, also to "MATCH" these proposed improved packages.

The main goal and the advantage of the proposed changes and improvements are to make the leads more flexible, thus requiring less force to hold them in place at their anchor points in the body of the package. This translate itself into a situation, where the encapsulating plastic of the body, at the anchor or base of the leads, would be less stressed, thus less apt to crack or to generate those undesirable micro-cracks, which in turn would mean that the moisture would have less chance to penetrate to the insides of the package, thus prolonging the life of the chip and the package. In short, this translates into improving the reliability of the package. A corollary resulting advantage is that the interconnections between the package and the substrates would last longer and the whole system would be more reliable.

BRIEF DESCRIPTION OF THE SEVERAL VIEWS OF THE DRAWINGS

Reference #3, Provisional Patent Application Ser. No. 60/268,467, filed Feb. 12, 2001, entitled Probes, Sockets, Packages & Columns Sockets, which will be referred to as Ref3, has been made part of this application, by reference, at the beginning of this application. Consequently, I would like to use the drawings that were included in Ref3, as part of this application.

So, I will first briefly describe the drawings and sketched that were included in Ref3. This is because many of those drawings are just for explanation reasons. I will refer to those drawings in the present description. But there is no need to duplicate all those drawings here.

Figure 1:
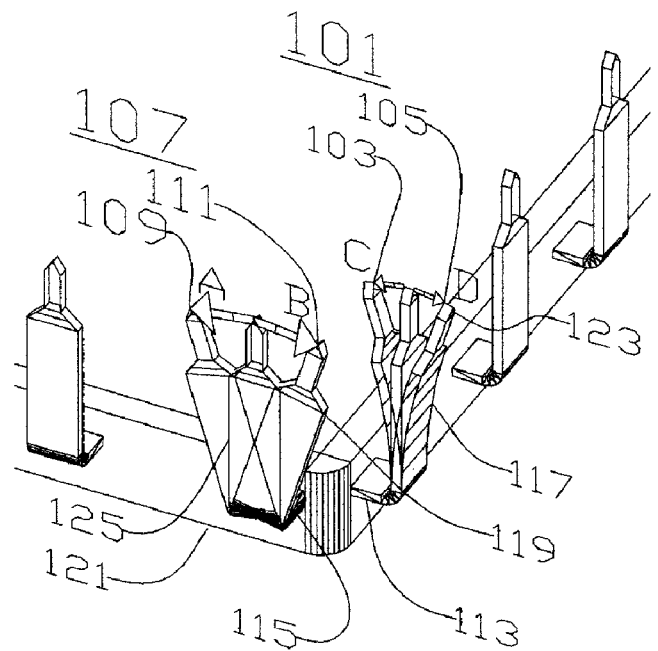

Only for this specific list, I will simply refer to these drawings by their page numbers in Ref3, i.e. instead of saying "Ref3, page PP-D-1, 2, 3, . . . ", I will simply say "Page 1, 2, 3, . . . " or even "-1, -2, -3, . . . ".

Afterwards, I will briefly describe the additional or duplicate drawings that are included in this present application.

Drawings in Reference #3:

Pages 1-6 show the basic premise on which the invention is based, namely that the thermal and expansion of bodies occurs radially from a "center" or what I refer to as the "Thermal Center". They show that the leads better be oriented such as to face this thermal center. The figure in -2 shows a typical example of such leads orientation. The figure in -3 shows some additional details of such orientation. The figure in -4 shows a typical package. The top picture shows the "present" way of orienting the leads, while the lower picture, the "proposed" way. The figures in -5 and 6 show an enlarged view of such leads oriented "radially" to provide maximum flexibility and minimum resistance to deflection.

Pages 7 & 8 are a rough attempt to show that a lead acts stiffer if we want to bend it across its edges than if we bend it across its flats. The figure in -7 sheet shows a brief explanation of the effect of the lead orientation and stiffness on the amount of force induced in the leads and consequently in the package due to thermal expansion and deflection. The figure in -8 is an oversimplified calculation, showing the magnitude of force required to flex a cantilever beam the same amount of deflection, in two orientations. One time across the flat cross-section and the other time across edge. Under certain assumptions, the force to create a certain deflection across the flats is only 37% of the force required to create the same deflection if it is across the edge.

Pages 9-12 show leads twisted as per present invention, such that the "faces" of the leads are oriented towards the thermal center of the package. The figures show a simplified picture of a package with bent leads, where the leads have been twisted, so that their flat section is perpendicular to the thermal deflection. You notice that practically every lead's flat section is "looking" to the center point of the package, i.e. the center of the thermal deformation (expansion or contraction).

Pages 13-16 show enlarged views of the twisted leads at the four corners of the package. The leads at the centerline of the package would not be twisted. The leads in between, i.e. between the center and the farthest corners, will be twisted at angles proportionately to their distance from the centerline.

Pages 17-21 show a way of manufacturing packages with such twisted leads out of a standard leadframe.

Pages 22-24 show a way to obtain twisted leads on a strip. They show how a strip of stamped leads can be twisted to suit the appropriate package they will be used for.

Page 25 shows such strips with twisted leads being attached to the side of a ceramic package. It shows how such a lead strip can be, say brazed, to the side of a package then the carrier strip would be broken off to end-up with what is called side-brazed "twisted" leads.

By the way, the figures in -9 through 21 apply more to plastic molded packages, while the figures in -22 through 25 apply more to ceramic packages. However, there is no reason the concepts can be utilized to either plastic or ceramic packages, as desired.

Pages 26-31 do not belong to this group. They belong to the second group, i.e. the interconnections for leadless components. They will be discussed at length when I cover that group. However, some of the concepts in that group would still apply to this group as well.

The figures in -32 through -40 and -101 and -102 show various typical conventional standard plastic packages. You can notice that all the leads have been folded such that their flat faces are in an orthogonal pattern. This means they follow two perpendicular axes, which are the geometrical axes of the package body.

The figures in -41 and -101 show a partial inside view of a standard package. They show the leadframe, and the method of attaching the dies to the leadframe. The chips and any other components are attached to the leadframe. The outside leads of the package extend from that leadframe, through the plastic body of the package. Originally they are flat, in the same plane of the leadframe. After encapsulation, the leads get bent down to become perpendicular to the original leadframe. But they stay in the same vertical/perpendicular plane, parallel to the package axis and in line with each other.

This creates a "rectangular" or "parallel" pattern of vertical leads, as shown in drawings in -32, -40 and -41.

Page 42 is a duplicate of Page 1, except that it shows also some leads facing the thermal center. Back to my previous explanations, I propose to "ORIENT" the leads more along a circular pattern, with the center being the theoretical center of thermal expansion and contraction. I will call that, the "THERMAL CENTER". This thermal center is expected to be the "GEOMETRICAL" center of the package. This should be true, if the package is made of a homogeneous material & the components inside it are relatively all uniformly and symmetrically distributed inside it. If there are some non-symmetry, the thermal center may vary slightly form the geometrical center.

I have added a few lines to the old drawing in -1, and have called it -42. It shows, a little bit more graphically, what I mean by orienting the leads towards the "thermal" center.

The drawing in -43 shows another example of how the leads would be oriented towards the thermal center. It shows the bottom face of a BGA, with its contact pads, assuming that they are square. Then on top of that some contact leads, or columns, are shown, all oriented to face the thermal center. You also notice that in the "Middle" of the package, I have shown a circle. This represents an "ANCHOR", which can be added. Its location should be pretty close to the "thermal" center. This anchor will be explained in more details in group 2 of this application, covering the leadless packages.

The "ANCHOR" can be added whenever necessary. Its location should be pretty close to the "thermal" center. The anchor is basically a round or square piece of metal or ceramic, which could be soldered or "glued" in place between the package and the PCB. The purpose of the anchor is to give the assembly more strength, to resist the effects of "Shocks and Vibrations". The anchor should have an appropriate height, so that the height, together with the thickness of the solder layers or the glue layers will have a total height equivalent to that of the leads. The location and size (diameter or side length) of the anchor will make it, that there will not be much stresses on it from the effects of thermal expansion or contraction.

Pages 44-45 show some columns like the ones shown in page 43. The drawing shows some leads, which can be used with the dwg -43. In this case, the leads are formed to be "surface-to-Surface" mounted between the package and its mounting board (Printed Circuit Board).

The sketch on the left-hand side of -46 shows a DIP package. On the right hand side of that sketch, the leads are shown as in the "CONVENTIONAL" way of aligning the leads. The left-hand side of that sketch shows the leads "oriented" as per present invention.

The sketch in -47 shows another view of the anchor, with Surface-to-Surface leads. The sketch also shows the package with leads along the main axes of the package. In this case, the leads would be "orthogonal", because that is the direction to the thermal center anyway.

Pages 48-55 show the typical standard conventional method of manufacturing leaded plastic packages and of forming their leads.

The drawing in -48 shows the leadframe, which can have more than one package in a row.

The drawings in -49 through 55 show close-ups, showing practically only one package of the leadframe.

The drawing in -49 shows the blank leadframe, as stamped.

The drawing in -50 shows the die (chip) attached to the inside ends of the leads. This can be done in several various methods. These however do not affect the spirit of this invention.

The drawing in -51 shows the package, after the plastic encapsulating material has been molded over the chip and the internal portions of the leads. Again, various plastic material can be used, but that too does do not affect the spirit of this invention.

The drawing in -52 shows the package of -51, after the "Molding DAMS" have been trimmed off.

The drawing in -53 shows the external portions of the leads after they have been bent or folded down.

The drawing in -54 shows the final package, after it has been separated from the leadframe scrap material.

The drawing in -55 shows a top view or a bottom view of the package. Notice that the leads now are all parallel to the sides of the package. The leads in each row are all in the same plane, and in-line with each other. This is what I call "ORTHOGONAL".

The drawings in pages -56 through -70 show one way to achieve the goal of this invention, i.e. they show the method of manufacturing oriented leads, as per present invention. They are basically two groups of the same drawings, except that the drawings from -56 through 62 show the leadframe with three package sites, while the drawings from -63 through -70 show a closer view, concentrating on only one package site. The drawings in -56 and -63 show a leadframe similar to the one shown in -48, with only one difference. The external portions of the leads here are shown slightly twisted out of flat. These are the portions of the leadframe that will become the leads or legs of the leaded package.

Pages 71-74 show more twisted leads, similar to the ones shown in pages 9-12. They show some details as to how the leads might look like after the final forming operation. These are similar to those shown in the old drawings PP-D-9 through -21.

Pages 75-77 show more twisted leads on a strip, similar to the ones shown in pages 22-24.

Pages 78-81 show twisted leads that can be brazed to the side of a package, similar to ones shown in page 25.

Pages 82-87 show leadframes that have their leads, while they are still on the flat, oriented properly, so that they do not need to be "twisted". They only need to be "folded" over a 90 degrees angle and they become oriented properly automatically.

Pages 88-95 show some leads made by NAS. They can be attached to leadless packages, to render them "leaded". They can also be reshaped to become "twisted" as per this invention.

Pages 96-98 show SIP, Single in Line packages, with leads oriented as per invention. Also a few other details.

Page 99 shows a standard DIP and another DIP with oriented leads.

Page 100 shows a package with oriented leads, and the contact springs of a socket. The socket contact springs are oriented to mate properly with the oriented leads of the package.

Page 101 shows another package with a cutout to show the guts of the device, especially the die attach. This is similar to page, Page 102 shows another standard package, like the ones shown in pages . . .

Page 103 shows a plug connector made by "Multi-Contact". It has a number of fingers that are "twisted" for a particular reason. The only purpose of showing this is to show that twisting sheet metal is not novel and can be done.

Pages 104-105 show how contact pads on a Printed Circuit Board can be shaped to work with twisted leads of packages, as per present invention.

Page 106 shows very roughly that orienting leads as per invention could improve the performance of packages, if the leads are oriented as per present invention.

Now, I will give a brief description of the drawings that are included in this present specification.

FIG. 1 attempts to show the flexing of the leads. On the right hand side, the lead 101 is flexing across the "flats", while the lead 107 on the left-hand side is flexing across the edge.

Figure 2:
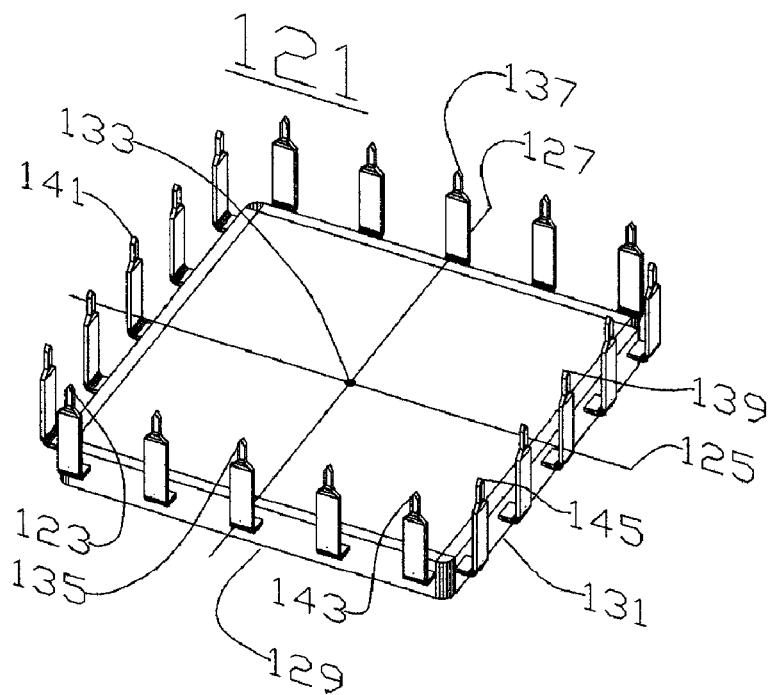
Figure 3:
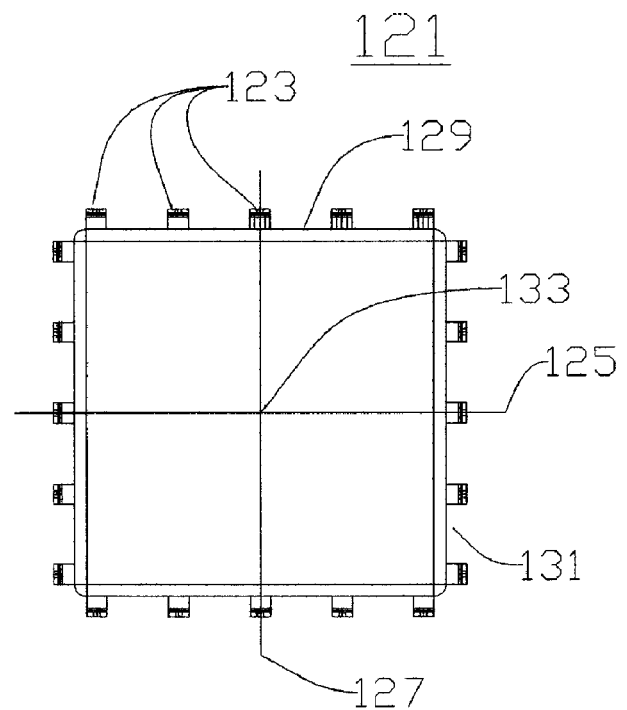

FIGS. 2 and 3 show the standard or conventional way of making leaded packages, where the leads 123 are folded to end up being in an orthogonal pattern, i.e. they face the axes 125 and 127 and sides 129 and 131 of the packages 121.

Figure 4:
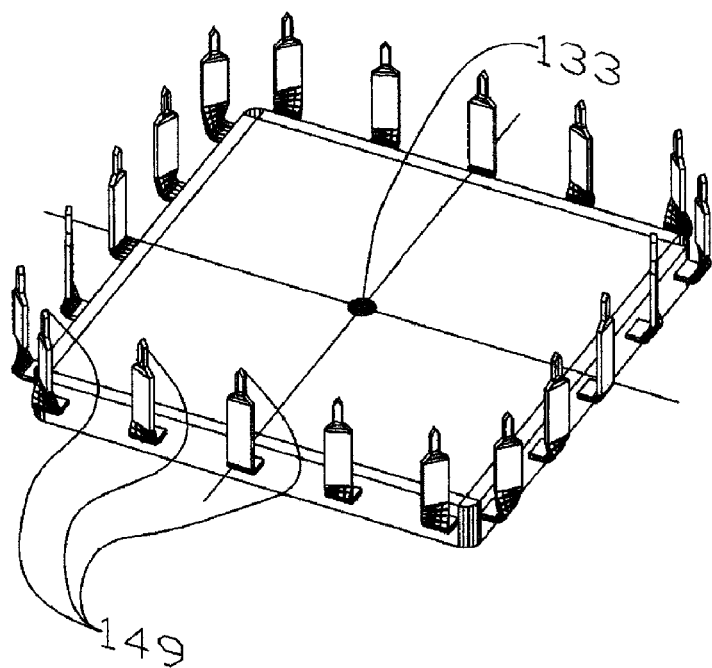
Figure 5:
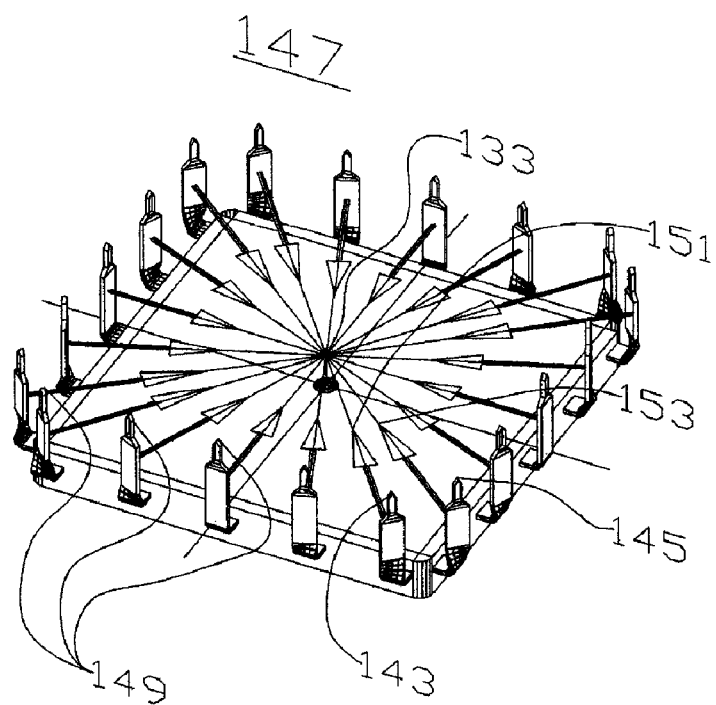
Figure 6:
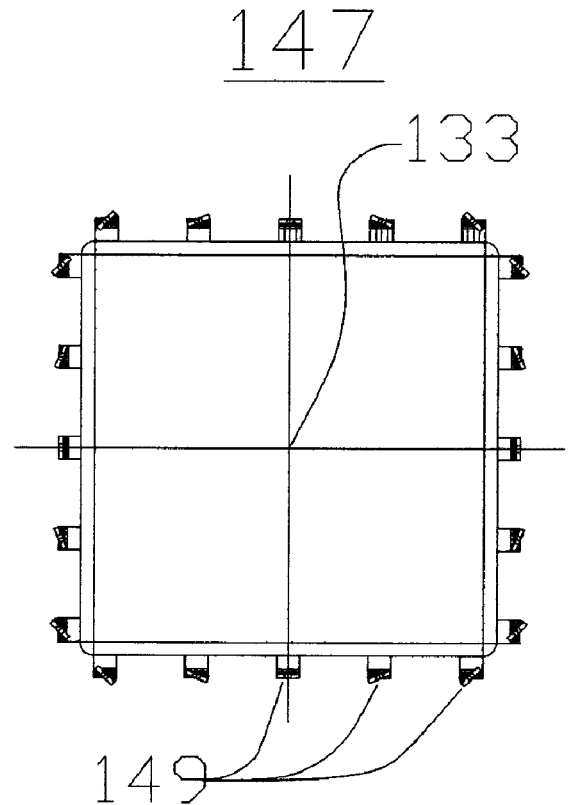

FIGS. 4 through 6 show packages 147 with the leads 149 oriented towards the thermal center 133 of the package, as per this present invention.

Figure 7:
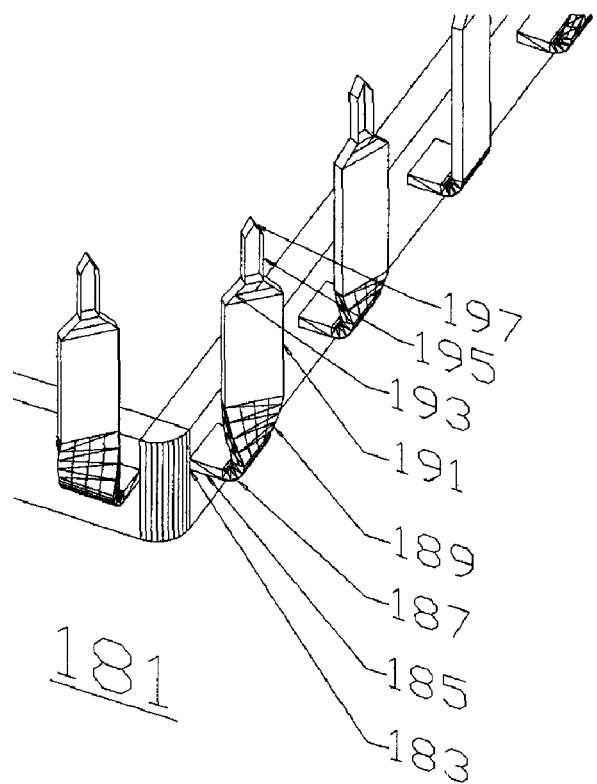
Figure 8:
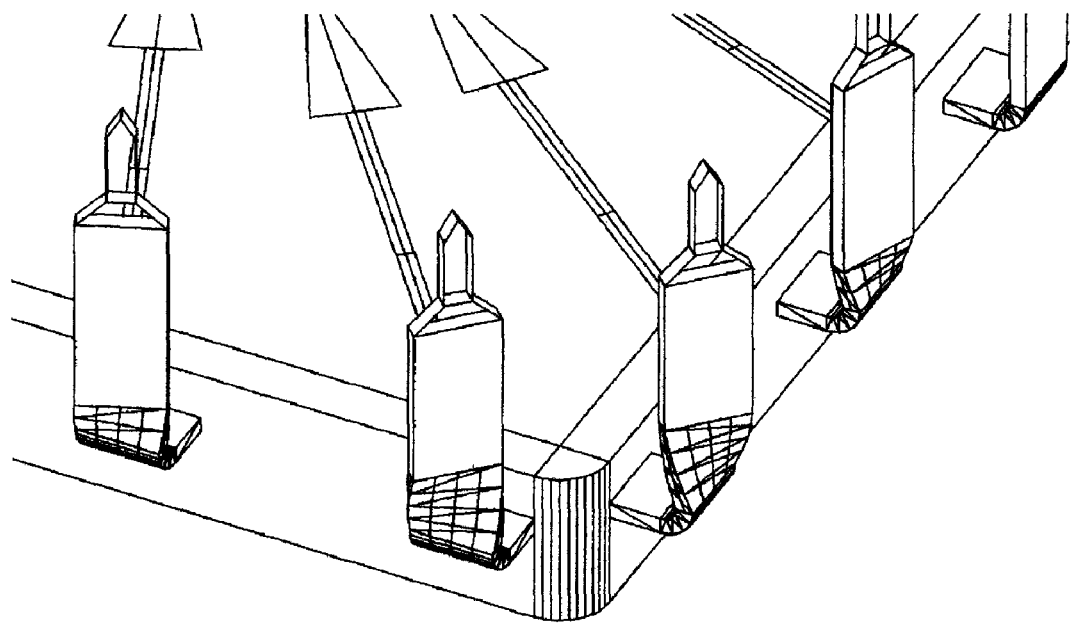
Figure 9:
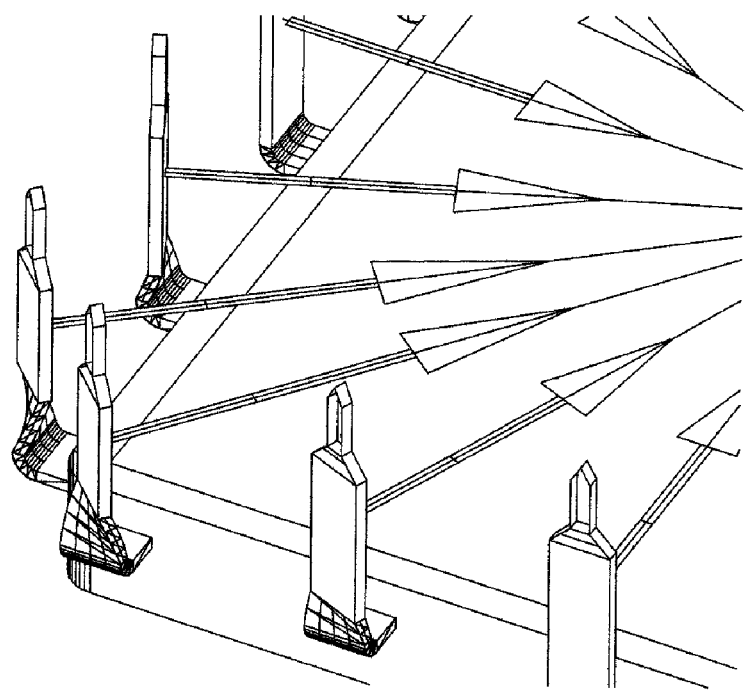
Figure 10:
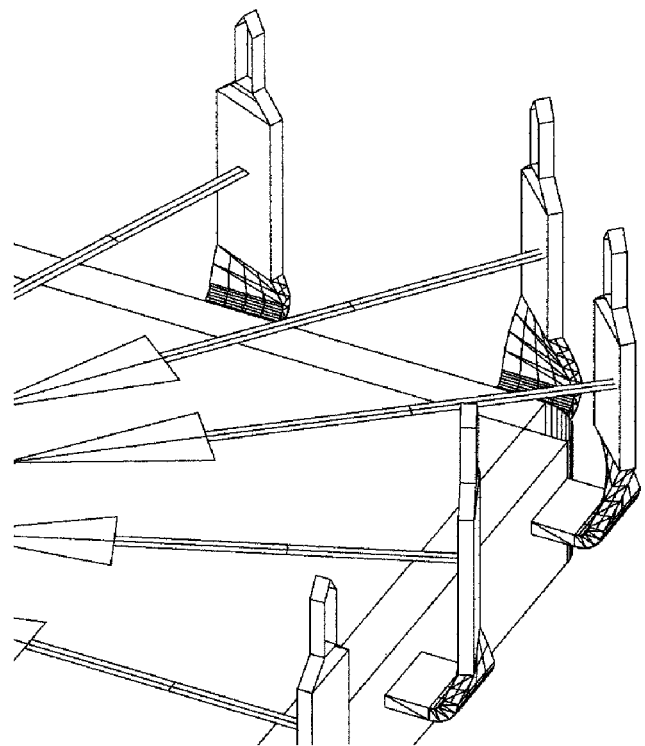
Figure 11:
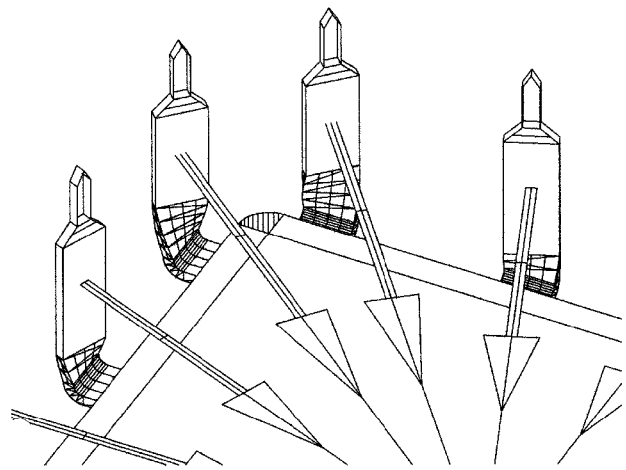

FIG. 7 shows an enlarged view of the twisted leads, as per present invention, together with the nomenclature used in this specification.

FIGS. 8 through 11 show different views of the twisted leads, as per present invention.

FIGS. 12 through 19 show the manufacturing method for making leaded packages, with twisted leads, as per present invention.

Figure 20:
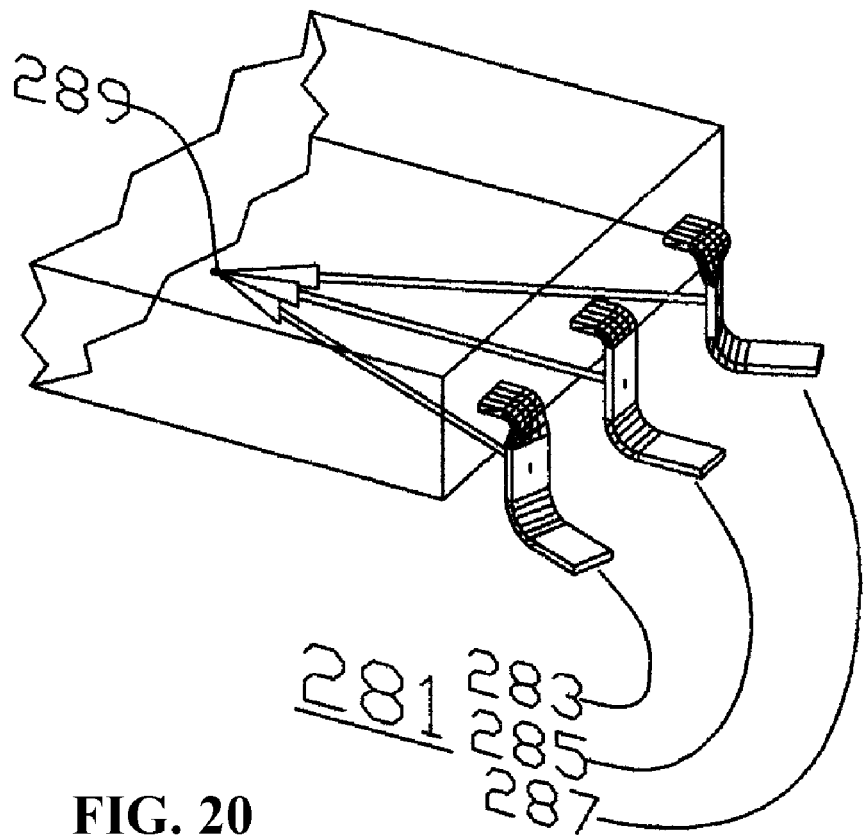

FIG. 20 shows a package with oriented gull wing leads.

Figure 21:
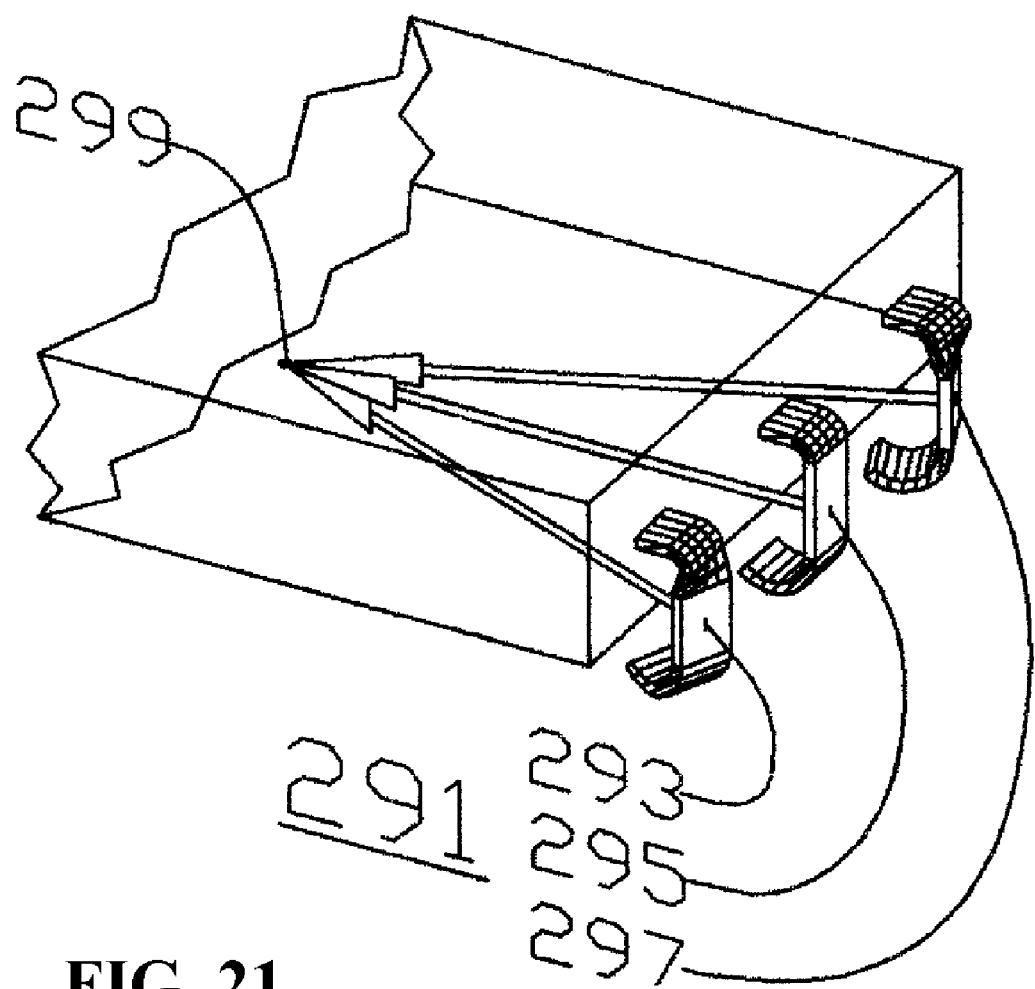

FIG. 21 shows a package with oriented Jay-Leads.

Figure 22:
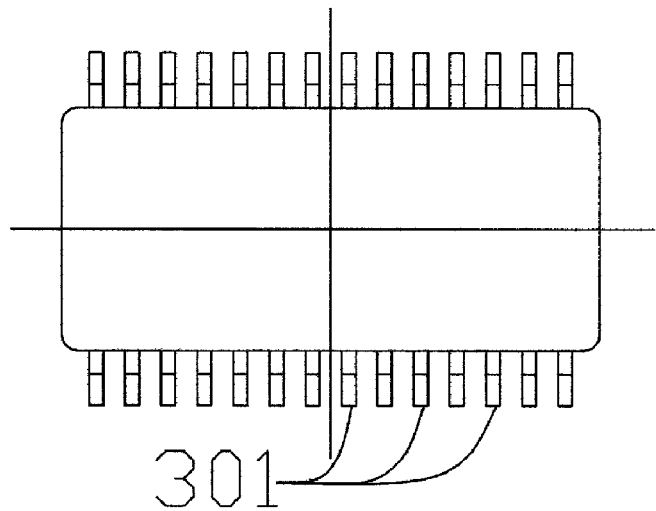
Figure 22:
Figure 22:
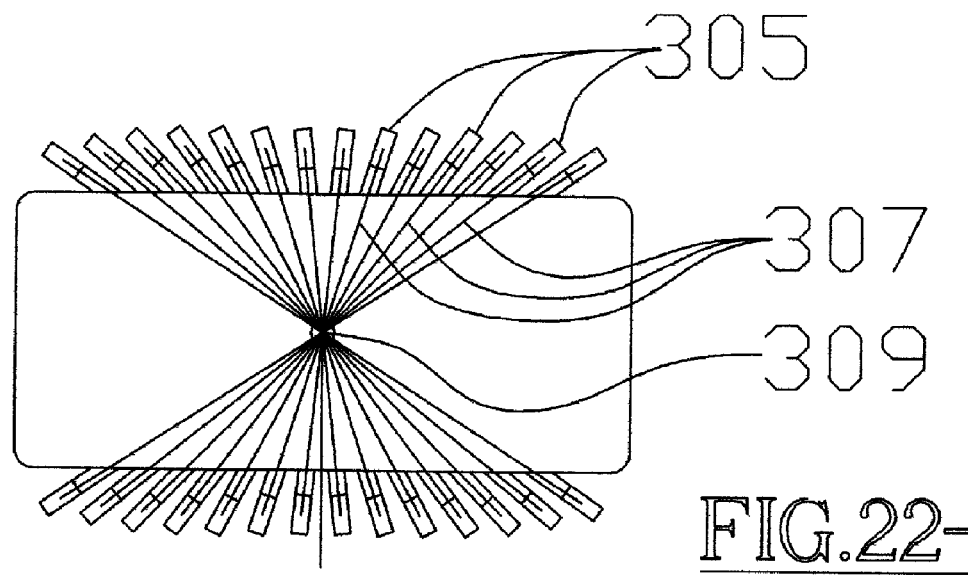

FIG. 22 shows packages with gull-wing leads, and the footprint of those leads. The top package has its leads formed the conventional way, while the bottom package has oriented leads.

Figure 23:
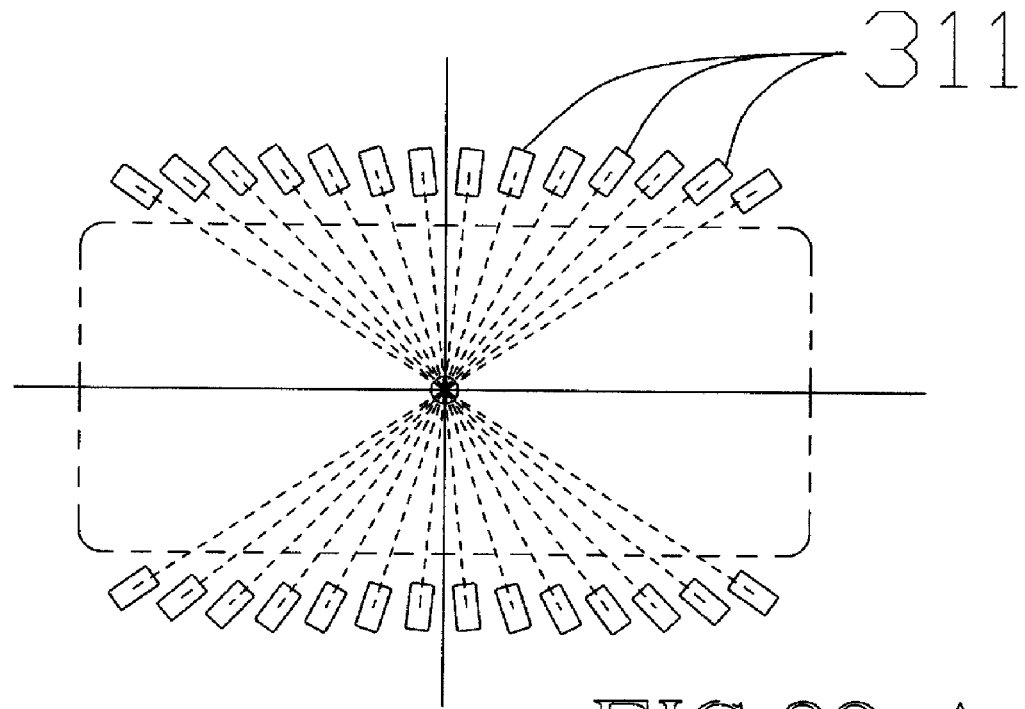
Figure 23:
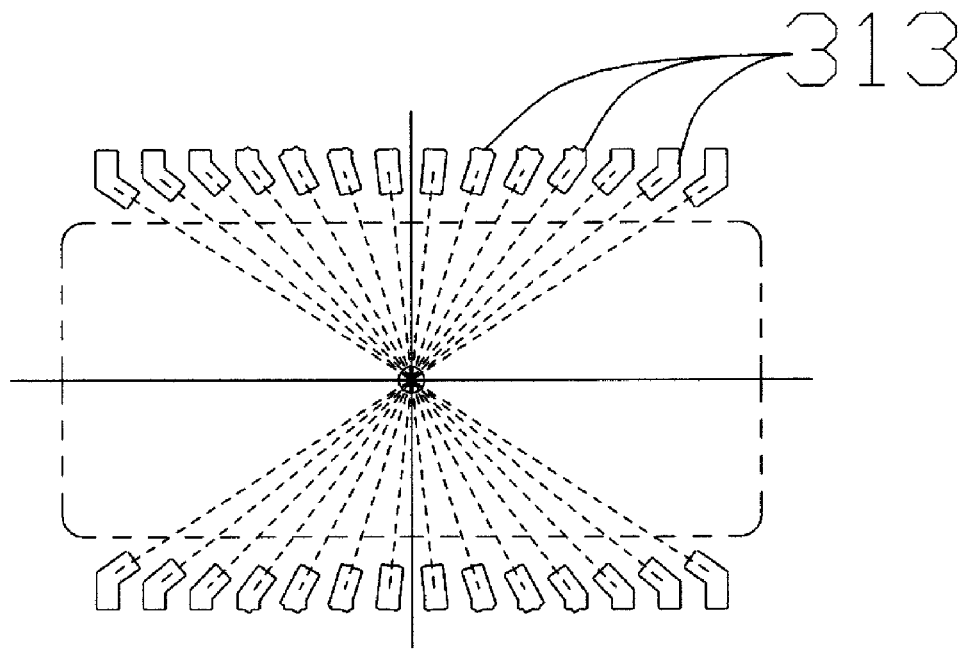

FIG. 23 shows the contact pads, say on a PCB, that would accept the leads in FIG. 22

Figure 24:
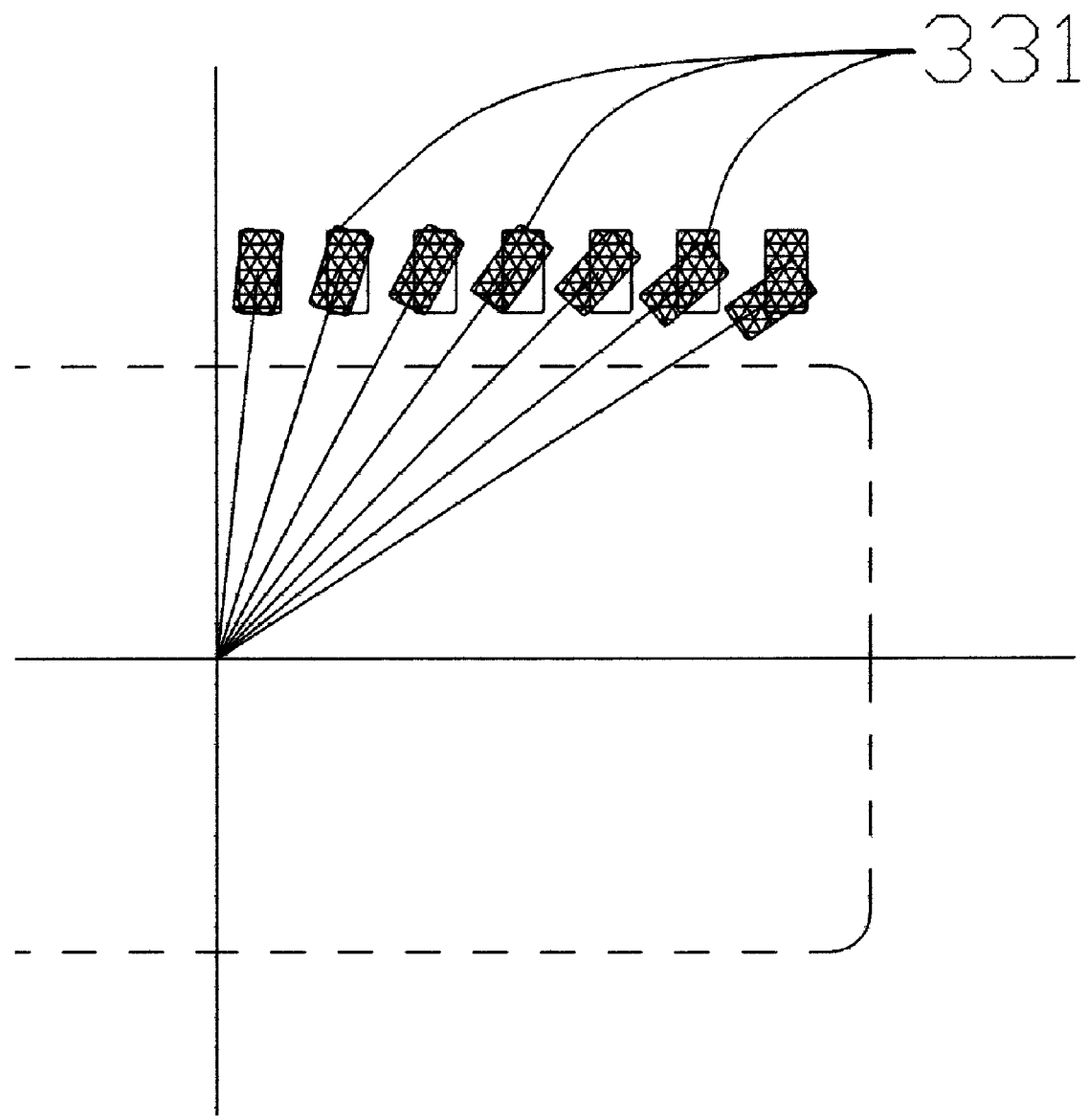

FIG. 24 shows contact pads that could accept both the leads of standard as well as oriented packages.

Figure 25:
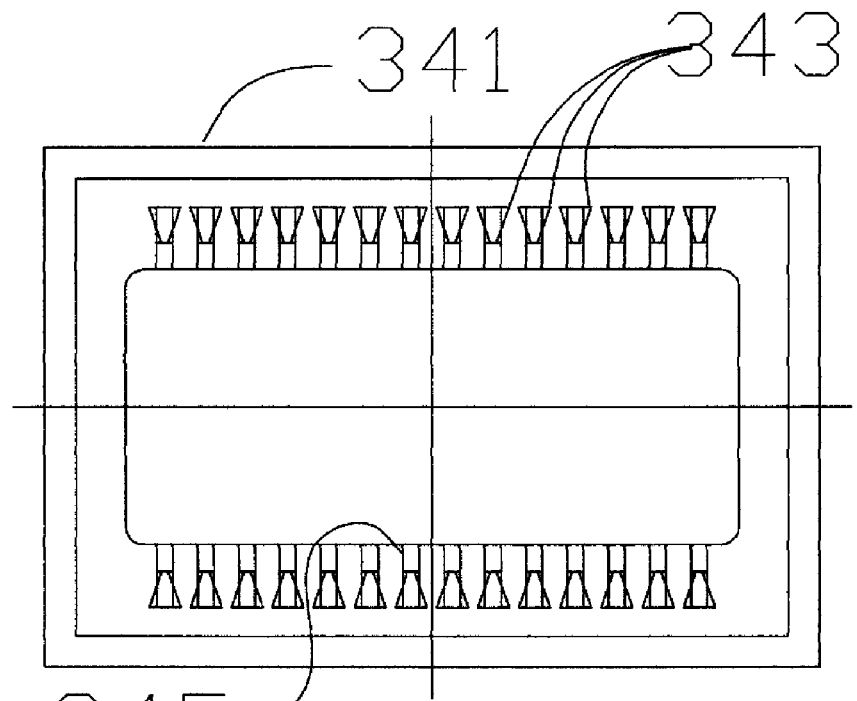
Figure 25:
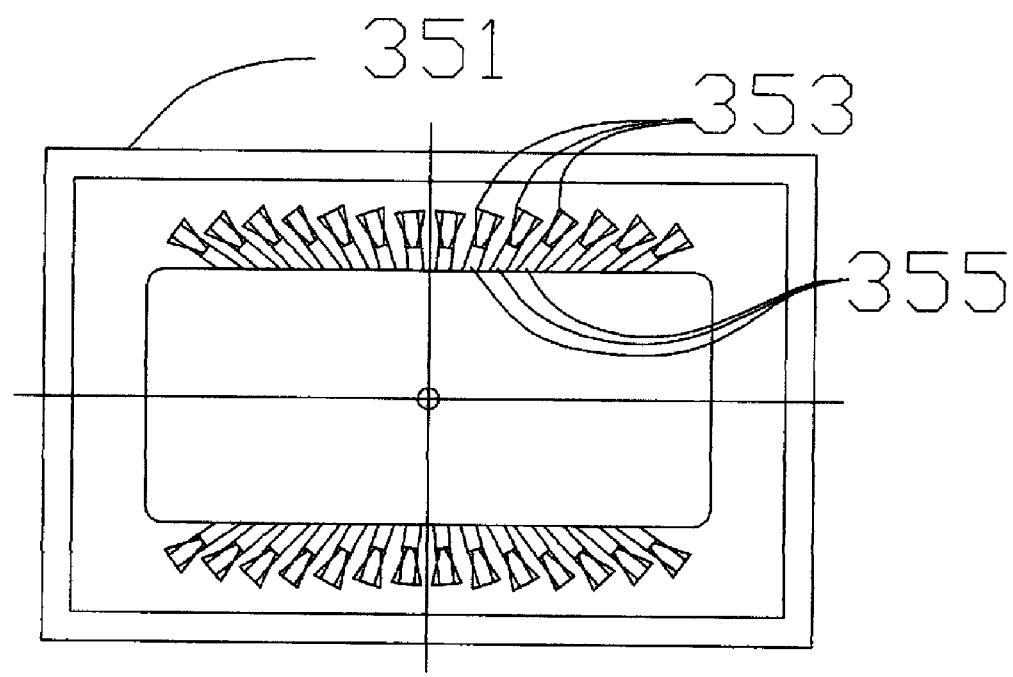

FIG. 25 shows the sockets for leaded packages. The top one is for a conventional type of package. The bottom one is for a package with oriented leads, as per present invention.

Figure 26:
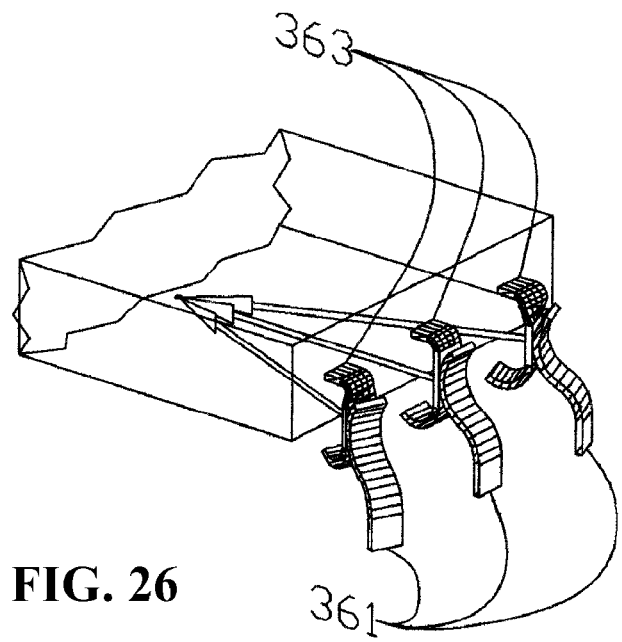

FIG. 26 shows how the contact springs of a socket or connector could be oriented, in the same direction as their corresponding oriented package leads, so as to better mate with those leads.

Figure 27:
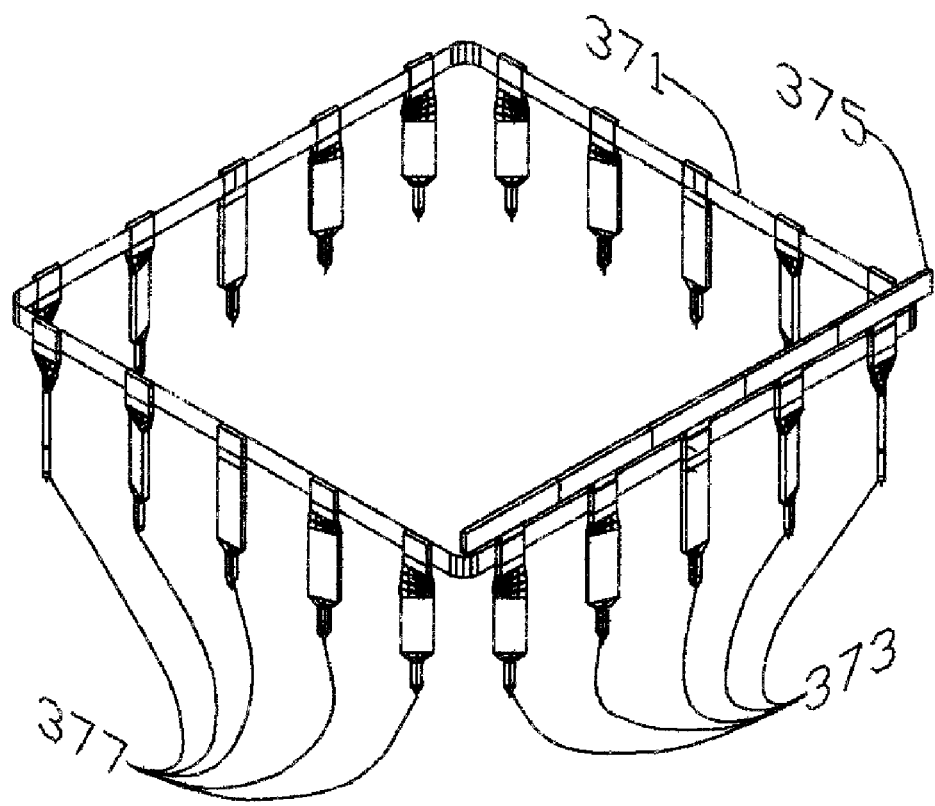

FIG. 27 shows how twisted leads could be attached to the side of a package.

Figure 28:
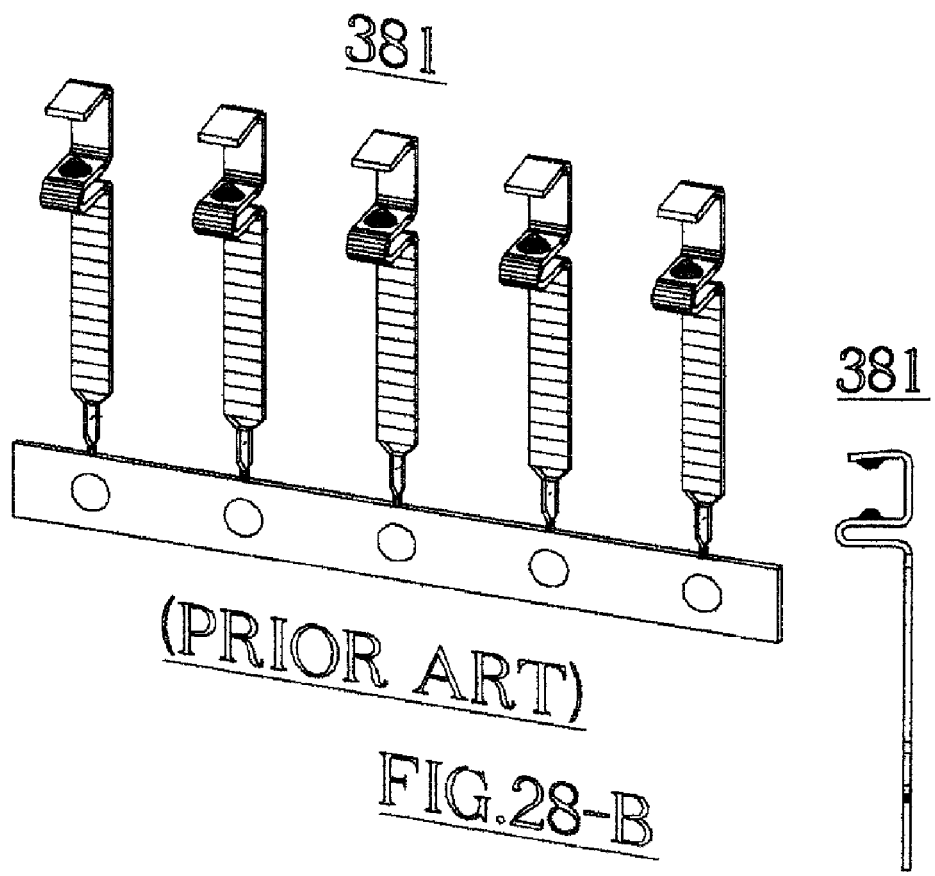
Figure 29:
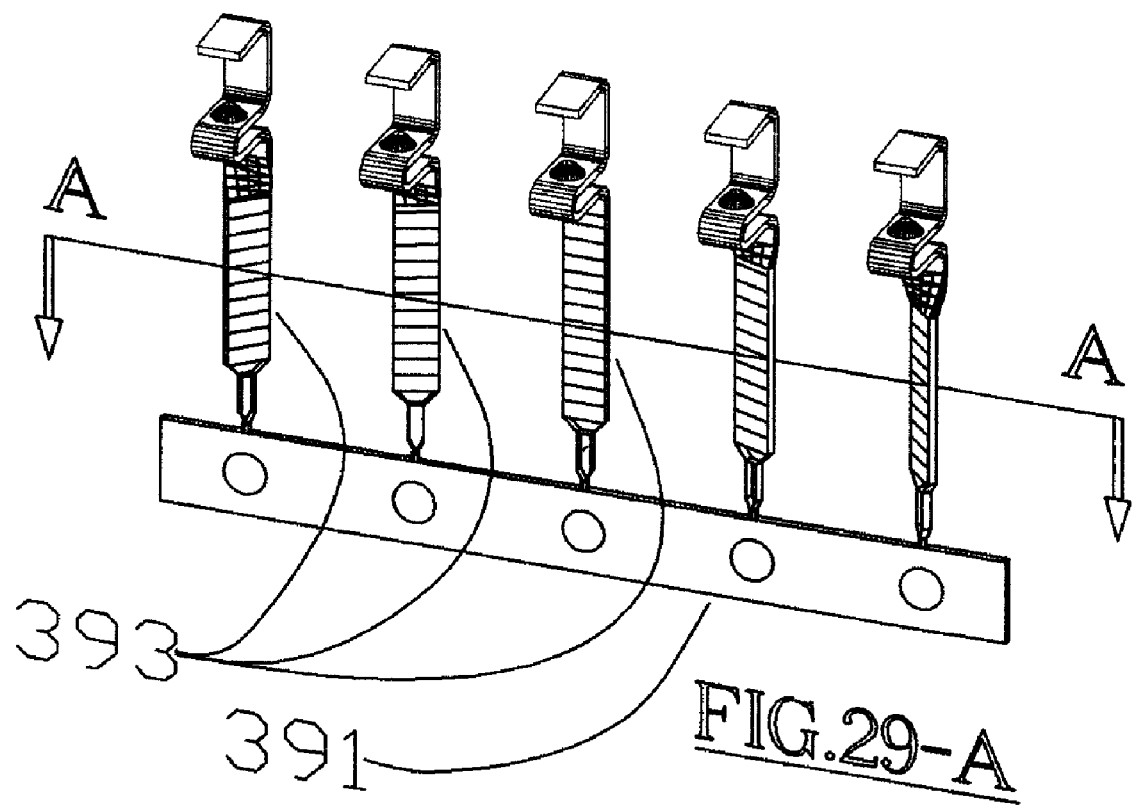
Figure 29:
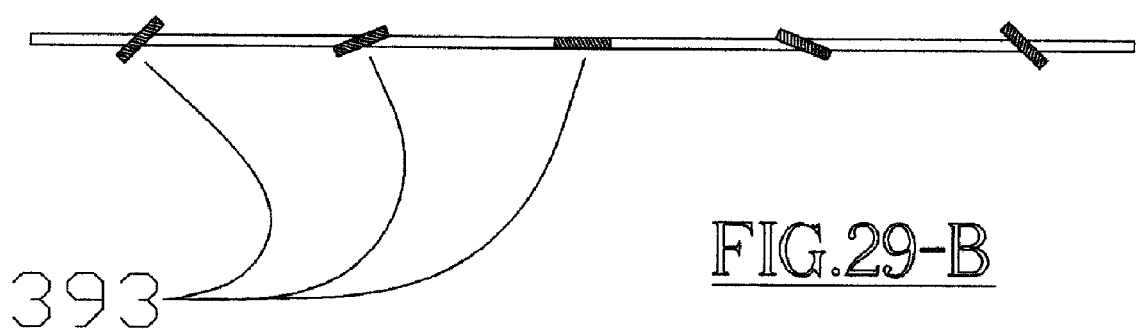

FIGS. 28 and 29 show how the NAS "Push-on" leads could be designed to ultimately conform to the present invention.

Figure 30:
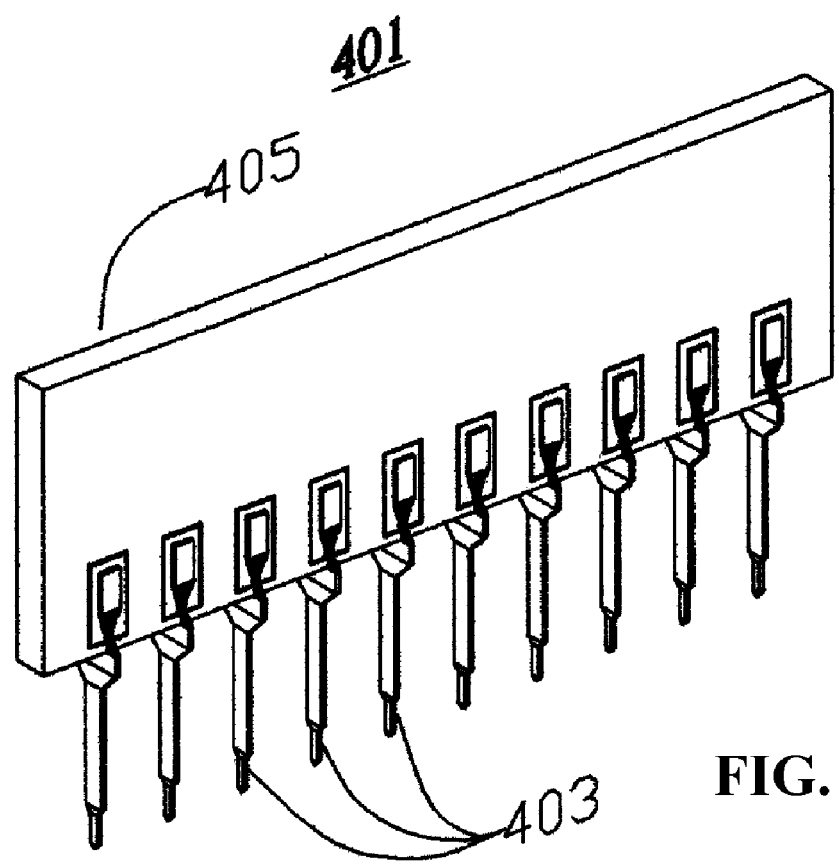

FIG. 30 shows a SIP, provided with leads that are oriented according to this present invention. These leads could be "push-on" leads, like the NAS leads, or provided originally with the package.

Figure 31:
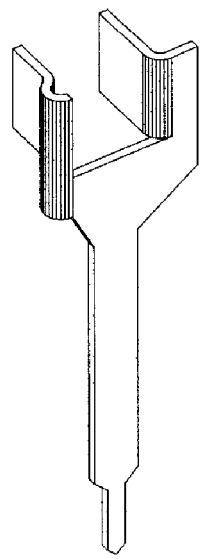
Figure 31:
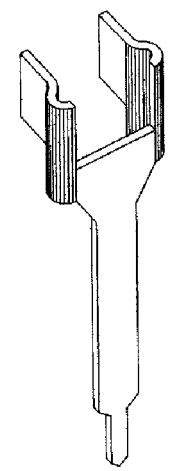
Figure 31:
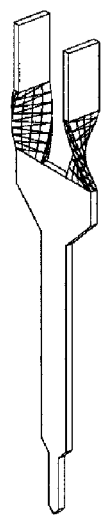

FIG. 31 shows different shapes of the heads of the push-on leads, for SIP packages.

FIGS. 32 through 40 show leadframes, which have their leads' blanks designed from the start, so as to be oriented properly. This makes it easy to end up with leads as per present invention. The leads in this case would not need to be "twisted". The simple "folding" process would result in having the leads automatically being oriented right after the folding step.

DETAILED DESCRIPTION OF THE INVENTION

I will use many of the figures in Ref3, together with the figures included here with this application, to describe the invention.

The figures in Ref3, page PP-D-1 and -42 show the general principle of the way to orient the leads. Any physical body that is heated or cooled expands or shrinks in a three-dimensional fashion. It behaves as if there is a point somewhere in its center that is the "origin" of the dimensional changes. I will refer to such a point as the "thermal center" of that body.

Electronic packages are no different.

When a package is heated or cooled, it expands and contracts in a similar fashion. All elements of the package move along some imaginary radii, emanating from the thermal center.

So, the legs or leads of a leaded electronic component get pushed or pulled in similar fashion, as well, i.e. along those imaginary radii. Let me explain that action and explain the effect of such action.

If a leaded package were mounted to a PCB with a different TCE, then the package would expand and contract at a different rate than the PCB. We call that the Effect of the TCE Mismatch. The dimensional differences would have to be absorbed by the leads connecting the package to the board. The leads would deflect, bend and/or flex to take up the dimensional differences.

Now, let us study for a moment how the leads behave.

FIG. 1 shows two leads 101 and 107 (Prior Art) at a corner of a leaded package. Usually the leads of leaded electronic devices are made out of flat sheet metal, with a relatively small thickness compared to the width of the lead. The lead 101 on the right hand side of the figure is being bent "across the flats" or "across the face" 103 and 105. This is my definition. It implies that the flat wide section 117 of the lead 101 is facing the bending direction 103 and 105. The lead 107 on the left-hand side of the figure is being bent "across the edge" 109 and 111. This definition implies that the bending direction is against the edge 119 of the lead.

From general experience and common sense, we know that such a lead would bend easier across the flat 103 and 105, and would behave much stiffer if we try to bend it across the edge 109 and 111. It can also be demonstrated analytically that this is true.

Now let us study the effect of such bending on the stresses at the base 113 and 115 of the lead 101 and 107.

First, let us study the bending across the flats. Let's say we need to bend the lead 101, so that we get a certain amount of deflection at its tip 123. Since the lead will flex (the technical term would be "deflect") easily, then for that amount of deflection, we will get a relatively small level of stress at the base 113 of the lead.

Now, let us compare that with the other case. We will try to bend the lead 107, so that we get the same amount of deflection at the tip 125 of the lead, as we did in the first case. Since the lead is much stiffer in bending across the edge, the base 115 of the lead will exert a much higher level of stress on the plastic body 121 of the package.

Such higher level of stress can be enough to crack or break the plastic.

Let me explain further.

If we try to use a crow bar to open the lid of a crate, we would be more successful if we use a bending motion in the same direction as with the lead 107 on the left-hand side of FIG. 1. The crow bar will be stiffer, i.e. stronger, and will not flex, but will help us open the crate. The force required to bend the crow bar will be high, but we will create a big opening in the crate. If, on the other hand, we use the crow bar in a way similar to the bending effect on the central lead 101, i.e. bending it across its flats, the crow bar handle may flex and may not open the crate.

The same action will apply to the package, as will be explained later.

The second bending component, the one bending the lead 107 across its edge 109 and 111, will more likely "open" or "crack" the plastic body 121 of the package, as the crow bar would open the crate.

This is a major contributor that causes the micro-cracks in the plastic body of plastic packages, and causes moisture to migrate to the insides of the package, ultimately causing the premature failure of the package.

Consequently, if we want to have the least resistance against such movement, for whatever reason, then the leads, if they have a rectangular cross-section, as they usually do, should face this thermal center 133, FIGS. 4 through 6. In other words, the wide face of the lead should face towards the thermal center. This is because it is easier to flex the lead across its wide surface, than if we try to bend it across its edge.

I would like to refer to this arrangement as "orienting" the leads to face the thermal center of the particular package that is being considered.

I will explain the above, in more details here below.

FIGS. 2 and 3 show a standard or conventional package 121 (Prior Art). It is shown to have five legs on each side to simplify the explanation. It is shown in an upside position. This is referred to as "dead roach". All the descriptions in this application here would apply to rectangular packages and to packages that have leads on only one or more sides, as well.

It can be seen that all the leads are orthogonal. I mean that they are all facing either one of the two main axes 125 and 127 of the package. If we call the axes as X-axis and Y-axis, then two of the four rows of leads are facing and are parallel to the X-axis, while the other two rows are facing the Y-axis.

In this particular package, we can safely say that the thermal center 133 of the package 121 is at the intersection of the two axes 125 and 127.

If the package is heated and expands, in the presence of TCE mismatch, then the leads would bend to accommodate the dimensional changes. However, not all the leads will bend the same way.

The lead 135, 137, 139 and 141 at the center of each side, which is the lead along any of the package axes 125 and 127, would bend across its flats, i.e. across its wide face.

The lead 143 and 145 at the corner, i.e. at the end of the package side, i.e. the one farthest from the axes 125 and 127 would be under a different set of conditions. The bending action will be directed along the radius 151 and 153, FIG. 5 starting at the thermal center 133 and reaching to the lead at the corner. Such a radius would be diagonal to the face of the lead. The result is that the lead would be forced to bend in two different directions. One component of the bending will still be across the face, i.e. across the flats, but the second component will be across the edge. This second bending component will be more stressful on the package, as explained earlier.

So, in order to minimize this detrimental effect, we should try to minimize the crow bar effect. We can do that by trying to bend the leads across their flats, and not across their edge.

We can do that by orienting the leads, as in FIGS. 4 through 6.

PREFERRED EMBODIMENTS

Proposed Way of Making Plastic Packages According to Invention

FIGS. 4 through 6 show one of the preferred embodiments.

In FIGS. 4 through 6, the leads of the package are oriented, such that each lead is facing the thermal center 133, regardless of where the lead is. In this case, each lead is giving the least resistance against the bending action.

Why is this important? It is to reduce the stresses on the plastic of the package body. The plastic is acting as the anchoring member to hold the lead in place. If the lead is soft, then when the lead bends, it will exert a low level of stresses on the plastic. But if the lead is stiff, and we still try to bend it by the same amount of deflection, then the stresses on the anchoring plastic will be higher, high enough that it could reach a level where the plastic would crack.

Of course, one other way to help along the same goal would be to make the lead thinner, thus softer. This could be done by using a thin material to start with, or by spanking or forming the lead to be thinner at that point and/or along its flexing length, so as to make it more flexible. That is an option that is proposed by the present invention, as well.

But if this option is not selected, then the rest of this specification will show what else can be done, i.e. the orientation of the leads.

FIG. 7 gives the nomenclature used in this specification.

FIGS. 8 through 11 show close-up views of the leads at the four corners of the package.

There is only ONE EXTRA STEP, to achieve the desired goal.

FIGS. 12 through 19 show one way to achieve this. These figures correlate with the figures in pages PP-D-56 through 70.

Figure 12:
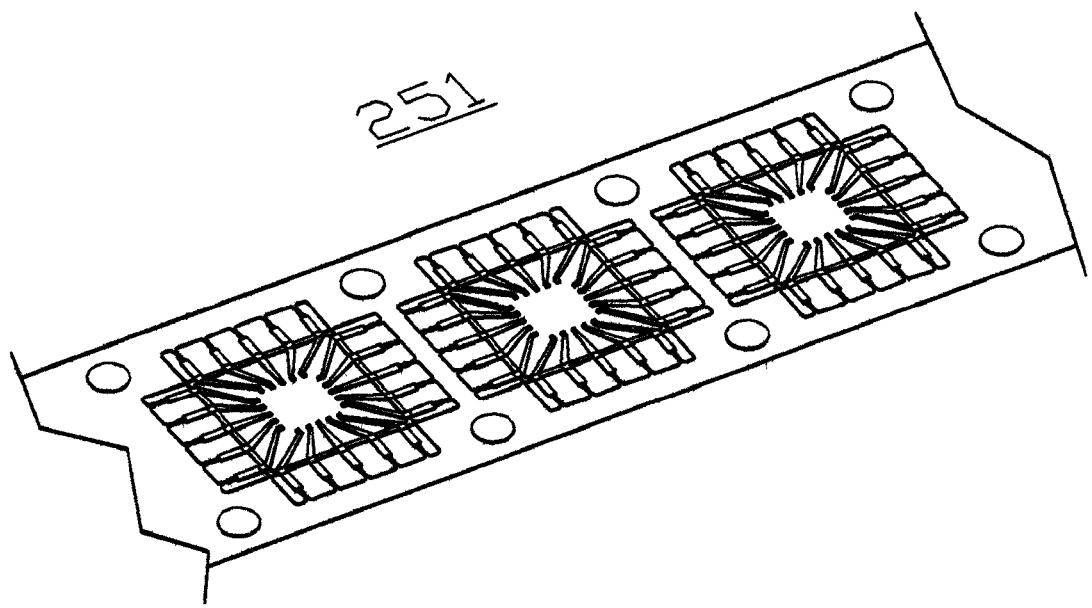

FIG. 12 shows a standard conventional leadframe 251 (Prior Art). It usually comes in a continuous strip. The figure shows only three patterns on the strip, which would make three packages or devices. For simplicity and clarity, the following figures will show only the central device, in a close-up enlarged view.

Figure 13:
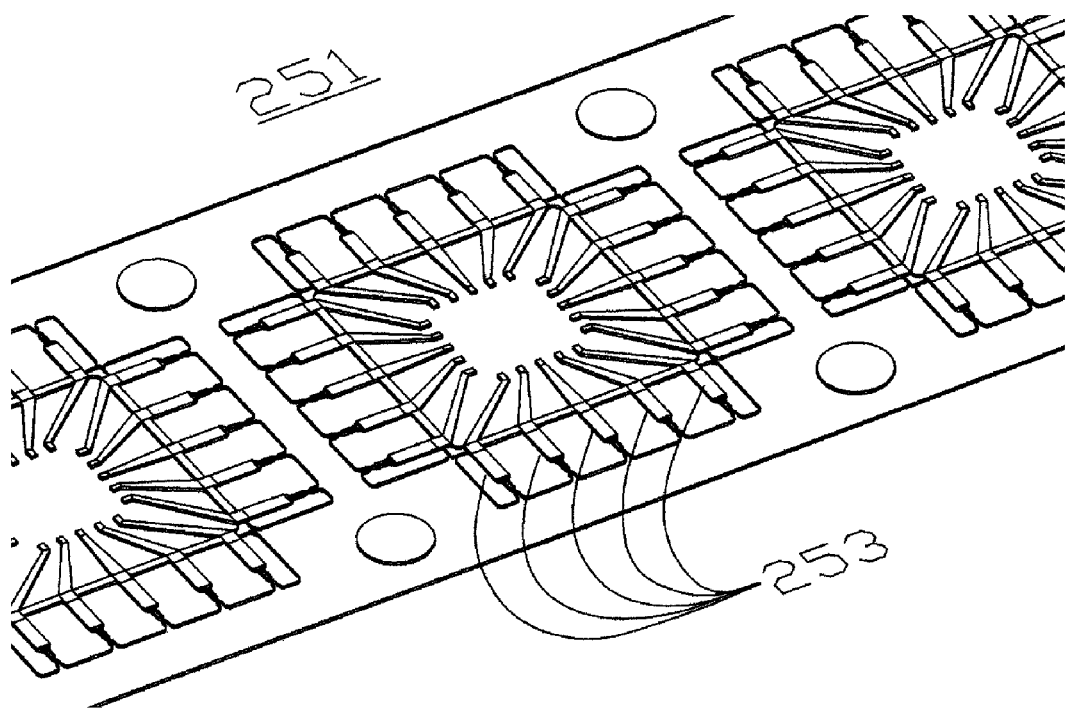

FIG. 13 shows a close-up view of the central device on the standard leadframe 251. Please notice that the external portions 253 (Prior Art) of the leads are still flat.

Figure 14:
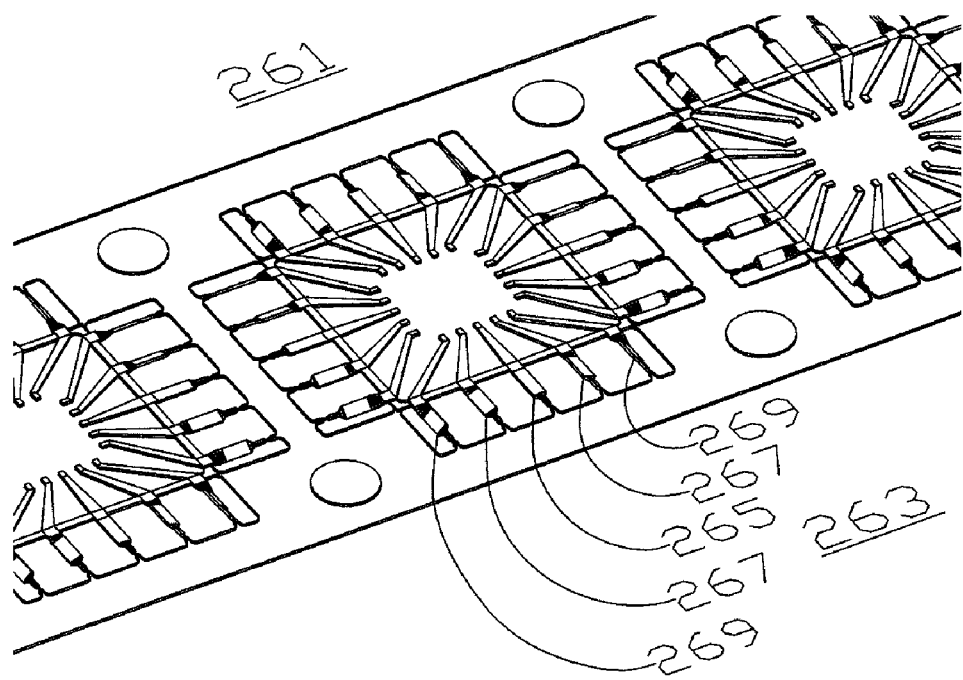

The drawing in FIG. 14, which correlates with Ref3, pages PP-D-56 and -63, shows a leadframe 261 similar to the one shown in Ref3, pages PP-D-48, with only one difference. The external portions 263 of the leads here are shown slightly twisted out of flat. These are the portions of the leadframe that will become the leads or legs of the leaded package.

The leads 265 that are located exactly along the two main axes of the package are not twisted at all. They stay flat.

The leads 267 next to these are twisted a little bit.

The leads further out away form the last ones, are twisted a little bit more.

The leads 269 that are located at the outermost ends of each row are twisted more than all the previous ones.

The amount (angle) of twist of each lead is calculated/determined base on the geometry of the package. It is figured such that, after the last manufacturing step (which will be described momentarily), each lead will respectively be facing the "thermal" 133 center for the respective package.

Figure 15:
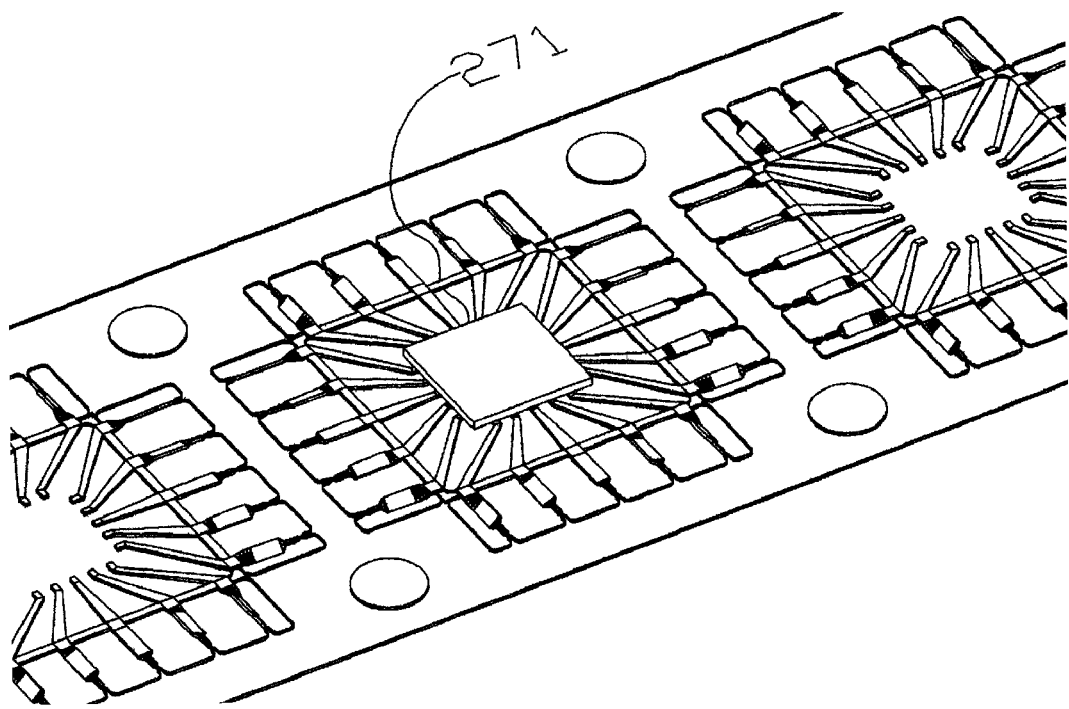

The drawing in FIG. 15, which correlates with in Ref3, pages PP-D-57 and -64, shows the die 271 (Prior Art) attached to the leadframe. Here I am showing the steps for the center package only. But the same procedure applies to all packages of course. Again for this present invention, it is irrelevant what process is used to do this die attach step.

Figure 16:
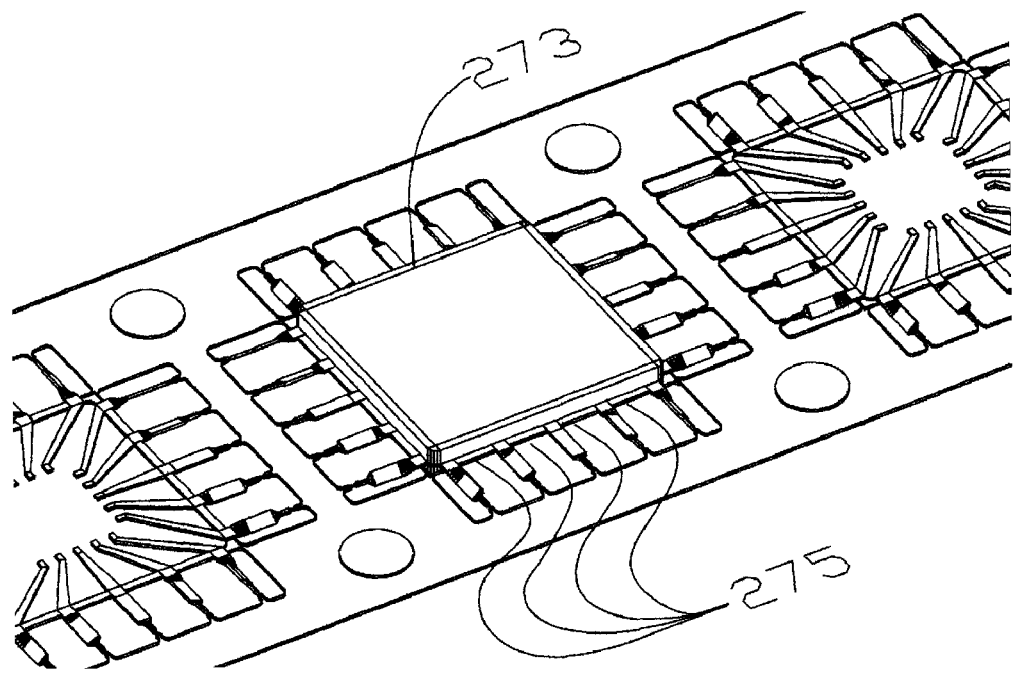

The drawing in FIG. 16, which correlates with in Ref3, pages PP-D-58 and -65 shows the package body 273 (Prior Art), right after the encapsulation with plastic.

Figure 17:
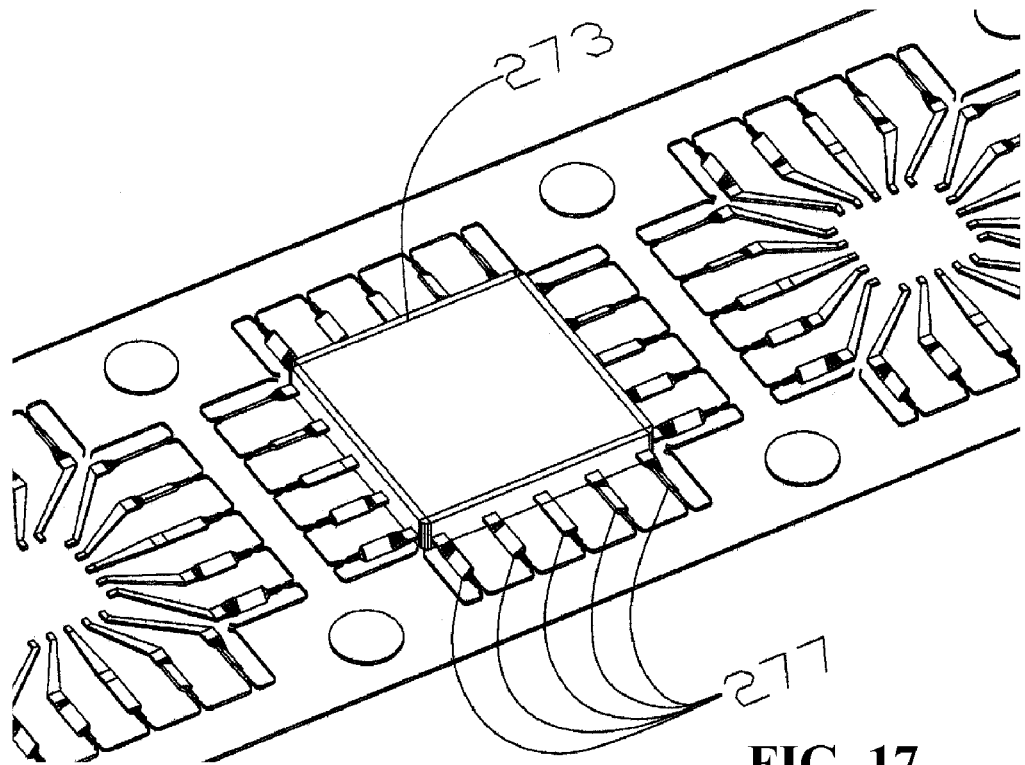

The drawing in FIG. 17, which correlates with in Ref3, pages PP-D-59 and -66 shows the package after trimming the "Molding dams" 275, FIG. 16 (Prior Art).

Figure 18:
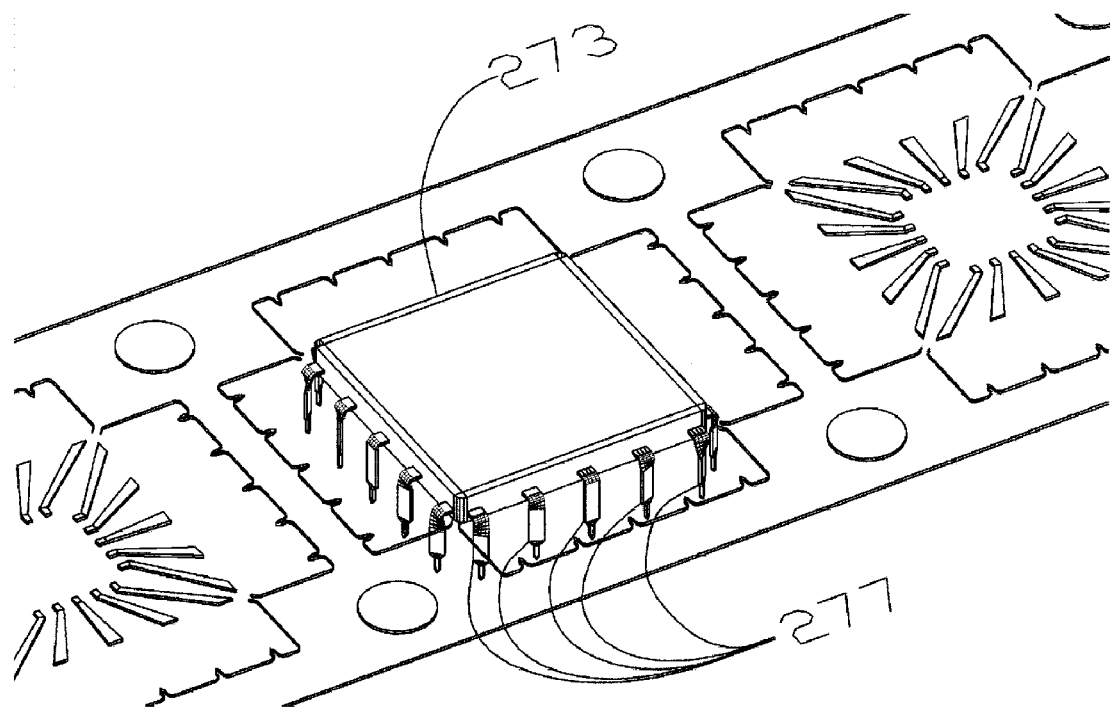

The drawing in FIG. 18, which correlates with in Ref3, pages PP-D-61 and -67 shows the leads 277 folded down and the package 273 ready to be separated from the leadframe.

Figure 19:
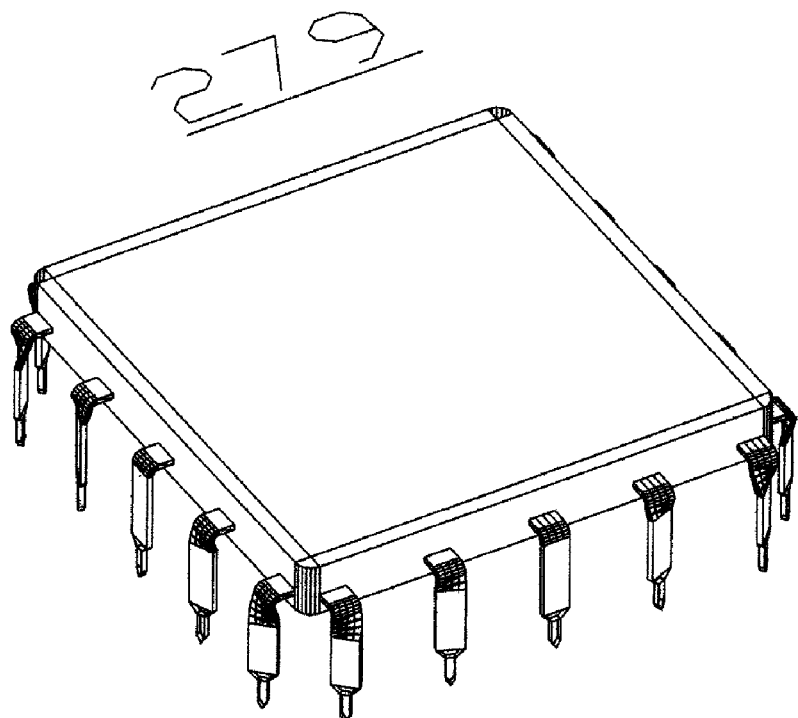

The drawing in FIG. 19, which correlates with in Ref3, pages PP-D-62 and -68 and -69, shows the finished package 279, with the leads oriented, as per this invention, after it is separated from the leadframe.

The drawings in FIG. 6 correlates with the one in Ref3, page PP-D-70. FIG. 6 shows a top view of the package 147, while Ref3, page PP-D-70 shows a bottom view of the package. It can be seen that the tips and faces of the leads are oriented in such a way that each one is oriented towards the thermal center of the package.

If we compare the manufacturing method described in FIGS. 12 through 19 with the old standard conventional method described in Figs. Ref3, PP-D-48 through -55, it will become obvious that there is a difference of only one step. It is the step of twisting the external portion 263 of the leads, shown in FIG. 14.

This twisting step can be done at either one of two different times.

One time is to do the twist when the leadframe is being manufactured on its own. When the leadframe is being stamped out of flat sheet metal strip, the external portions of the leads can be formed as well to become twisted as required. The leadframe strip will then be reeled up on take-up spools for the subsequent operations. It would be advisable, in this case, to put a layer of protective material between the layers of metal leadframe, so as to protect the twisted leads from getting deformed or damaged.

The other opportunity would be during the molding/encapsulation process. The leadframe gets unwound and threaded into the molding machine or the molding boot (form). Before the die attach step, the external portions 263 of the leads get twisted as required and then the subsequent operations would take place as normal.

Other Type of Leaded Packages

FIGS. 20 and 21 show two leaded packages. The one in FIG. 20 has gull-wing leads 281, while the one in FIG. 21 has Jay-leads 291. In both cases, the leads are oriented as per present invention, so as to face the thermal center 289, 299 of the package, so as to provide maximum flexibility and minimum resistance to deflection.

Basically, the concept applies to any leaded package, that have leads with varying stiffness depending on the orientation of the leads, and to packages that would undergo expansion and contraction problems due to TCE mismatch with their environment.

Solder Pads

If the package, with oriented leads as per this invention, gets mounted on a PCB, with "through holes", i.e. the package leads get inserted in holes in the PCB, and then get soldered, then there is really no problem. Whether the "solder tails" of the package leads are "oriented" or not, in the majority of cases, this should make hardly any difference. The solder will simply fill the space between the hole and the lead tail, regardless of how the lead is oriented. The tools of the insertion machine may need to be adjusted to grab the leads properly. But this is not the object of this invention.

However, if the package gets "Surface Mounted" onto the Board, then we need to address the question of the "shape" of the solder pads.

FIGS. 22 through 24, which correlate with the sketches in Ref3, page PP-D-104 and 105, show this situation. Please refer also to FIGS. 20 and 21.

The sketches in FIG. 22-A and FIG. 25-B, shows the solder tails 301 (Prior Art) of a "conventional" package, while the sketch in FIG. 22-C those of a package with "oriented" leads 305. The lines 307 in the sketch in FIG. 22-C emanating from the Thermal Center 309 are just to show the direction of the lead tails.

The sketch in FIG. 23-A shows the ideal (most logical) shape of the solder pads 311 for the oriented leads of the package shown in the sketch in FIG. 22-C.

The sketch in FIG. 23-B shows a "combination" situation, where the solder pads 313 are shaped such that they could accept either the "conventional" or the "oriented" leads.

FIG. 24 is an enlarged view of the sketch in FIG. 23-B. Some variations of pads can be visualized, as well. For example, the pad can be a large circle encompassing all of the above.

Oriented Sockets & Connectors

FIG. 25, which correlates with the sketches in Ref3, page PP-D-99, shows a conventional socket 341 (Prior Art) at the top view FIG. 25-A, while the bottom view FIG. 25-B shows an oriented socket 351.

The contact springs 353 would be oriented, to match the oriented leads 355 of packages as per this invention.

FIG. 26, which correlates with the sketches in Ref3, page PP-D-100 shows a 3-D detail view of one way to form the contact springs 361 so that they would be oriented to match the oriented leads 363, as per this invention.

Ceramic Packages or Packages with Brazed-on Leads

All the previous talk was related to packages with bent/folded leads. That applies mostly to plastic packages. However, CERDIP packages could benefit from the same treatment. They have their leadframe embedded in the glass fritt that is between the Ceramic layers and holding everything together.

In addition, other ceramic packages can benefit from the same treatment as well.

Most of the ceramic packages have their leads brazed-on to their sides.

I propose to "orient" the leads of these ceramic packages as well.

Say we get the leads as in the drawings in Ref3, pages PP-D-22 through -25.

We start with the conventional leads, as in Ref3, pages PP-D-22. We twist the leads, while they are still on the carrier strip, to end up with them as in the drawings in Ref3, pages PP-D-23 and D-24.

We will get something that looks like the same thing in the drawings in Ref3, pages PP-D-75 through -77.

The leads get brazed-on to the side of the package as in the drawing in FIG. 27, which correlates roughly with Ref3, page PP-D-25.

Here I am showing the body 371 of the ceramic package as if it is transparent, for clarity's purpose. I am also showing the leads 373 still on the carrier strip 375 on one side of the package only. After the brazing operation is completed, the carrier strips 375 would be cut-off, to end up with the package, with oriented leads 377, as on the three other side of the package in FIG. 27 and as in the drawings in Ref3, pages PP-D-78 through -81.

Push-on Leads

NAS INTERPLEX INDUSTRIES COMPANY, at 120-12 28$^{th}$ Avenue, Flushing, N.Y. 11354, Phone 718-961-6757; Fax 718-539-9115; Website: www.nasinterplex.com, has a product line, as shown in the photos and drawings in Ref3, pages PP-D-88 through -92. I will refer to this company as "NAS".

Basically, NAS provides leads that can be pushed on and clamped on "leadless packages", to render them "leaded". See the photos in Ref3, pages PP-D-89. These can be provided, optionally, on one side of the package only, or on two sides, or on all four sides, depending on the kind of the package and the needs.

I will refer to such leads as "push-on leads".

Some of the advantages of such push-on leads are listed on the website of NAS. The text in Ref3, pages PP-D-90 gives an example of these advantages.

Other companies may have similar push-on leads.

The concepts here apply to all push-on leads.

I propose to "ORIENT" such push-on leads, similar to the way I explained above.

Especially applicable is the way shown in FIG. 27 and the sketches and drawings in Ref3, pages PP-D-2, -3, -9 through -16, -22 through -24, -25, -43 and -71 through -81.

One easy way to do that is to take a strip of proper length, from the lead reel, as seen in the figures in Ref3, pages PP-D-91, and form it appropriately.

The leads 381 could look like those shown in FIG. 28 and in the figures of Ref3, pages PP-D-92 or -93 or -94.

The cross-section A-A in the figures of Ref3, pages PP-D-94 shows that the leads are originally "In-Line" with each other.

A strip 391 of appropriate length for any specific package would be formed as illustrated in FIG. 29, which correlate to the figures of Ref3, page PP-D-95. The leads 393 will be twisted as shown, to certain angles, such that when these leads are attached to that specific package, they will be facing the thermal center of that package.

Different packages, with different number of leads and different sizes, would have their leads twisted at different angles, appropriately, again such that after being attached to their respective packages, the leads would be facing the respective thermal centers of the respective packages.

SIP—Single-in-Line Packages

Even SIPs could benefit from the invention.

FIG. 30, which correlates with the drawings in Ref3, pages PP-D-96 and -97, shows a SIP 401, with the leads 403 oriented the proper way as per this present invention. It shows a SIP 401, with push-on leads 403 like the NAS leads, but again oriented the proper way as per this present invention. These leads 403 could be first oriented and then clamped on the leadless SIP 405 to make it look like a leaded SIP.

The two top photos in Ref3, page PP-D-32 and all the three photos in Ref3, page PP-D-36 show different SIPs, which could also benefit from having their leads oriented as per this present invention.

The sketches in FIG. 31, which correlate with Ref3, page PP-D-98, show other suggested tip endings 411, 413, 415 for NAS push-on leads, especially for SIP packages and the like.

"Oriented Leadframe"

In all the above, we have assumed that the leadframe is made to have the leads come out of the body of the package, in an ORTHOGONAL direction. For this reason, we had to "twist" the leads, so that they would face the thermal center after they get folded down.

This has two disadvantages. First, it requires an additional step; the step of twisting that portion of the lead. Second, it makes it that we loose some height. The twisted portion of the lead would be ABOVE the generally more flexible portion of the lead.

I propose another embodiment of this invention, whereby there will be no need to "twist" the lead. A simple "fold-down" would accomplish the goal.

FIGS. 32 through 40, which correlate to the drawings in Ref3, pages PP-D-82 through -87, show the idea.

Figure 32:
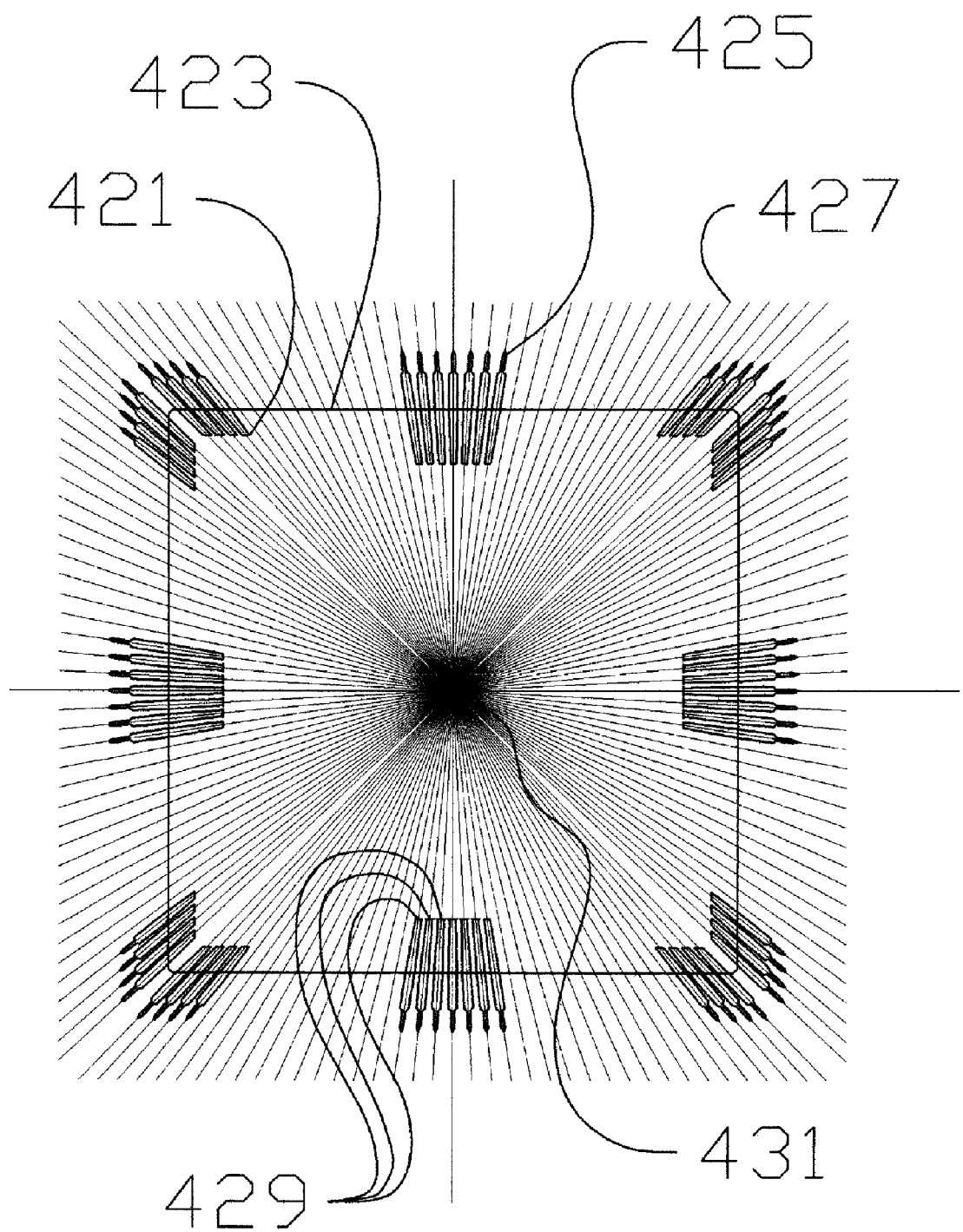

FIG. 32 shows a leadframe 421 with a package 423, where the leads 425 protrude from its body in a "RADIAL" direction 427. The body 423 of the package is represented by its square outline only. A portion 429 of the leads 425 that is embedded inside the body of the package is shown in solid lines, as if the plastic body is transparent, just for clarification.

The drawing shows the rays 427, emanating from the "thermal center" 431 and giving the direction for the leads protruding out from the body.

Figure 33:
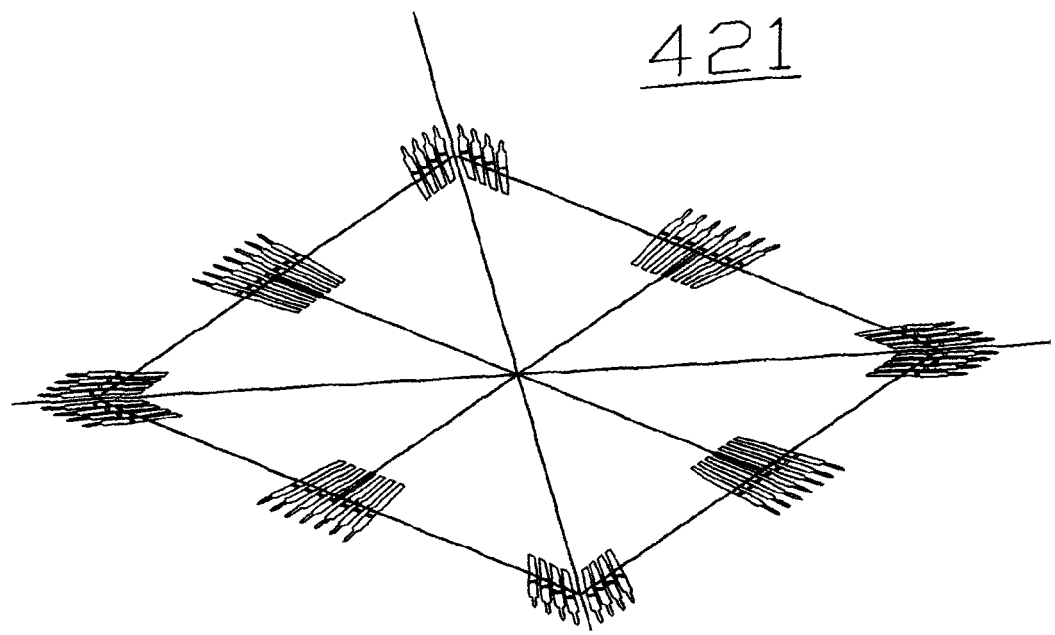
Figure 34:
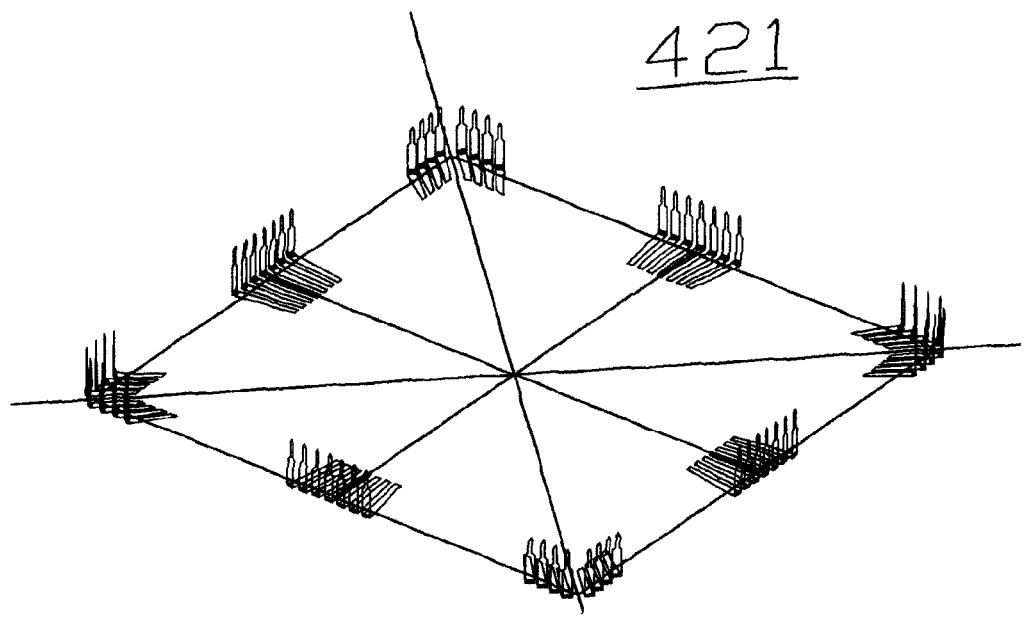

FIGS. 33 and 34 show a 3-D view of the leadframe 421. In FIG. 33, the leads have not been folded yet, while in FIG. 34, they have been folded already.

Figures 35, 36:
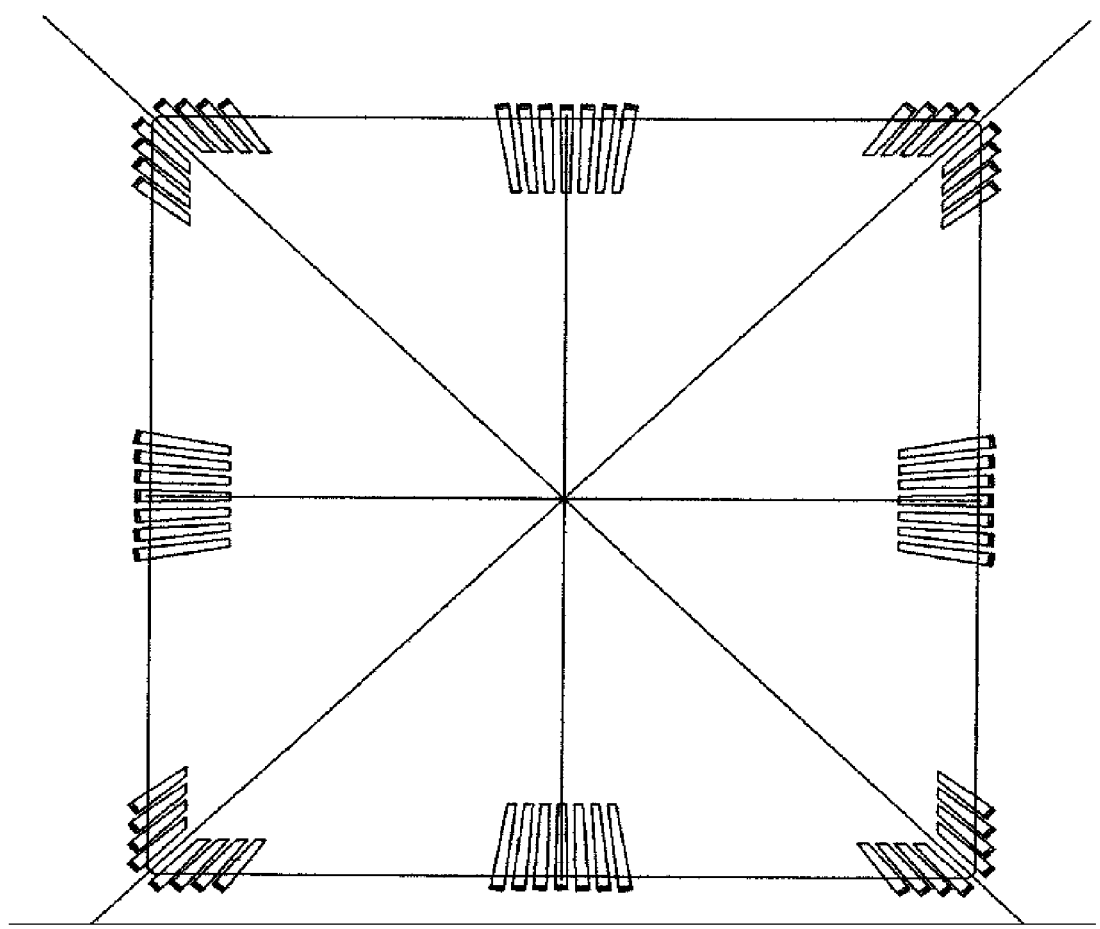

FIGS. 35 and 36 show the same thing, but looking at a top view or bottom view.

Figure 37:
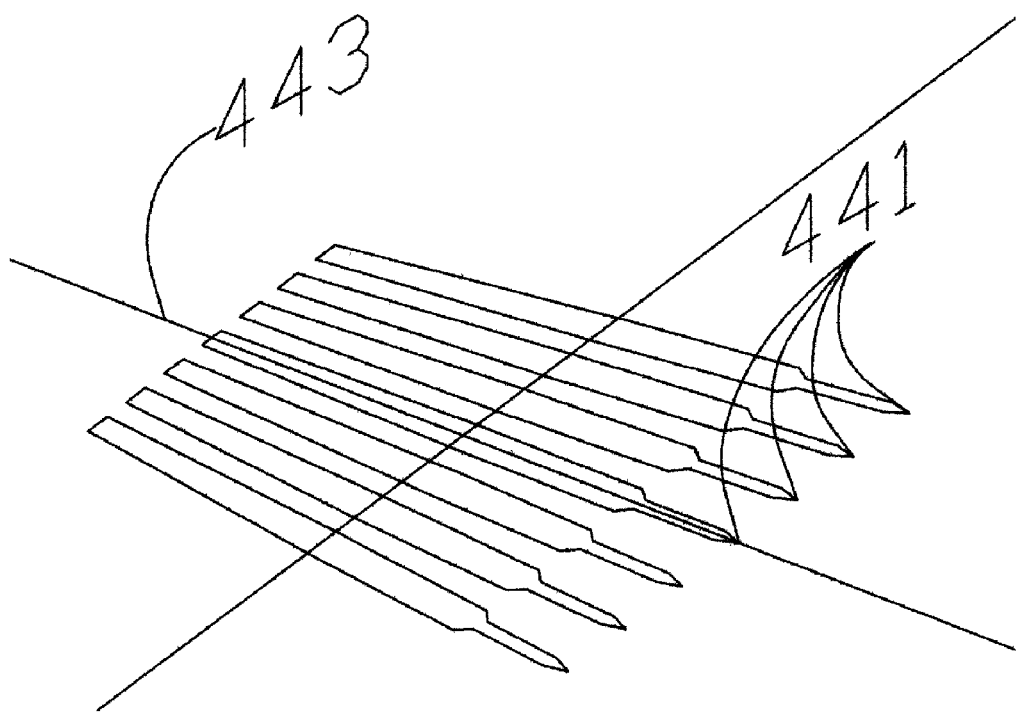
Figure 38:
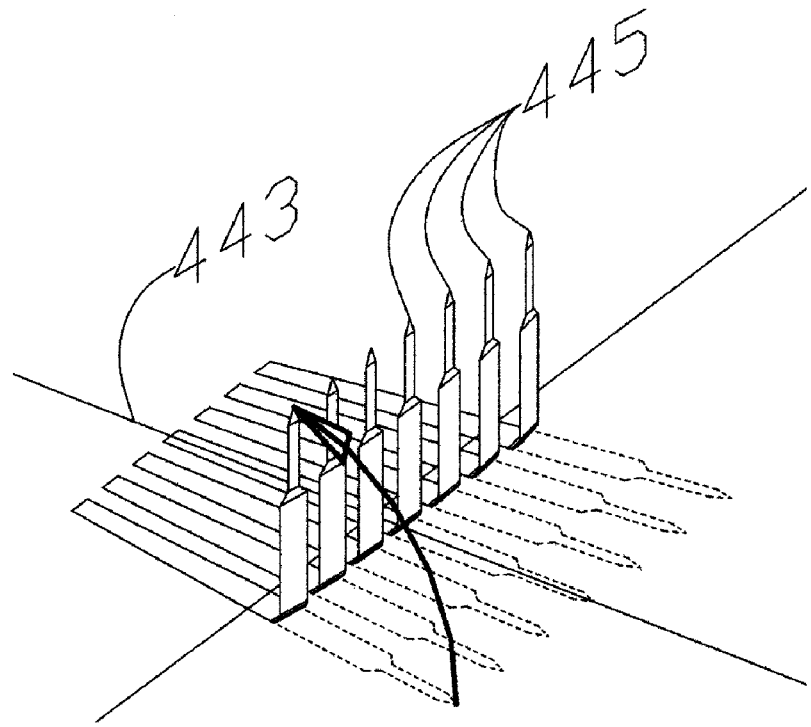

FIGS. 37 and 38 show the same thing, but they show only the central leads 441, i.e. the leads that are near the axes 443 of the package.

Figure 39:
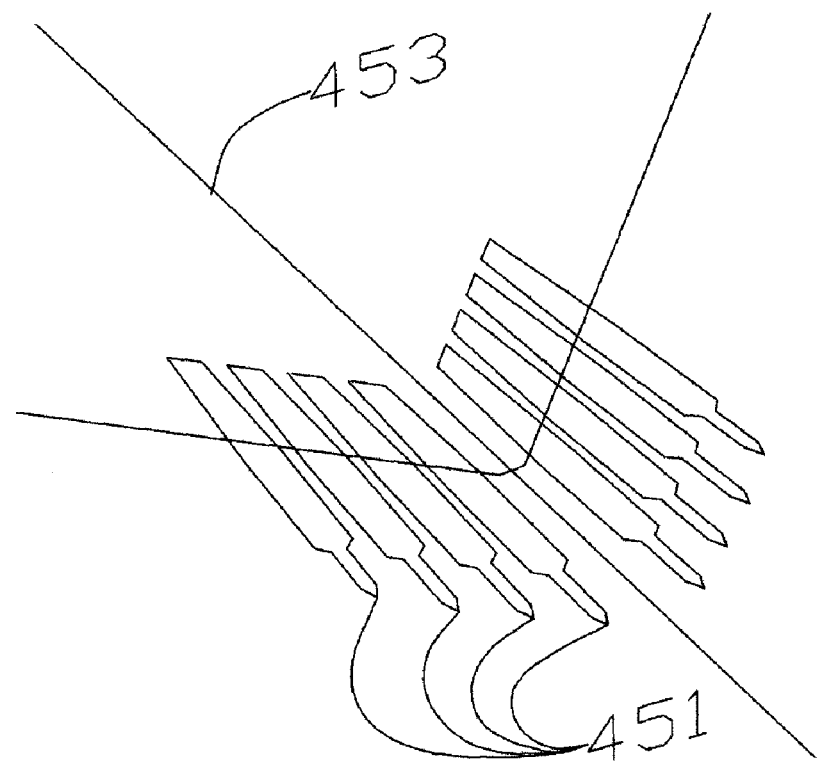
Figure 40:
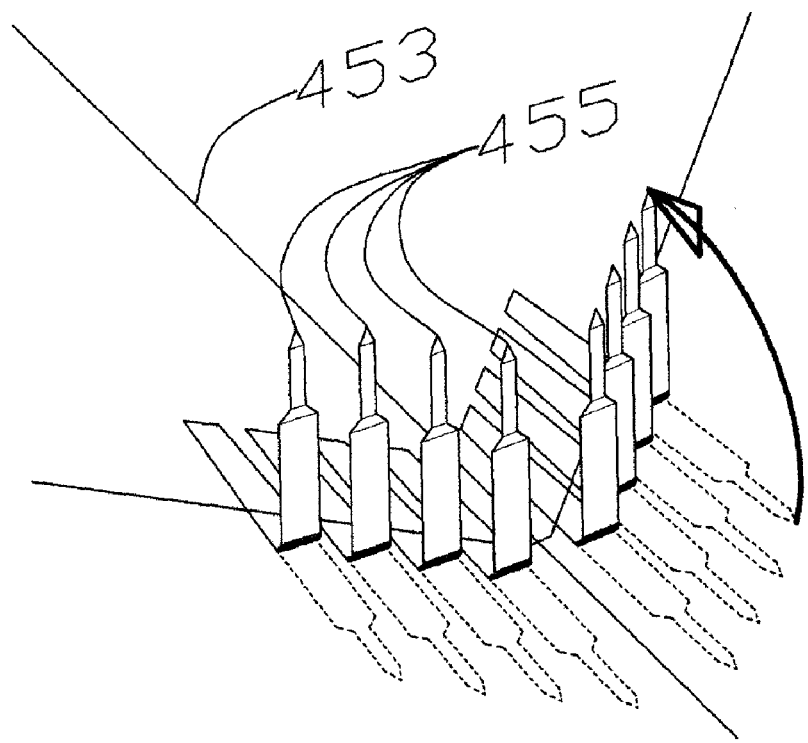
Figure 41:
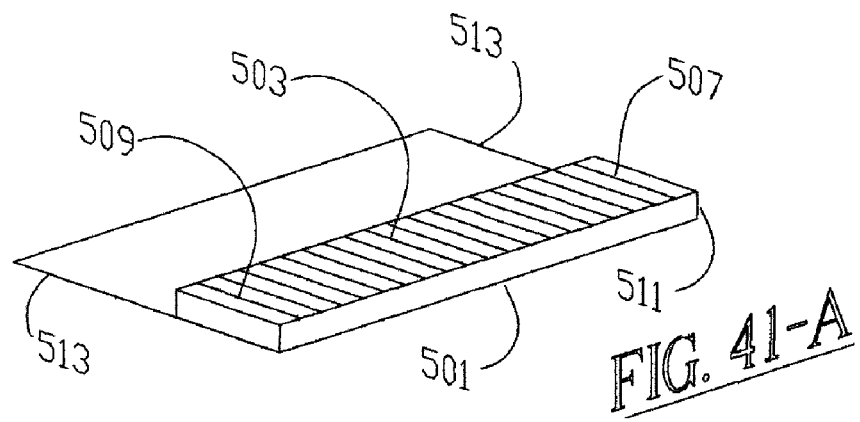
Figure 41:
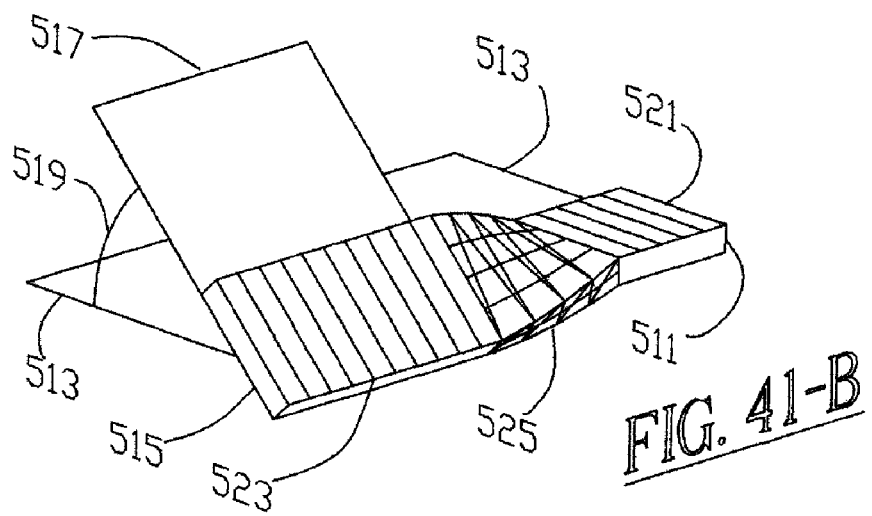
Figure 41:
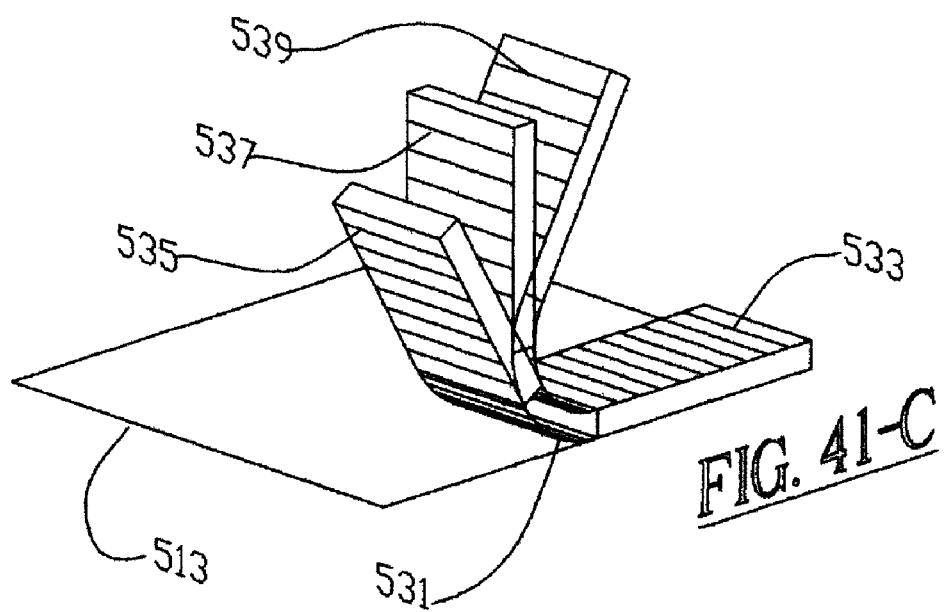
Figure 42:
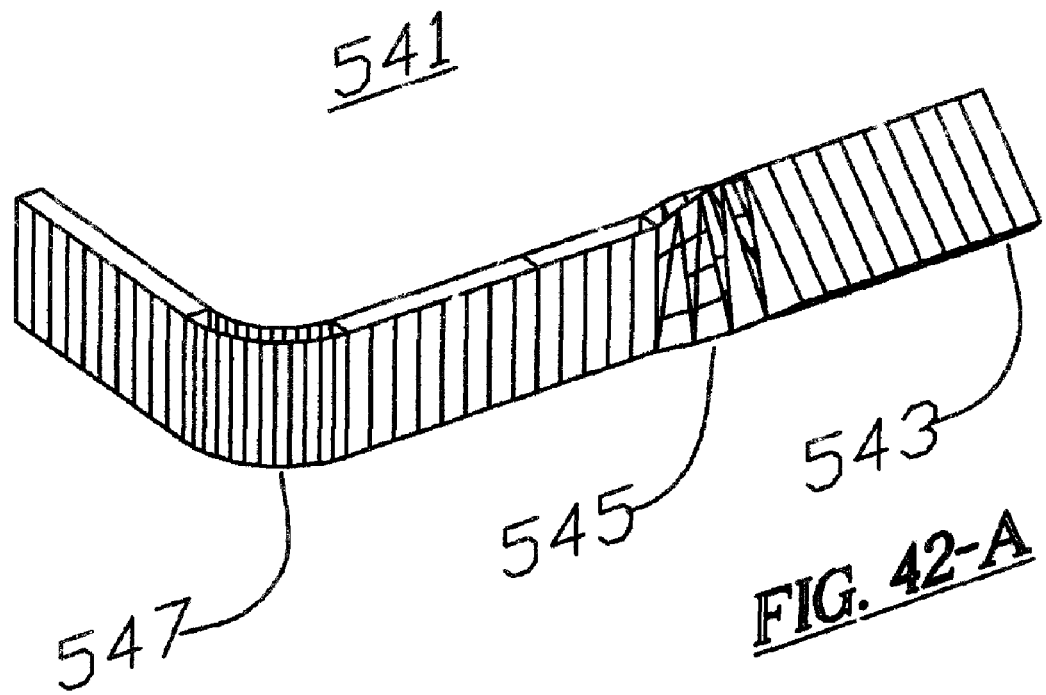
Figure 42:
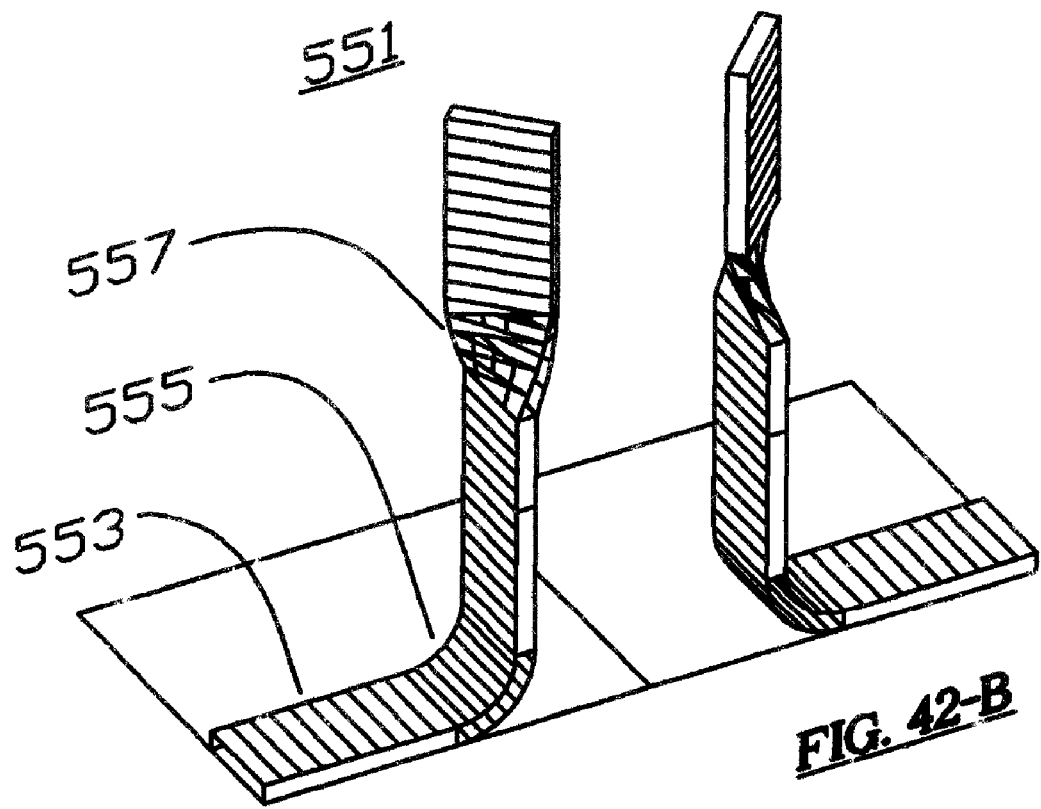

FIGS. 39 and 40 show the same thing, but they show only the corner leads 451.

The drawings in Ref3, pages PP-D-84 through 87 are close-up views of the same.

In this case, the fold-down steps, shown in FIG. 18 and in the drawings in Ref3, pages PP-D-53, 60, 61 or 67 would automatically produce leads facing the "thermal center", without the need for any "twist" in the lead.

The result is that the flexible portion of the lead will be longer than the twisted leads, for the same package height.

This is more desirable and would be the preferred way to go. However, this means more changes in the way the portions of the leadframe that are embedded inside the body of the package would be designed and routed.

New Package Formats

Considering all the above, and looking again at the figures in Ref3, PP-D-1 and -42, we can conclude that the ideal shape of packages could be a circular body, with all the leads located on a circle, and oriented to be facing towards the thermal center of the package. Just like the leads shown in -42. This could solve a few other problems too, like the uniformity of the distance from the chip to the leads.

There are at least two problems with the round format. First, it seems to be not quite space-efficient. There would be a lot of wasted spaces between the round components. The interstices. Unless, those spaces could be used to locate smaller components, such as capacitors and/or other such components. Second, the whole industry is geared to using components and boards that are "orthogonal" in a way, I mean either square or rectangular. Such an orthogonal format seems to utilize both the materials as well as the space more efficiently.

So, another format that could be as efficient as the orthogonal format, but with the benefits of fighting the undesirable effect of TCE mismatch would be the "hexagonal" format, like the honeybee beehives, etc.

In a package that has a hexagonal body, the leads could be oriented such that they will be parallel to the sides. In other words, the leads would be grouped in 6 groups; each group of springs would be facing at 60/120 degrees with respect to the others. I would call this format as a "true hexagonal lead orientation". The small angular deviation between leads on the 60/120 orientation and leads on the "true radial orientation" may be in the infinitesimal increment range, that it could be tolerated. Such an orientation would also have another benefit. The "molding dams" would be easier to trim and the trimming tools would be easier to make and to handle.

Yet another possible package would be the "round hexagonal". The body would be hexagonal, but the leads would be oriented on a true circular pattern, each facing the true thermal center position.

Another efficient compromise would be the "octagonal" format. This is almost orthogonal, but with a reasonable compromise as to the orientation of the leads. Here too, we can have the true octagonal and the round octagonal.

There is one more new group of package format that could also be considered. I would refer to that as the "saw tooth" format. In all the packages discussed so far, the sides of the packages are straight. If we look at the bottom figure in FIG. 25 and at the FIGS. 39 and 40, we notice that the oriented leads are coming out of the body of the package at an angle. If we consider the "molding dams" and if we try to visualize the tool that will be needed to trim these dams, then we would realize that there may be some difficulty in fitting the trimming tools in the available spaces and to make the tool conform to the angles between the body and the leads. But if we allow ourselves to change the traditional shape of the package, we can solve the problem easily. What I propose is to make the edge of the package body to be somewhat normal to the average angle between any adjacent pair of leads. The side of the body would then look almost like the teeth of a saw, albeit the teeth will not be repeating exactly all the way. The angles of the teeth will vary gradually from almost zero near the axes of the body, to some angles of about 45 or more near the corners, depending on the length and width of the package. But we can get used to these new shapes of packages, especially if we consider their functionality.

I would advocate building packages with any and all such shapes and formats, as those described here.

Twisting the Leads

Any technician skilled in the art should be able to "twist" the leads as proposed in this specification and drawings and sketches.

The photo in Ref3, page PP-D-103 shows a "Multi-Contact" connector, where the Plug is made of stamped and formed sheet metal, with a number of "twisted" fingers.

The only reason I am showing this picture is to prove that twisting a flat sheet of metal to some desirable shape is not difficult to do. It has been done before. And it can be done now, for this application.

This proposed application in itself is new and novel, and the proposed objective in itself is also new and novel, but the manufacturing steps needed to arrive to the end goal are not novel.

One Additional Benefit with Shock and Vibrations.

If we look at a standard DIP package, we notice that the leads are in two rows of leads, where the leads are all oriented orthogonally in the same direction. If the package is subjected to shock or vibrations that are concentrated in a certain direction, then the package will withstand the resulting stresses, depending on the relation between the direction of the shock and vibration and the direction of the leads. This is because the stiffness of the leads is high if we stress the device across the edges of the lead, and the stiffness is low across the face of the leads. We have explained that way early at the beginning of the application. So, if the direction of the shock and vibration is in a generally favorable direction with respect to the direction of the leads, then the package will withstand the stresses well. On the other hand, if the stresses are in an unfavorable direction, then the package may fail.

However, if the leads were oriented as per the present invention, where different leads would have different angles with say the axes, then the stiffness of the leads would be more evenly distributed, and the package may fare better regardless of which direction the shock and vibrations are coming from.

This is roughly what I am trying to show by the sketch in Ref3, page PP-D-106.

Reference, Method of Testing & Potential Market Value of the Invention.

The Advanced Packaging Magazine article in Ref3, pages PP-AD-34 through 36, which was mentioned at the beginning of this group description, has a special value, in addition to what has been mentioned earlier.

Besides the fact that it refers to a sensor that can measure/determine when moisture has penetrated through the plastic package and has reached a condition to make the active circuit defective, the article has several values to my product here.

It re-emphasizes the problem with Plastic Packages, when compared with Ceramic Packages.

It shows that there is a sensor that can be used to measure/detect when a Plastic Package becomes defective.

It gives a good Model for testing Plastic Packages.

It tells us that NASA has an interest in this subject, since they had sponsored this test with an SBIR.

It gives names of People and Companies, who are so interested in this subject, that they went ahead and conducted such a test.

In short, it shows that the concepts presented in this present invention could have a reasonably good market potential.

Group Two

Interconnections for "Leadless" Components

Group Specific Background Information:

As mentioned above in the section on "General Background", premature failure can occur if leadless components are soldered directly to boards or substrates. The problem results mostly from exposing electronic assemblies to varying temperatures, such as thermal cycling or power cycling, or simply from being exposed to harsh environment, including hot and cold temperature environment. This is especially true, when the component is relatively large, when the material of the component is different than that of the substrate with different TCE, i.e. with TCE Mismatch, and when the temperature fluctuates considerably and frequently during the life of the assembly.

The inventor had addressed this problem, starting back in 1982, and has created solutions to the problem that were good at their time. See the three U.S. patents listed in the next page, and see also the three papers, Reference A-4 through A-6, listed under "Additional Literature References" at the beginning of this application.

The additional problem nowadays is the fact that many of the components are being miniaturized. The center distances between contact pads are getting smaller and. For example, BGAs have center distances down to 0.020" (approx. 0.5 mm). When we consider Chip Scale Packaging, the center distances can be even smaller.

The present invention addresses this problem and offers solutions as will be described below.

PRIOR ART

There is a lot of prior art in this field. Several designs have been proposed in the past to counteract the unfavorable effect of the above mentioned conditions. The ones that come closest to the present invention are listed below. However, each of these has attempted to solve one facet or another, but have not covered all the aspects solved by the present invention.

U.S. Pat. Nos. 4,664,309, "CHIP MOUNTING DEVICE"; 4,705,205, "CHIP CARRIER MOUNTING DEVICE" and 4,712,721, "SOLDER DELIVERY SYSTEMS", all three by Gabe Cherian, et al, the same inventor of this present invention, together with other co-inventors. It was referred in the industry to the product line covered by these patents as "CCMD", Chip Carrier Mounting Device. It was later called "Solder Columns" or "Solder Quick". Solder Columns were originally designed and built to work with 0.050" (approx. 1.25 mm) center distances. The Cherian Solder Columns, however, cannot readily be simply scaled down to the new center distances required by present components. The old inventions can no longer keep up with such miniaturization FormFactor, Inc. Livermore, Calif. has a large number of patents covering various aspects of creating interconnections between electronic components. Some of them come close to the solutions proposed by this invention, but none of them, in my opinion, has covered all the features of this present invention. I will not list all the FormFactor inventions here. It will take too many pages. I will just list a few.

U.S. Pat. No. 5,476,211, Khandros, "METHOD OF MANUFACTURING ELECTRICAL CONTACTS, USING A SACRIFICIAL MEMBER";

U.S. Pat. No. 5,829,128, Eldridge et al, "METHOD OF MOUNTING RESILIENT CONTACT STRUCTURES TO SEMICONDUCTOR DEVICES";

U.S. Pat. No. 5,917,707, Khandros et al, "FLEXIBLE CONTACT STRUCTURE WITH AN ELECTRICALLY CONDUCTIVE SHELL";

U.S. Pat. No. 5,912,046, Eldridge et al, "METHOD AND APPARATUS FOR APPLYING A LAYER OF FLOWABLE COATING MATERIAL TO A SURFACE OF AN ELECTRONIC COMPONENT;

U.S. Pat. No. 5,998,228, Eldridge et al, "METHOD OF TESTING SEMICONDUCTOR";

U.S. Pat. No. 6,029,344, Khandros et al, "COMPOSITE INTERCONNECTION ELEMENT FOR MICROELECTRONIC COMPONENTS, AND METHOD OF MAKING SAME"; and U.S. Pat. No. 6,043,563, Eldridge et al, "ELECTRONIC COMPONENTS WITH TERMINALS AND SPRING CONTACT ELEMENTS EXTENDING FROM AREAS WHICH ARE REMOTER FROM THE TERMINALS".

Carlomagno et al in U.S. Pat. No. 4,955,523, "Interconnection of electronic components" and U.S. Pat. No. 5,189,507, "Interconnection of electronic components" have introduced some features that can also be considered close to the present invention's solutions, but again like FormFactor, they have not covered all the angles.

U.S. Pat. No. 4,655,382, Wong et al, "DISSOLVABLE . . . HOLDER", covers a carrying wafer, but has problems with TCE Mismatch, as will be explained later in the present specification.

SUMMARY OF THE INVENTION

The object of the present invention is to provide means to reliably mount leadless electronic packages or components, such as a BGA on Printed Circuit Boards (PCBs), or chips on substrates, especially to withstand any undesirable effect of TCE Mismatch, or the effects of Thermal Cycling and/or Power Cycling.

A further object of the invention is to provide improved interconnections and mounting means for Integrated Circuit Chips and Packages, to make such assemblies more reliable and to better withstand stresses induced by thermal effects and by shock and vibrations.

The means include providing "columns" between the chip or the package and their carrying base, to provide a "buffer" zone, where the columns would act as flexible joints, to absorb these undesirable effect of TCE Mismatch, or effects of Thermal Cycling and/or Power Cycling.

A special object of the invention is to accomplish all the above, for High-Density devices, i.e. those with small center distances between their contact points.

Summary of the Concept

The basic concept is to control the flow of solder, so that the solder stays at and/or near the joints between the column ends and the electronic components. The solder should not flow away from the column ends, and migrate and stick to the stem of the column. If it does, then the column will be thicker and less flexible. If this happens, then we will loose the benefits of having slender and flexible columns as the connecting element, and we would go back and have premature failures of such assemblies.

Also, there could be a chance for the solder to jump from one joint or one column to the adjacent ones, and would bridge. This is more apt to happen, when the joints or columns are close to each other, as may be the case with small center distances. If this happens, it will create an electrical short and will disrupt the electrical performance of the system. In addition, it will make the connecting elements too stiff and would reduce the "mechanical" life of the system. But this mechanical drawback would be academic, if the system would not function electrically to start with.

An additional feature is to have the columns curvilinear.

Usually the columns are straight and generally perpendicular to the devices. We will refer to their general direction as the Y-direction or the Y-axis. We will refer to the general direction of the devices as the X-direction or the X-axis. This would include the whole plane of the devices. The columns will provide relief in one direction, namely the X-direction; but not the vertical direction, i.e. not the Y-direction. As a result, relatively large assemblies may have the tendency to warp under severe thermal conditions. This condition could be compared to that of a bi-metal strip that would bend under varying temperature conditions.

But if the columns are curvilinear, ever so slightly, they may provide some flexibility along their general Y-axis as well, which would be generally perpendicular to the components. This would reduce this tendency of the devices to warp.

However, since the center distances are small, and space is tight, we cannot have the columns curved haphazardly. They would either take too much space, or if we try to place them closer to each other, they may touch and short. So, the suggested solution is to have the columns "parallel nested", and to have their curves and shapes such that they would allow such parallel nesting. (See Ref4 for more details on the subject of parallel nesting).

To repeat: The key concept of the invention is to "CONTROL" the solder flow along the column, so as to ensure that there will still be some amount of flexibility in the column, after all the soldering/joining operations have been completed.

The present invention offers several solutions. They could all be grouped under the rubric "Micro-Columns" and "Controlled Soldering" or "Controlled Wettability".

"Micro", because they are small, especially in their diametrical size or girth, so that they can be installed on small center distances. And "Columns" in particular, because columns would improve the reliability as compared to direct soldering or to the use of solder balls. By the way, I will sometimes refer to these "Micro-Columns" simply as "Columns" for short.

The columns need not be too tall. They could be relatively short, but they also need to have a small diameter or girth. The important thing is their L/D ratio. See Ref3, page MC-D-7. It is desirable to have the largest L/D possible. The reason is the following. If L/D is small, i.e. the solder joint is short and fat, then the prevalent stressing action in the joint is "shear". If L/D is large, i.e. the joint is tall and slender, and then the prevalent stressing action changes and becomes a "bending" action. If the thermal conditions create a certain amount of linear motion at the joint, and we try to accommodate that motion, by stressing the joint under "bending", i.e. by flexing the column say, then the bending stresses will be relatively small. But if we have a short joint, the motion will be essentially trying to shear the joint, because in essence we would be asking that the package would slide with respect to the board. This would create what is called shear stress. The shear stress for the same amount of linear motion would be tremendously much higher than the bending stress for a comparable amount of linear deflection. Such high shear stresses are the major cause of the premature failure of such joints. All this was explained in the three papers, by the inventor et al, Reference A-4 through A-6, listed under "Additional Literature References" at the beginning of this application. The problem was originally solved and taken care of by the inventions described in the three U.S. patents, by the same inventor et al, listed earlier in the section on Prior Art.

Please note again that with solder balls, the resulting solder joints have very small L/D. This is very undesirable from the point of view of the stresses and it is the main cause of premature failure of such assemblies.

So, because of the small size (height) of the columns, and because of the well-known "surface tension" of solder, it is important to control how far will the solder wick up the length/height of the column. Hence, "Controlled Soldering" or "Controlled Solderability", because there will be some means to control the migration of the solder from the joints and to prevent it (the solder) from flowing to the center (stem) of the columns.

"Controlled Wettability" because the proposed solutions are not limited to "solder" only, but they can be applied to other joining materials.

There are many ways to accomplish this feature. I have tried to summarize most of them in the SUMMARY TABLE further later in this specification.

I have also tried to show/illustrate the important methods in the attached drawings or sketches.

To recap, the concept attempts to do the following:

Provide a "Column" (tall and slender) to interconnect the chip to the substrate, or the package to the board.

Make the column such that the solder can wick only to a limited distance along the length of the column, leaving enough length of column to act as a flex joint.

Make the column round and slim (small diameter) or with a rectangular cross-section, such that the small thickness (T) will be more flexible and with less stiffness, than the width of the cross-section (W).

Furthermore, there will be additional features included in the proposed solutions. For example:

Place the columns with rectangular cross-section, in an array, such that the more flexible section of the column would be in the direction of the largest thermal expansion or contraction. See the explanations given on this subject in the specifications of GROUP #1, covering the "leaded" packages, and on the benefits of "orienting" the leads.

The columns could be arcuate and could be "parallel nested".

There could be an anchor provided to reduce the stresses on the columns, in case they get exposed to excessive shock and vibration.

There will be a few other details offered. They will all be described down below.

BRIEF DESCRIPTION OF THE DRAWINGS

In this section, I will refer to some pages, sketches or drawings that are included in the References listed at the beginning of this application. I will refer particularly to Reference #3, Provisional Patent Application Ser. No. 60/268,467, filed Feb. 12, 2001, entitled Probes, Sockets, Packages & Columns Sockets, which will be referred to as Ref3. This Ref3 has been made part of this application, by reference, at the beginning of this application. Consequently, I would like to use the drawings that were included in Ref3, as part of this application. I will refer to them by page number as explained in the NOTE right under the listed References.

The reason I will do that, is so as not to duplicate certain drawings that are intended for explanation only and do not necessarily need to be in the final patent specifications. If the examiner decides, however, that such drawings are necessary and must be included here in these specifications, I will do so.

So, I will first briefly describe the drawings and sketches that were included in Ref3. Afterwards, I will briefly describe the additional or duplicate drawings that are included in this present application.

I will first describe briefly the drawings of Ref3, especially the ones belonging to the section on "Micro-Columns", marked MC, because they are the basis or origin of what is in the present application. This will prepare the reader for what's to come.

Drawings in Reference #3:

The sketches in Ref3, Page MC-D-1, summarize a number of the proposed approaches, i.e. several methods of controlling the solder wicking along the column. The sketches in this page show several methods of controlling the solder wicking along the column.

A) One method is to use a "DAM".

B) Another method is to cover the length of the column with a means that would not allow the solder to remain there.

B-1) This can be done by applying "solder resist" to the portion of the column that we want to remain free of solder.

B-2) Another is to plate the column material with nickel or the like, and/or oxidize it so that solder would not attach/wick to those areas.

B-3) Another way is to plate the whole length of the wire with non-solderable material and when the wire is cut, the exposed base material, say copper, at the cut cross-section will be enough to have the solder adhere to the copper there and create the required joint. All this will be expanded on in the text and drawings described below.

The figures in Ref3, Page MC-D-2 and 3, show an example of an LCCC, having columns with solder control dams.

After the wire bonding, or soldering of the columns, it would be desirable to have the "FREE" ends "CO-PLA-NAR". A grinding operation could be used to accomplish this. A comb, or some fixture, may be used to protect the wires during such an operation. The sketches in Ref3, Page MC-D-4 show such a comb idea.

The sketches in Ref3, Page MC-D-4, show several other possible methods of making assemblies using columns that have "solder control" features. They show a way to solder the wires to the device, using a sort of a "MOLD" to carry the wires during the soldering operation. Bear in mind that the mold here is simply acting as a holder or locator or a fixture, not as a mold because the wires are not melting and will not be shaped by the "mold" (Not like the IBM molded columns).

The sketches in Ref3, Page MC-D-4 show also "Pockets" or "Recesses" in the Board/Substrate/Package, which will receive the free end of the columns. These are optional, but they will help in "locating" the columns as well as in "Controlling the solder" from "bridging" over to adjacent columns.

The sketches in Ref3, Page MC-D-5, show a wire bonding operation, with a "knife" to cut the columns to the desired height/length.

The sketches in Ref3, Page MC-D-6, show some "comb" and its path through the columns to keep them (the columns) straight. Such a comb would help in placing the column in place on the substrate, during the operation of mounting the chip on a substrate. In such a case, the comb can be referred to as a "guiding comb". Notice also that in the lower sketch of Ref3, Page MC-D-6, there are two guiding combs. One is perpendicular to the other. This is to "capture" the columns between the two combs and to have better control on their location. This whole procedure has also been described in some more details in Ref4, the Non-provisional application.

The sketches in Ref3, Page MC-D-7, show the reason it is important to provide some flexibility between an electronic package and a substrate, especially if there is a TCE mismatch. We need to provide the largest L/D ratio possible.

The sketches in Ref3, Page MC-D-8, show some numerical examples of the column height, the solder joint heights, and the remaining height of the flexible portion of the column (which I will refer to as "STEM").

The sketches in Ref3, Page MC-D 9 and -10 show various ways of implementing the invention.

The figures in Ref3, Pages MC-D-11 through -17 show the method of the invention, where I use a "DAM" to prevent the solder form creeping too far along the column stem. This is applied to a BGA.

The sketches in Ref3, Pages MC-D-18, 19 and 20 show various shapes of dams and column endings, to accomplish the same objectives.

The figures in Ref3, Pages MC-D-21 through 28 show the invention, using columns that were given the "controlled solderability" features, by using combined materials from "Materials Technology" and/or by other procedures to accomplish the end goal. These will be explained in a moment. This is also applied to a BGA.

The figure in Ref3, Pages MC-D-29 shows a way to create the pins/columns by oxidizing the whole surface and then cleaning the ends and cutting to length.

The figure in Ref3, Pages MC-D-30 shows another way to cover the pin stem say with heat shrink tubing or any other material to prevent soldering it.

The figure in Ref3, Pages MC-D-31 shows the invention applied to chips/dies especially. Notice here several points. First, the columns are wire-bonded. Second, they are covered by one or more layers of materials. Third, there is an "Adhesive Dot" or an "Anchor", which can help overcome stresses due to "Shock & Vibrations".

The figures in Ref3, Pages MC-D-32 through 33 show the steps in implementing the invention with wire bonded columns.

The figure in Ref3, Pages MC-D-34 shows a way to "double coat" to create a "GROUND" skin over the columns.

The figure in Ref3, Pages MC-D-35 through 37 show "Solder Wells" to further control the solder joints.

The figure in Ref3, Pages MC-D-38 shows the way to implement the invention on a full wafer (silicon wafer) and the following steps.

The figure in Ref3, Pages MC-D-39 shows more details of that.

The figures in Ref3, Pages MC-D-40 and 41 show a fixture for "Roaching" and for coating the columns. (See also other sketches in the Specs further down below).

The figures in Ref3, Pages MC-D-42 and 43 show various fixtures for "Roaching".

The figure in Ref3, Pages MC-D-44 shows an example of the "Carrier Wafer", which can be used to hold the pins/columns, when they get attached to the package, instead of fixturing. (Again, see more description about this in the specifications further down below). In this case, the wafers are manufactured in continuous strips. Here one strip has registration holes, while the other does not.

The figures in Ref3, Page MC-D-45 show various shapes of columns ends.

There is another sketch that was included in a different part of Ref3. It was in the part covering the Test Sockets. It was marked TS-D-115. The sketch shows a package mounted on a board, or a chip mounted on a substrate, where the columns are not straight, but curvilinear. The columns can also be coated, with solder control features, etc., as indicated by the column at the right end. The big difference here is that the columns are "parallel nested" and do comply with all the requirements of parallel nesting as described in Ref4, the Non-provisional patent application Ser. No. 09/947,240, filed Sep. 5, 2001, entitled Interconnection Devices.

Now, to the figures of this present application.

Note: FIGS. 1 through 42 belong to the first group of this application, Group One, "Leaded" Devices, and were described in that section.

Figure 43:
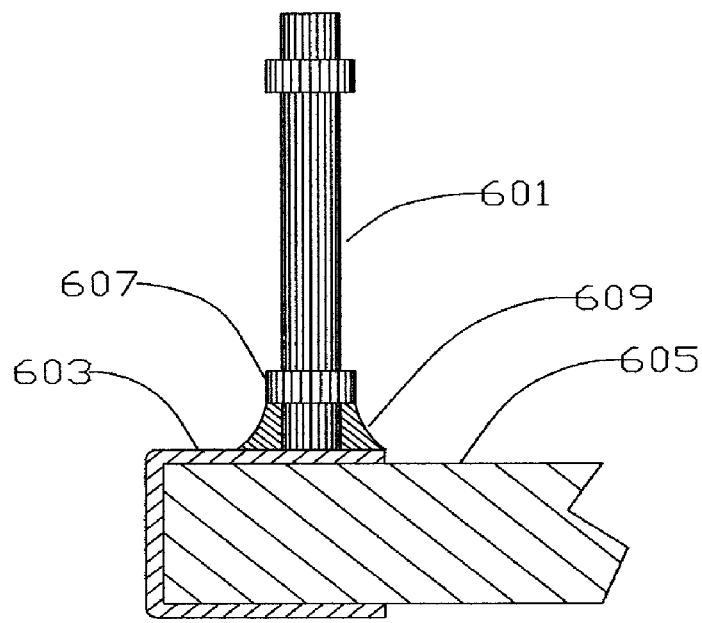

FIG. 43 shows a first embodiment as per this invention. It is a column with solder control dam.

FIGS. 44 through 49 show applications of this embodiment.

Figure 50:
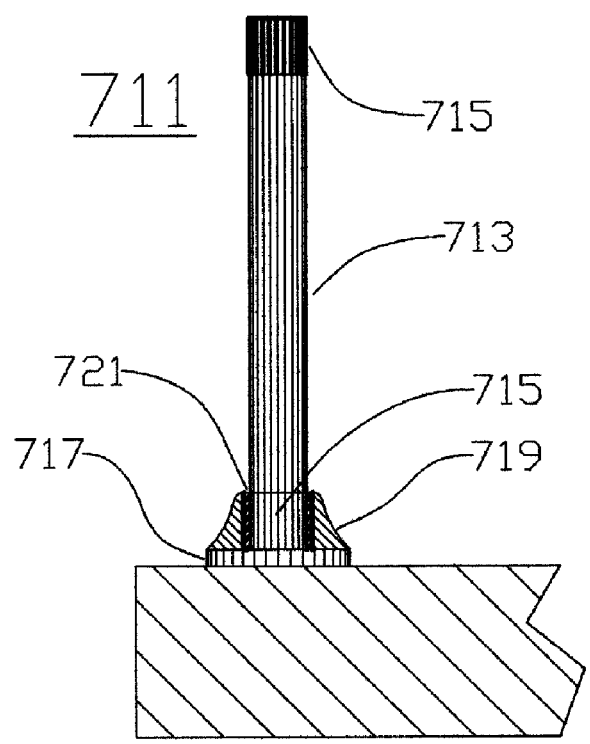
Figure 51:
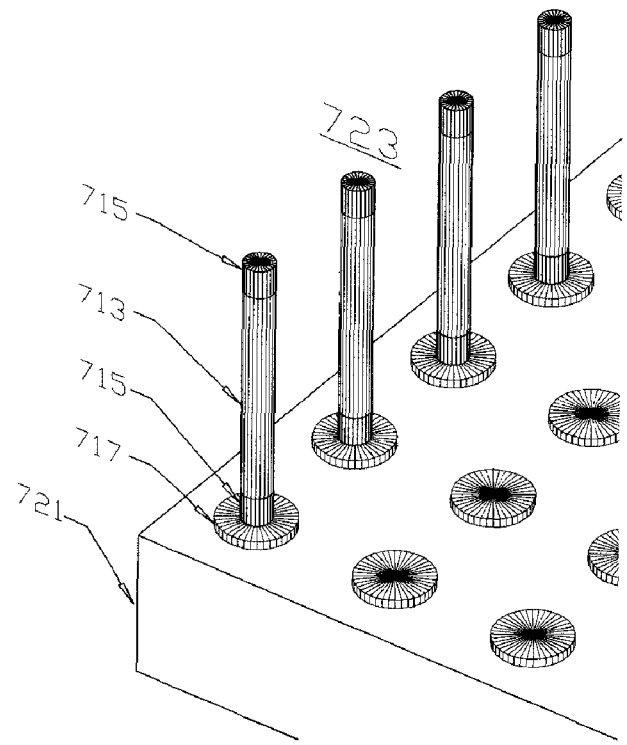

FIG. 50 shows a second embodiment. It is "treated" column.

FIGS. 51 through 56 show applications of this second embodiment.

Figure 57:
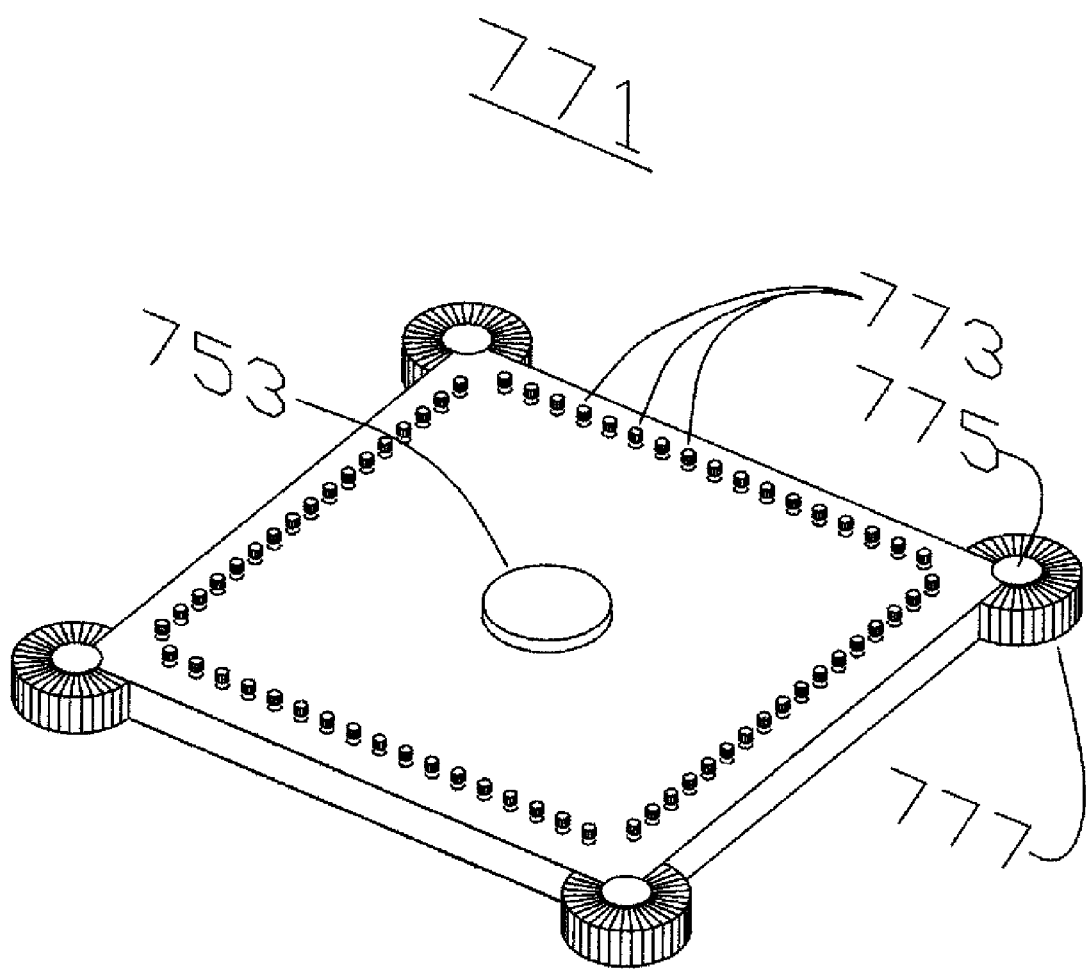

FIG. 57 shows a "carrying wafer", which can be used to handle a number of columns as per this invention. It also shows an "anchor".

Figure 58:
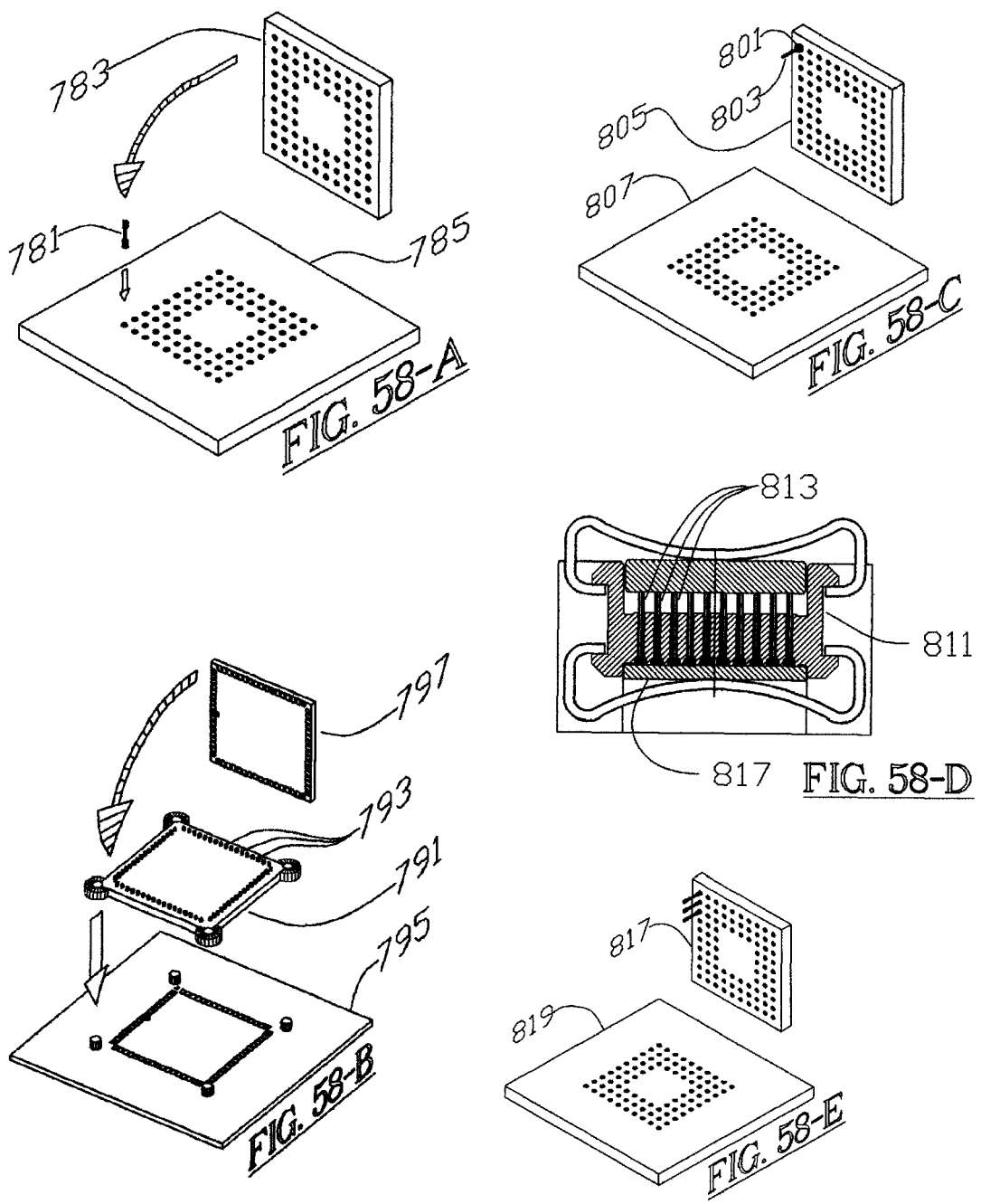

FIG. 58 shows several methods of implementing the teaching of the invention.

Figure 59:
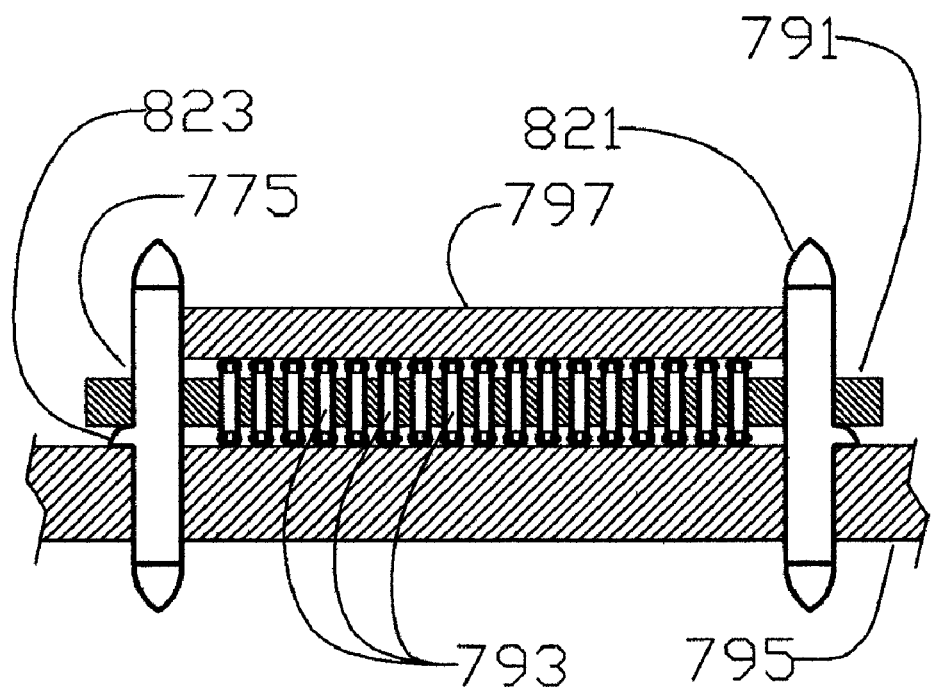
Figure 60:
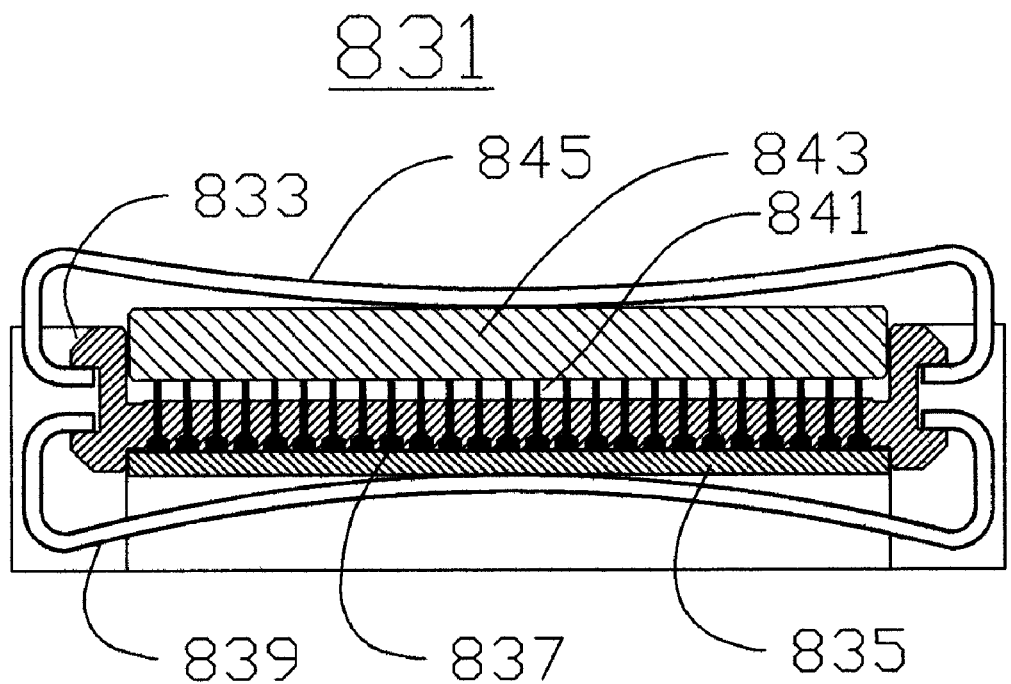

FIGS. 59 and 60 show some fixturing used in implementing the invention

Figure 61:
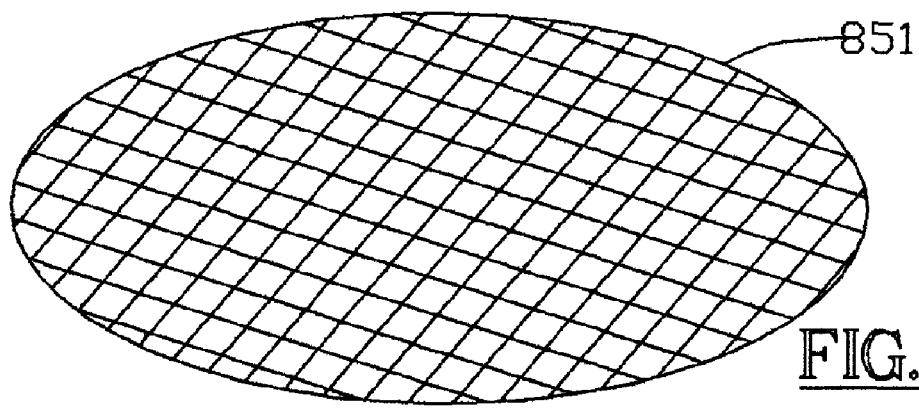
Figure 61:
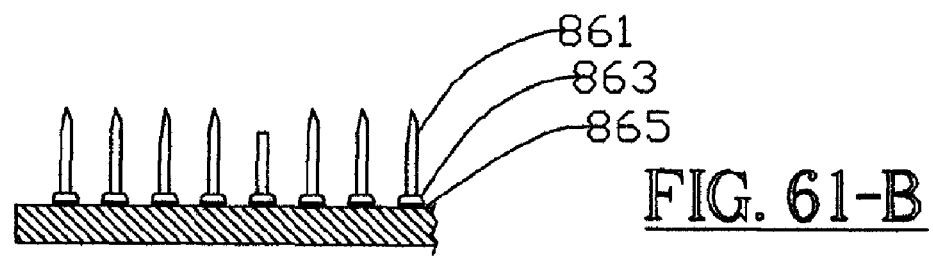
Figure 61:
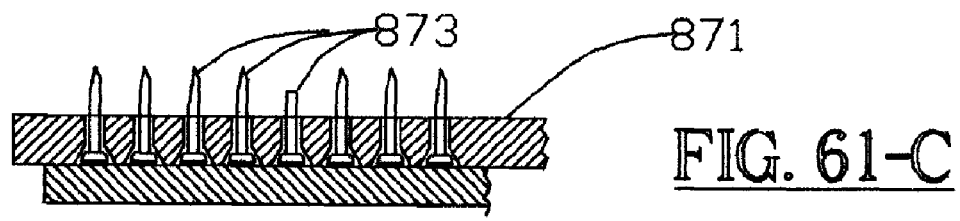
Figure 61:
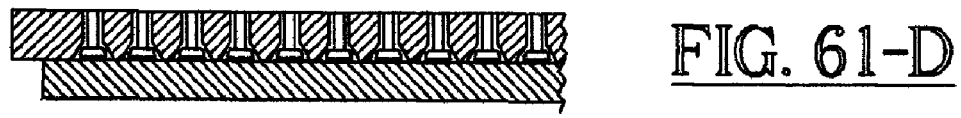
Figure 61:
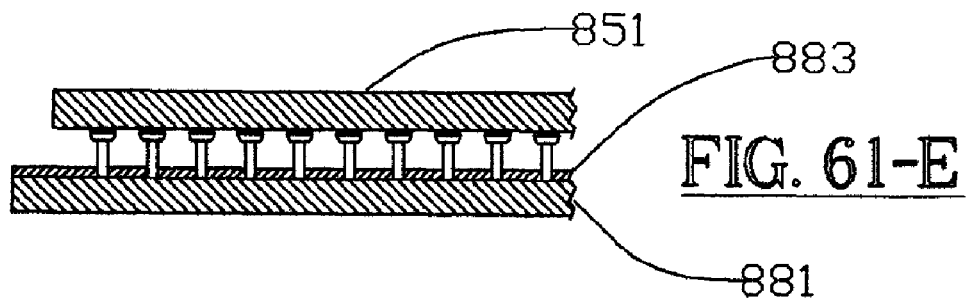

FIG. 61 shows how "wire bonding" can be used to implement the invention.

Figure 62:
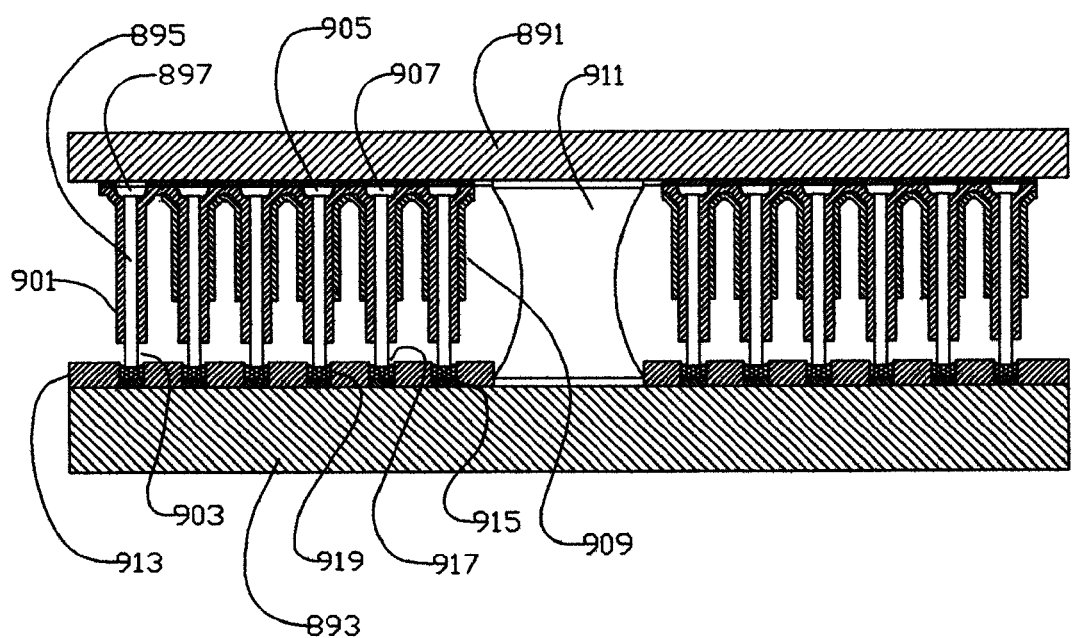
Figure 63:
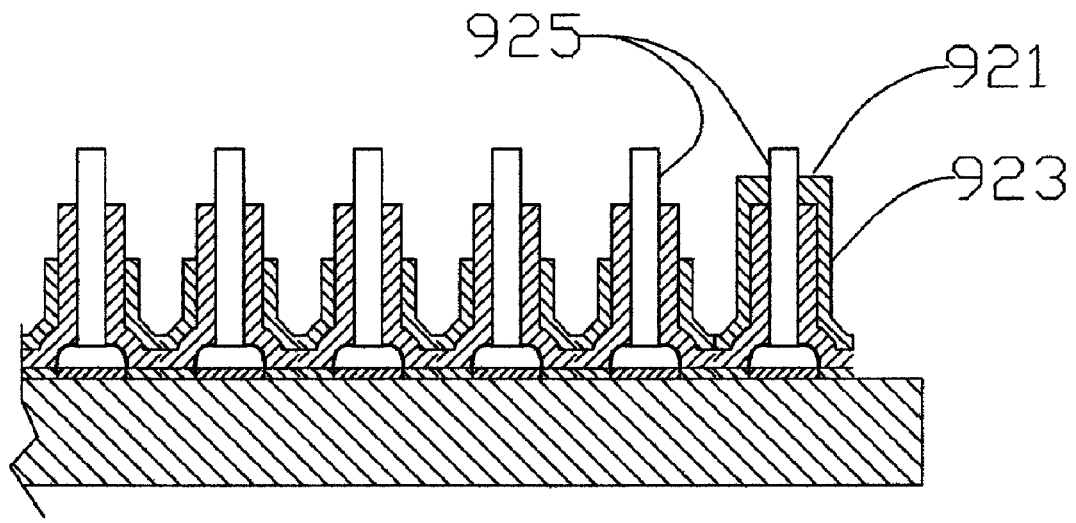
Figure 63:
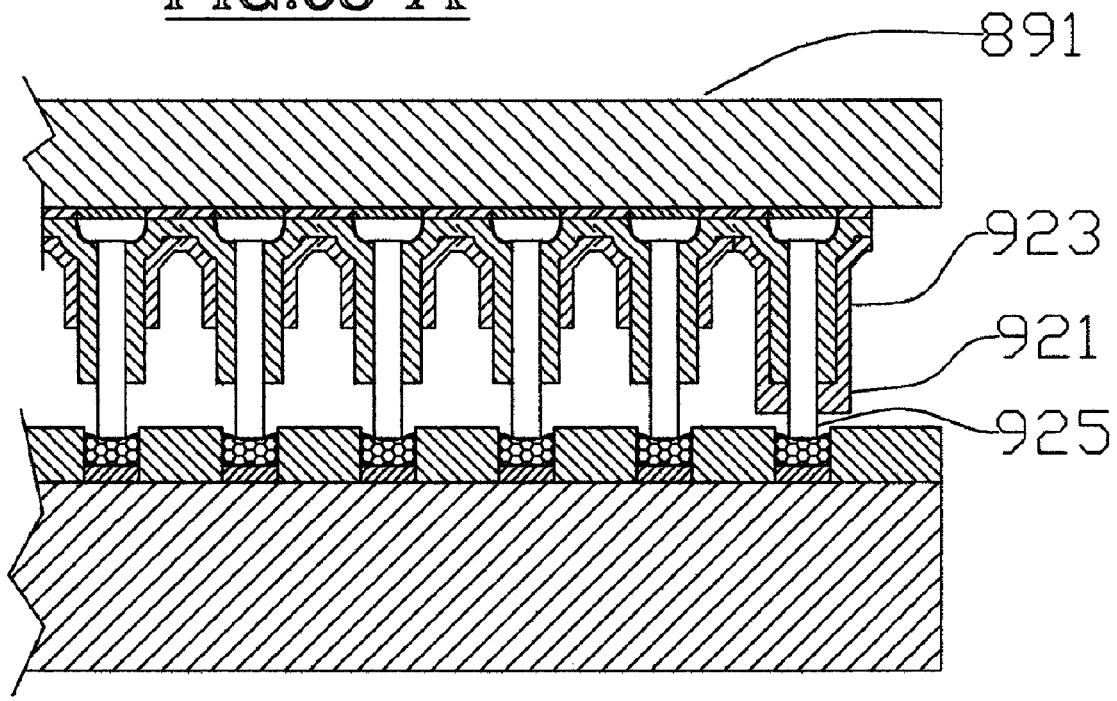

FIGS. 62 and 63 show details of wire bonded columns and how to mount chips or packages on substrates or boards, using wire bonded columns.

FIGS. 64 through 68 show details of how to coat the wire bonded columns to prepare them as solder controlled columns.

Figure 69:
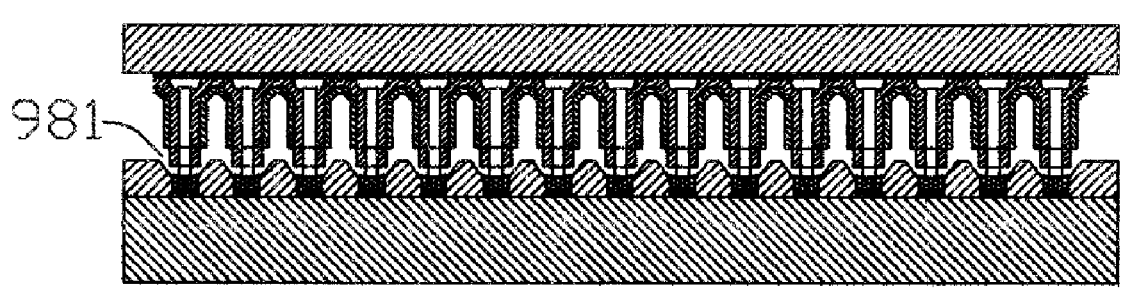
Figure 69:
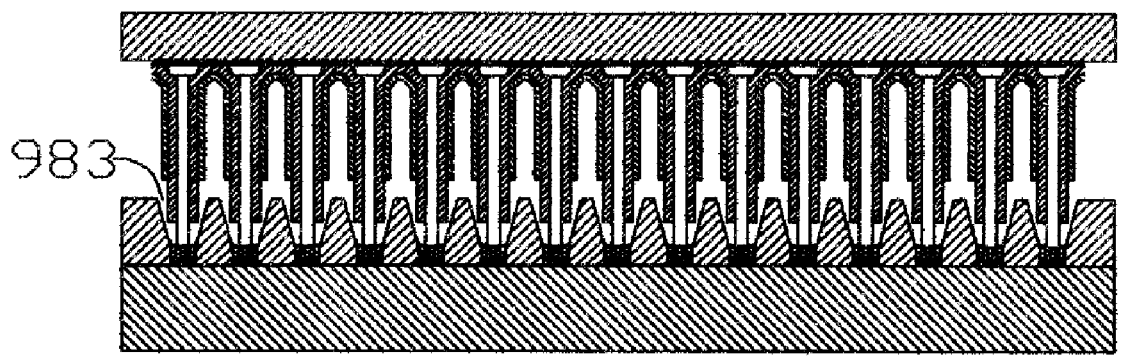

FIG. 69 shows details of solder joints in recesses in the solder resist coating.

Figure 70:
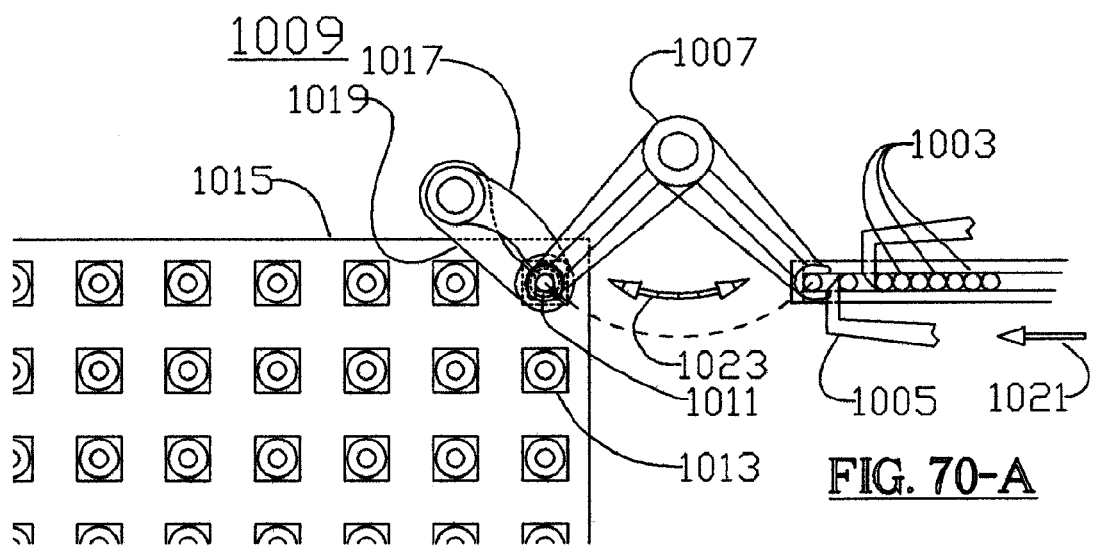
Figure 70:
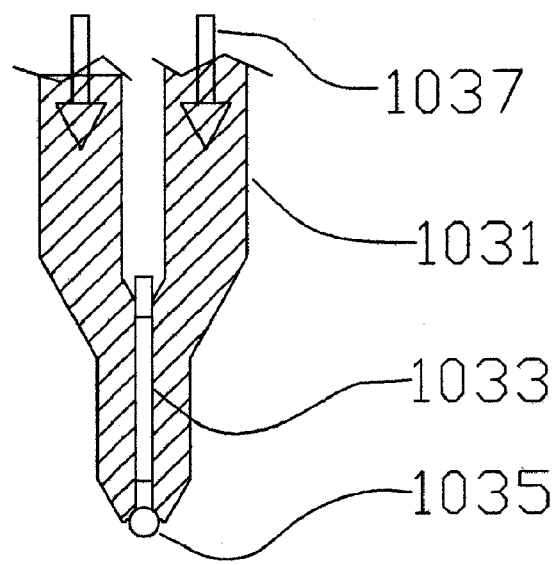

FIG. 70 shows a concept of a machine that can be used to wire bond discrete pieces of wire.

Figure 71:
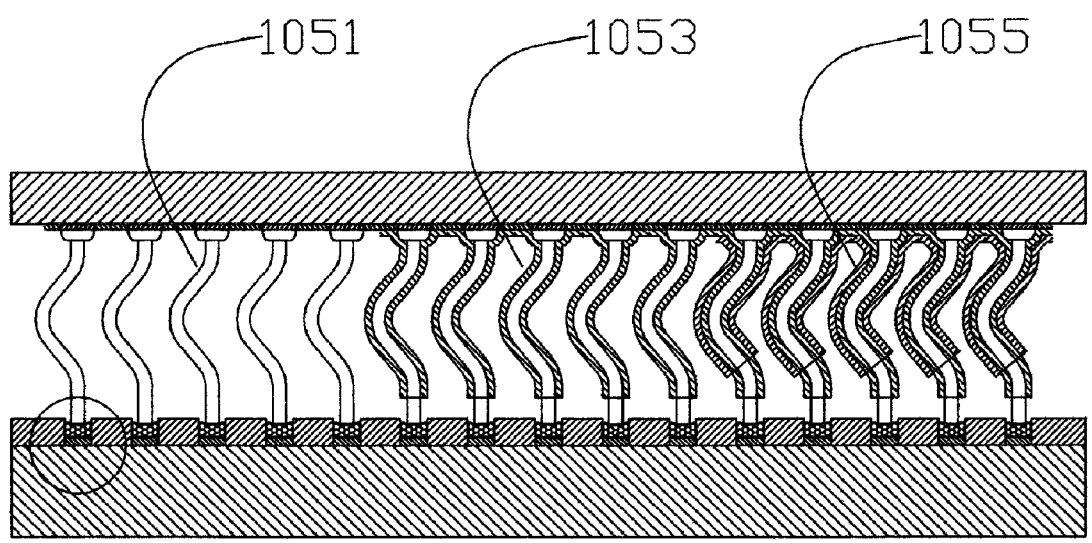

FIG. 71 shows a chip on a substrate, or a package on a board, mounted with solder control columns, where the columns are curvilinear and parallel nested.

FIG. 72 is for the Abstract.

DESCRIPTION OF THE PREFERRED EMBODIMENTS

While the invention is susceptible of various modifications and alternative constructions, certain illustrative embodiments thereof have been shown in the drawings and will be described below in detail. It should be understood, however, that there is no intention to limit the invention to the specific form disclosed, but, on the contrary, the invention is to cover all modifications, alternative constructions, and equivalents falling within the spirit and scope of the invention as defined in the claims.

While I am describing the drawing in more details, I will at the same time explain the technology basis of the invention. I will also include a number of examples in this section, which should be considered as part of the embodiments for the purpose of this application as well.

This description covers more than one invention. The inventions are based partly on the same technology platform, but then each of the inventions has some additional features of its own. Not being an expert in handling patents, I would like to leave it to the patent examiner to decide on the number of the inventions contained and how to split one invention from the other.

In this section, I will again refer to some pages, sketches or drawings that are included in the References listed at the beginning of this application. I will refer to them by page number as explained in the NOTE right under the listed References. The reason I will do that, is so as not to duplicate certain drawings that are intended for explanation only and do not necessarily need to be in the final patent specifications. If the examiner decides, however, that such drawings are necessary and must be included here in these specifications, I will do so.

I will refer particularly to Reference #3, Provisional Patent Application Ser. No. 60/268,467, filed Feb. 12, 2001, entitled Probes, Sockets, Packages & Columns, which will be referred to as Ref3.

One way to impart more reliability to assemblies of BGAs and the like, as well as Chip Scale Packaging, is to use small diameter columns, instead of the presently popular "solder balls". I will refer to such columns as "Micro Columns" or simply "columns".

Because of their small size, and because of the well-known "surface tension" of solder, it is important to control how far will the solder wick up the length/height of the column.

One method is to use a "DAM". Another method is to cover a portion of the length of the column with a means that would not allow the solder to remain there. This can be done by applying "solder resist" to the portion of the column that we want to remain free of solder. Another is to plate the column material with nickel or the like, so that solder would not attach/wick to those areas.

Another way is to plate the whole length of the wire with non-solderable material and when the wire is cut, the exposed base material, say copper, at the cut cross-section will be enough to have the solder adhere to the copper there and create the required joint.

DETAILED DESCRIPTION OF DRAWINGS AND PREFERRED EMBODIMENTS

FIG. 43 shows one way to accomplish the goal of this invention. It relates to one of the sketches in Ref3, Page MC-D-1. It shows a column 601 soldered to the contact pad 603 of a package 605, which could be an LCCC. You can see that the column has a ring 607 around its body 601, near the lower end of the column. I refer to this ring as a "solder control dam" or simply "DAM" 607. We can also look at it as the device that is put around the trunk of trees to prevent rodents from climbing up the tree. The solder 609, when reflowed, would fill the space between the contact pad and the dam, attaching itself to the lower end of the column below the dam and to the contact pad of the package. Depending on the amount of solder present, the solder fillet would form nicely there. If there is too much solder, the solder may try to climb up the dam, but because of the larger diameter of the dam and the high surface tension of solder, the tendency would be for the solder to stay around the bottom below the top edge of the dam. If anything, the solder would create a fat fillet, one that would have convex outer contour, before the solder would have the chance to climb over the dam towards the body (stem) of the column.

Figure 44:
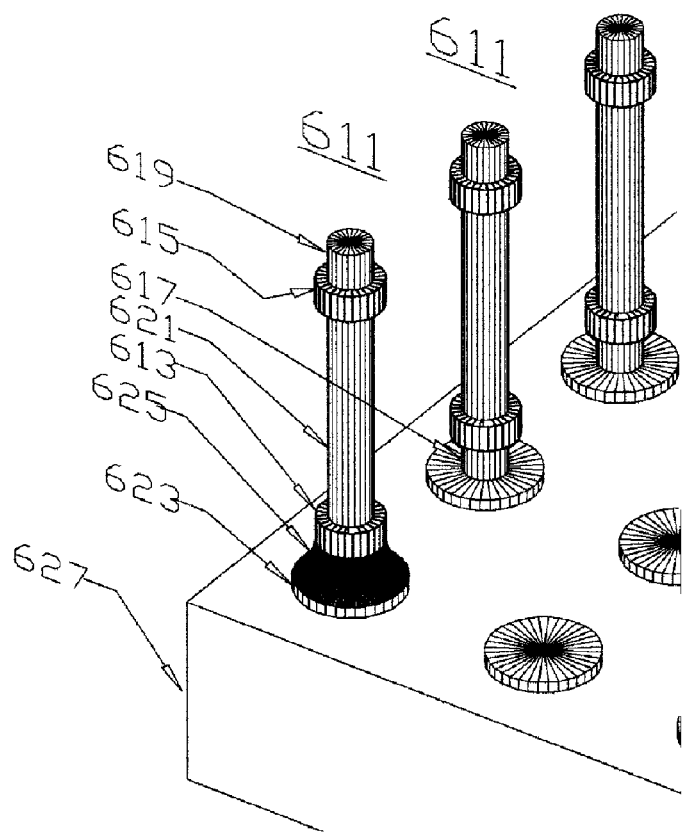

FIG. 44 shows a couple of such columns 611 with solder control dams, mounted on the corner of a BGA 627. In this case, however, the columns have solder control dams 613, 615 near each of their two ends 617, 619 to control the solder 625 flow at both ends. The figure shows the nomenclature that I will use in this specification, and highlights the individual portions of the column 611 (including the "stem" 621) and the BGA 627 and its contact pads 623. These columns are similar to the one shown in FIG. 43 as well.

Figure 45:
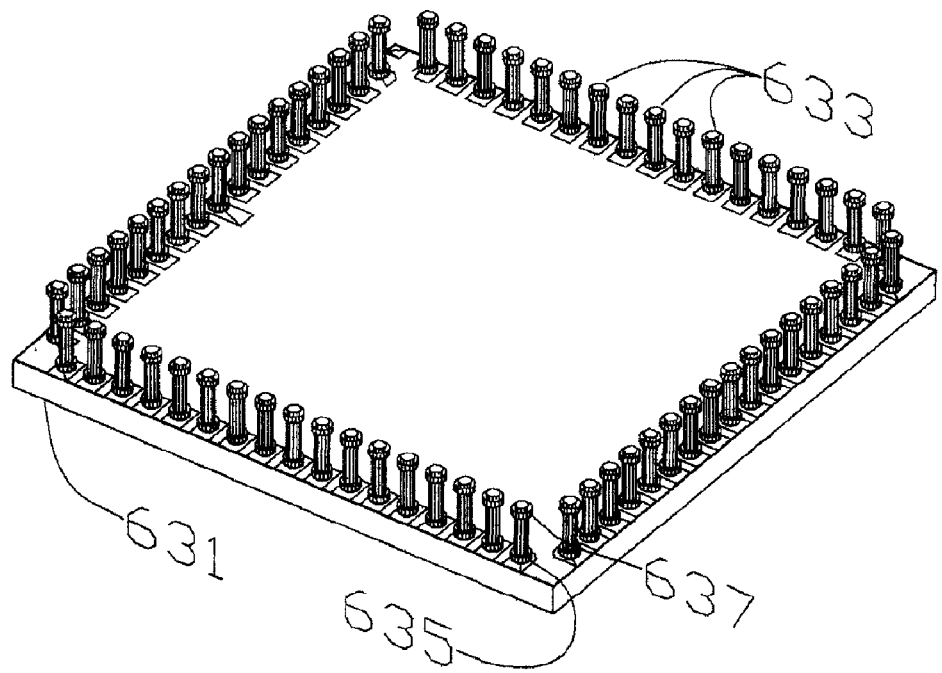

FIG. 45 shows an LCCC 631, populated with similar columns 633 with solder control dams 635, 637 at both ends. This figure correlates with those in Ref3, Pages MC-D-2 and 3.

Please note the following:

The columns are shown at the periphery only, but they can be on pads inside the square, to create a full or partial matrix, i.e. to create something like a column grid array. See the figures for BGAs.

The column can be "soldered" to the device (either package or chip) or they can be "wire bonded" to it. See FIGS. 61 through 69.

The columns can be round in cross-section or can have a rectangular cross-section.

If they are rectangular, then they can be oriented radially, as explained earlier, in Group One, for leaded devices, to reduce the effect of thermal deformation.

If the bonded wires/columns were rectangular, then the "wire-bonding" would be rather considered "tape-bonding" and would have the same effect.

Ideally the tape-bonded columns should also be oriented radially as explained before.

Figure 46:
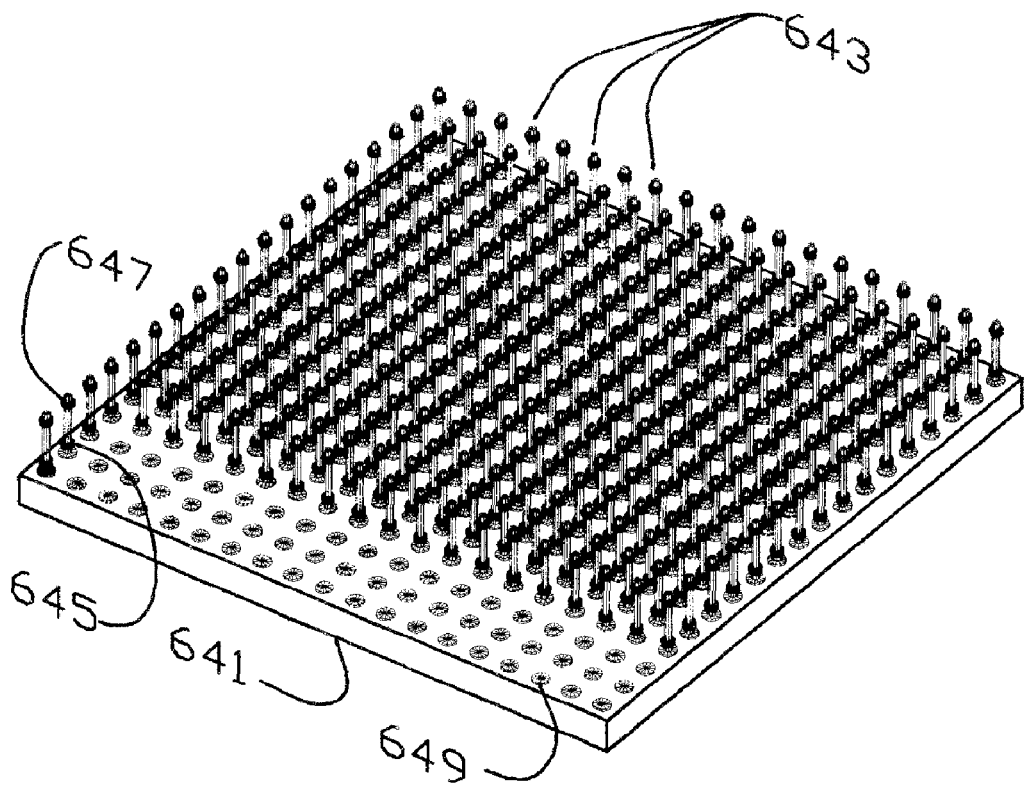

FIG. 46 shows a BGA 641 similarly populated with columns 643 with solder control dams 645, 647. This figure and FIG. 44 correlate with those in Ref3, Pages MC-D-11 through -17.

The BGA is not fully populated with columns, simply for clarity of illustration. Some contact pads 649 are shown without columns, but in practice, each pad would get a corresponding column as needed.

Figure 47:
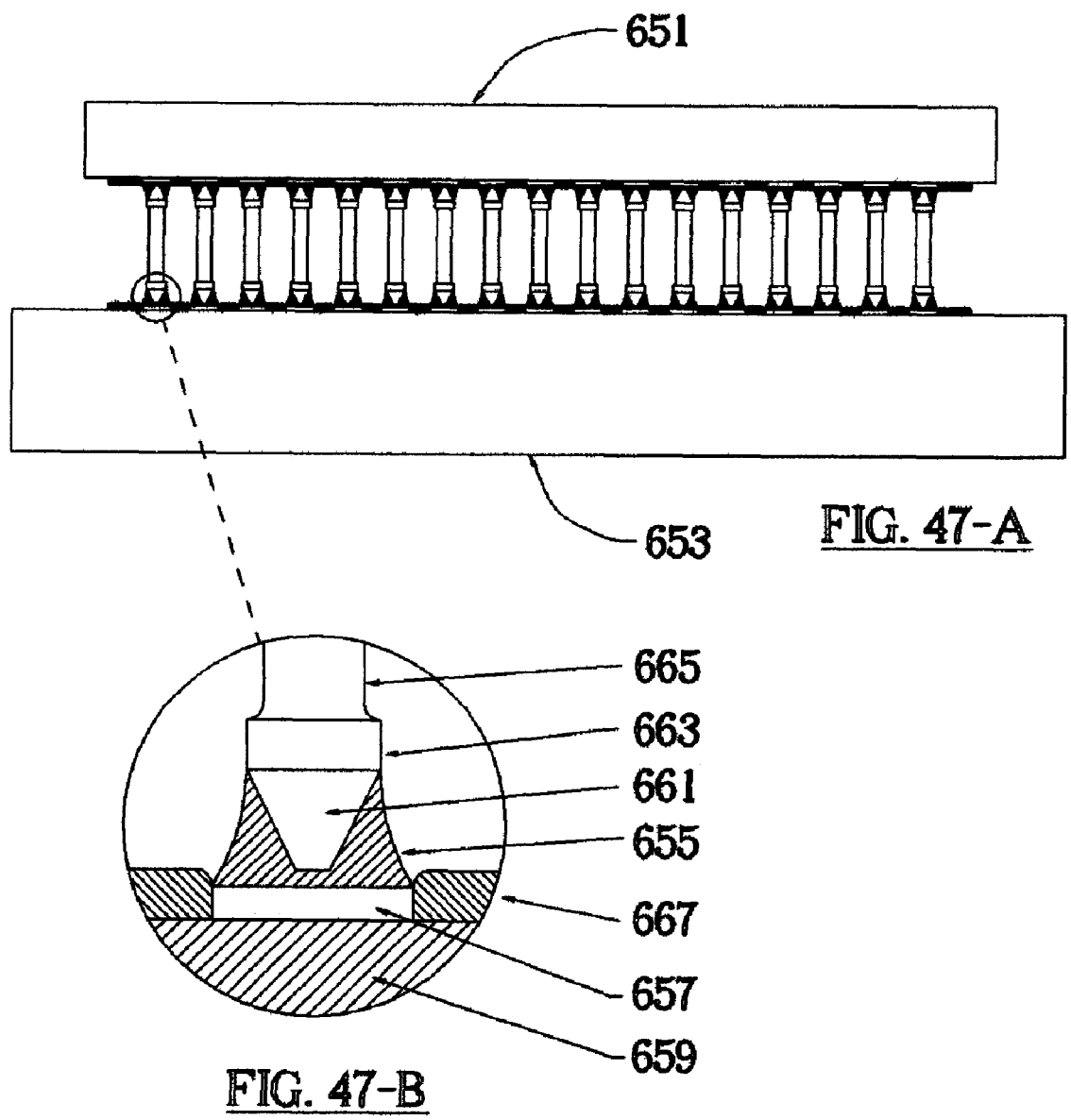

FIG. 47 shows at the top FIG. 47-A, a chip or a package 651 mounted on a substrate or board 653. At the bottom left, FIG. 47-B, an enlarged view of the solder joint is shown. It can be seen that the solder 655 is filling the space between the contact pad 657 on the substrate 659 and the end 661 of the column, up to the dam 663. The stem 665 above the dam does not get solder on it, because the dam in essence stops the solder from getting to the stem. Again, some nomenclature is included. Notice the solder resist 667 on the board 659. This will be discussed in detail while talking about FIG. 62.

Figure 48:
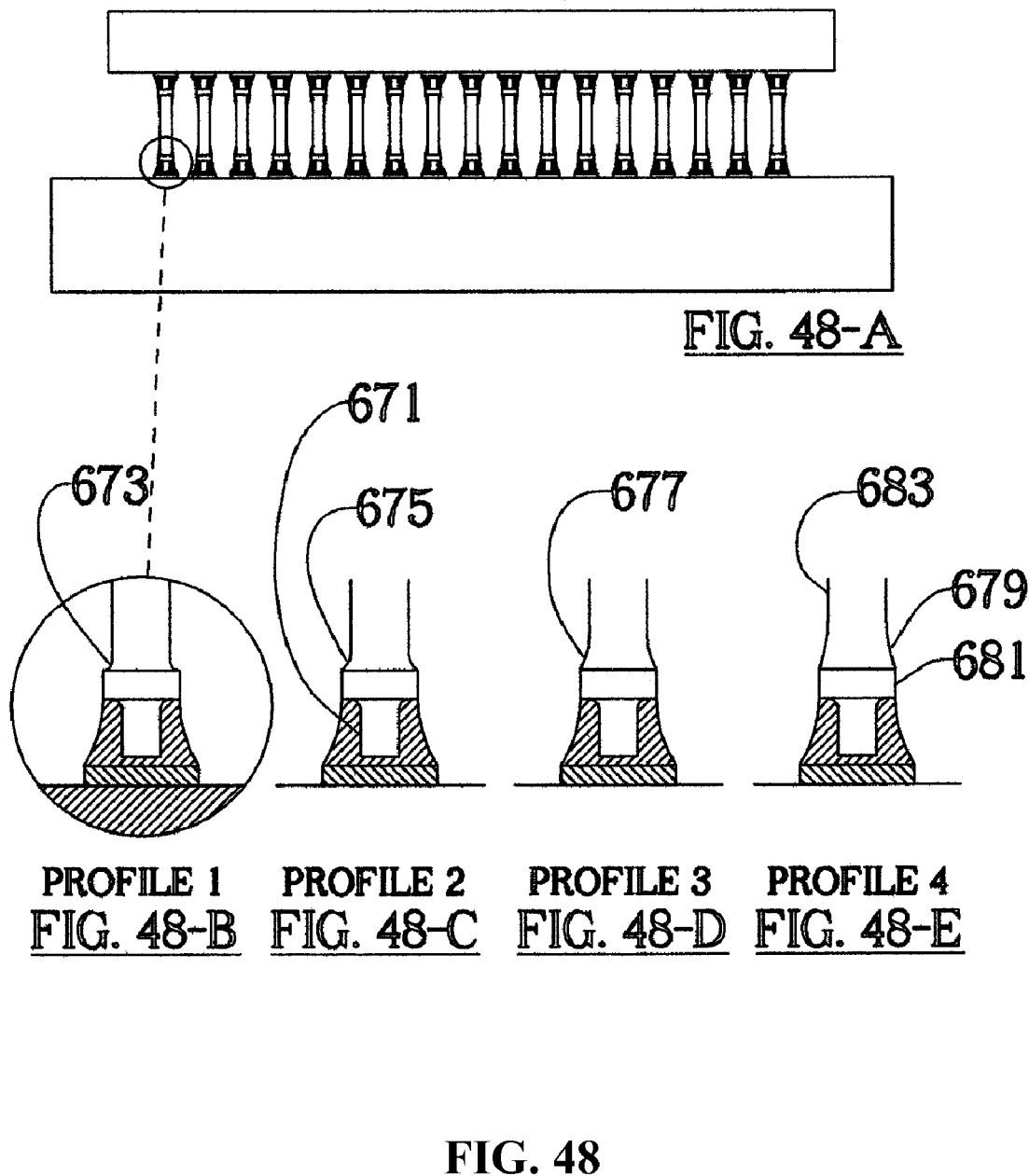

FIG. 48 shows a similar setup as in FIG. 47. The shape of the column end 671 is different. Also, the shape of the transition 673, 675, 677, 679 from the dam 681 to the stem 683 can be sharp 673 as in the figure to the left, or very gradual 679 as in the figure to the right, or anything in between as in the central figures.

Figure 49:
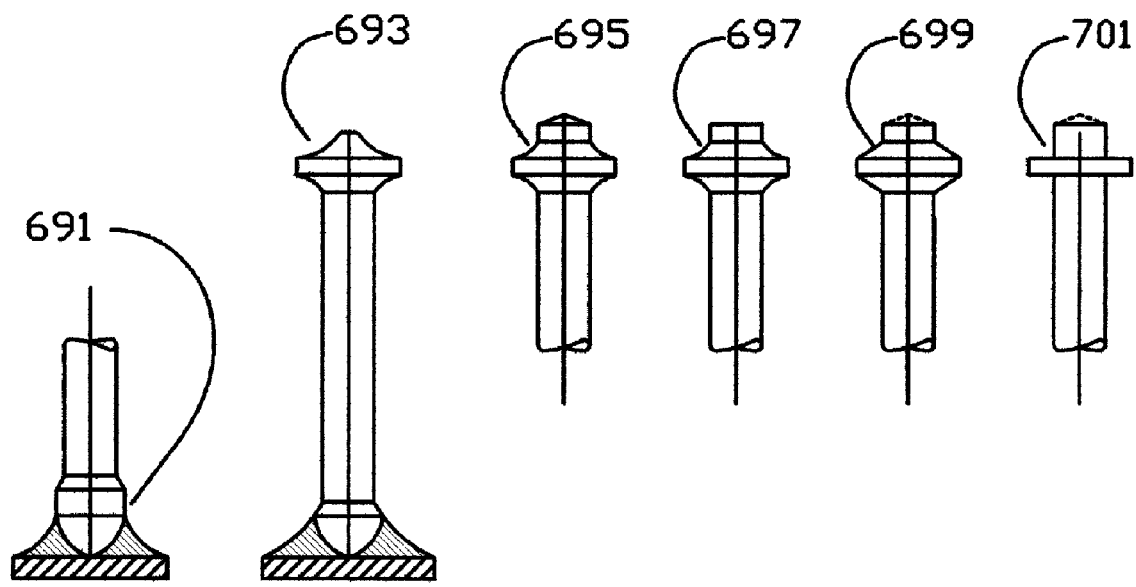

FIG. 49 shows various shapes of dams and column endings 691 through 701, to accomplish the same desired objectives.

FIG. 50 shows a different way of accomplishing the same end result. Here the column 711 is made, so that its stem 713 is not solderable. The end 715 of the column, near the contact pad 717, is made solderable. The end result is that the solder 719 will again bunch up near the contact pad 717 and the solderable end 715 of the column, leaving the rest of the column, which I refer to as the stem 713, with no solder attached to it. The same discussion about too much solder that was mentioned with FIG. 43 applies here as well.

For ease of referencing, I will call this type of columns as "treated" columns, as opposed to the "collar columns" that were shown in the previous figures.

One way to make treated columns is by covering the stem of the columns with a layer of solder resist. This solder resist cover layer would perform the same end goal function. The solder would stay confined to the joint between the contact pad and the end of the column that has no solder resist on it, keeping away from the stem, and thus keeping the stem thin and flexible.

I will discuss below, at length, other methods to get portions of the column to be solderable or not solderable, at will, and under our control. The methods of accomplishing that goal are an important part of the invention.

FIG. 51 shows again two columns on a BGA 721, as in FIG. 44. It can be seen that these columns 723, however, are "treated" columns, not collar columns.

Figure 52:
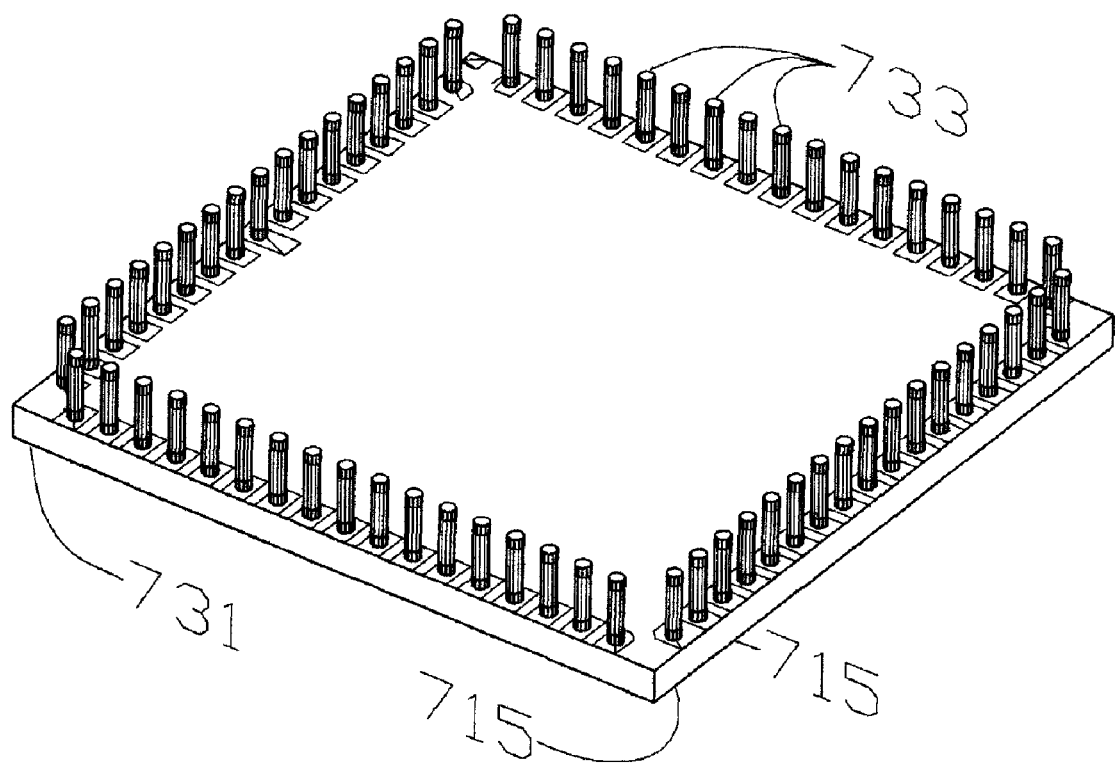

FIG. 52 shows another LCCC 731, as in FIG. 45, but with treated columns 733.

Figure 53:
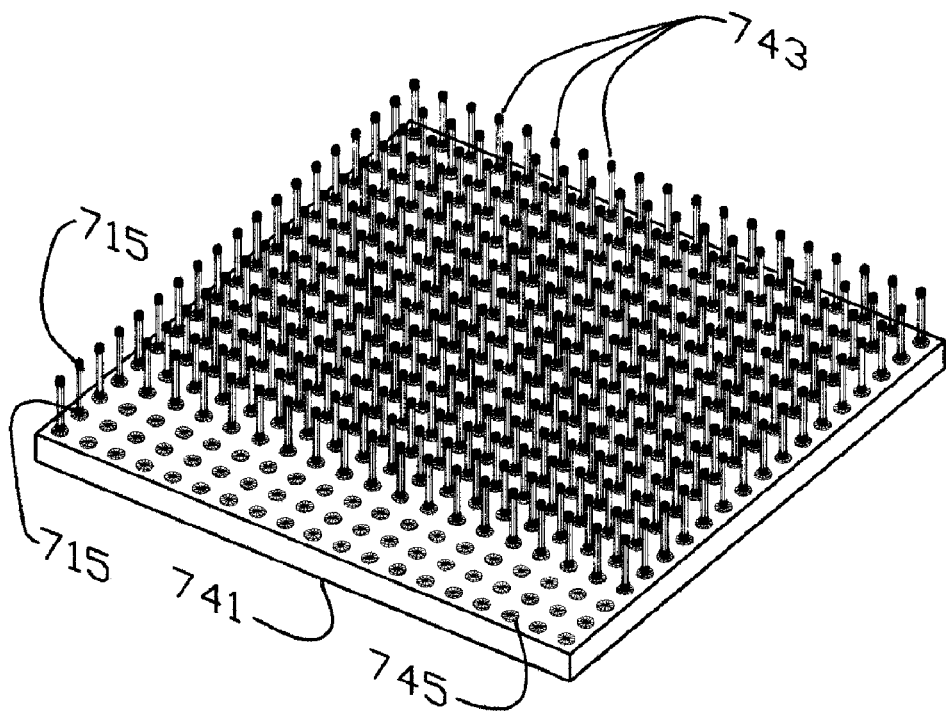
Figure 54:
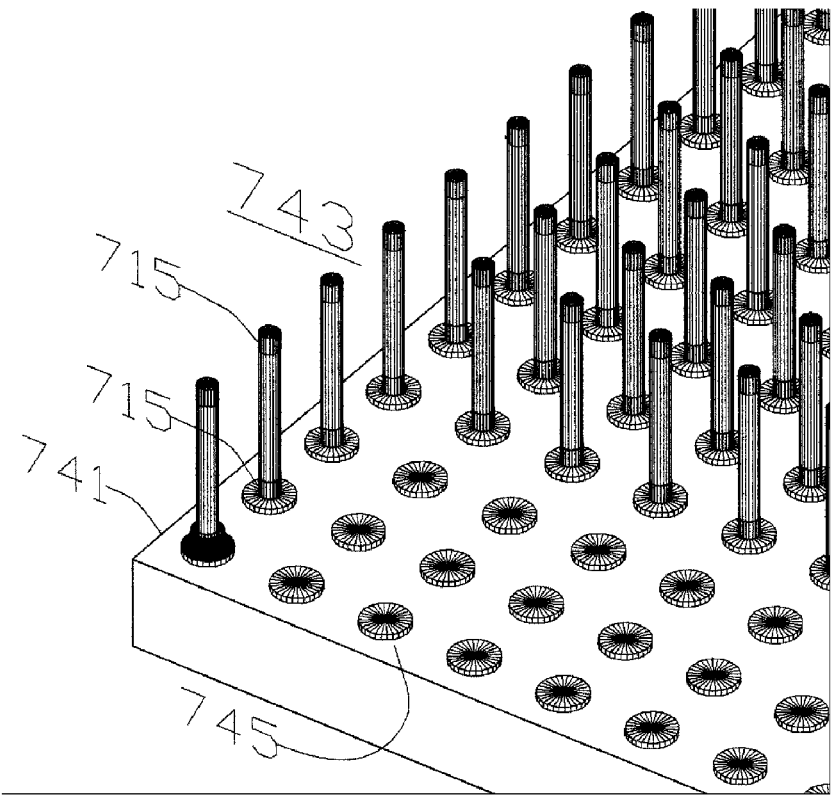

FIGS. 53 and 54 show a BGA 741, as in FIG. 46, but again with treated columns 743. Again, the BGAs are not fully populated with columns, simply for clarity of illustration.

Figure 55:
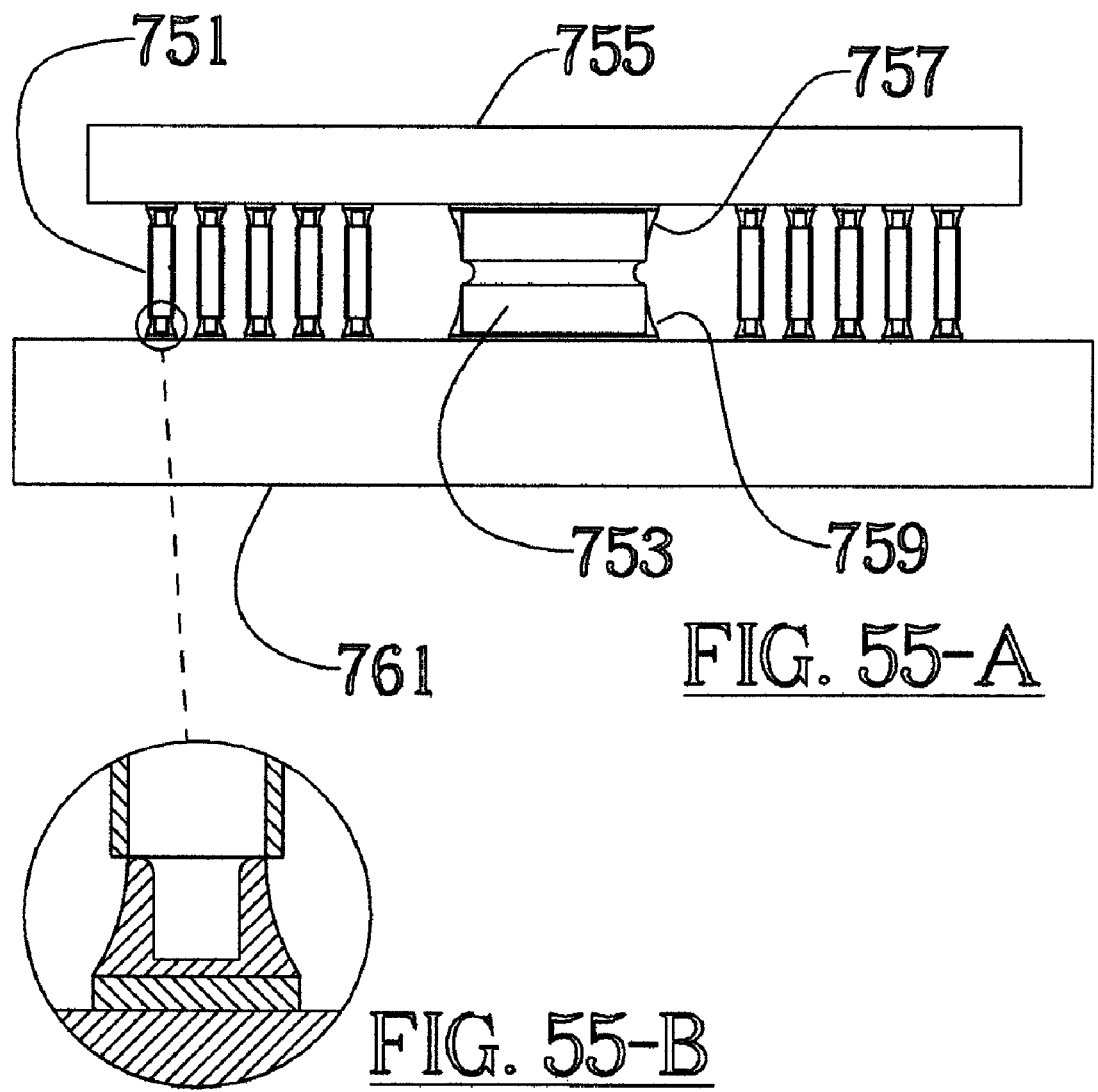
Figure 56:
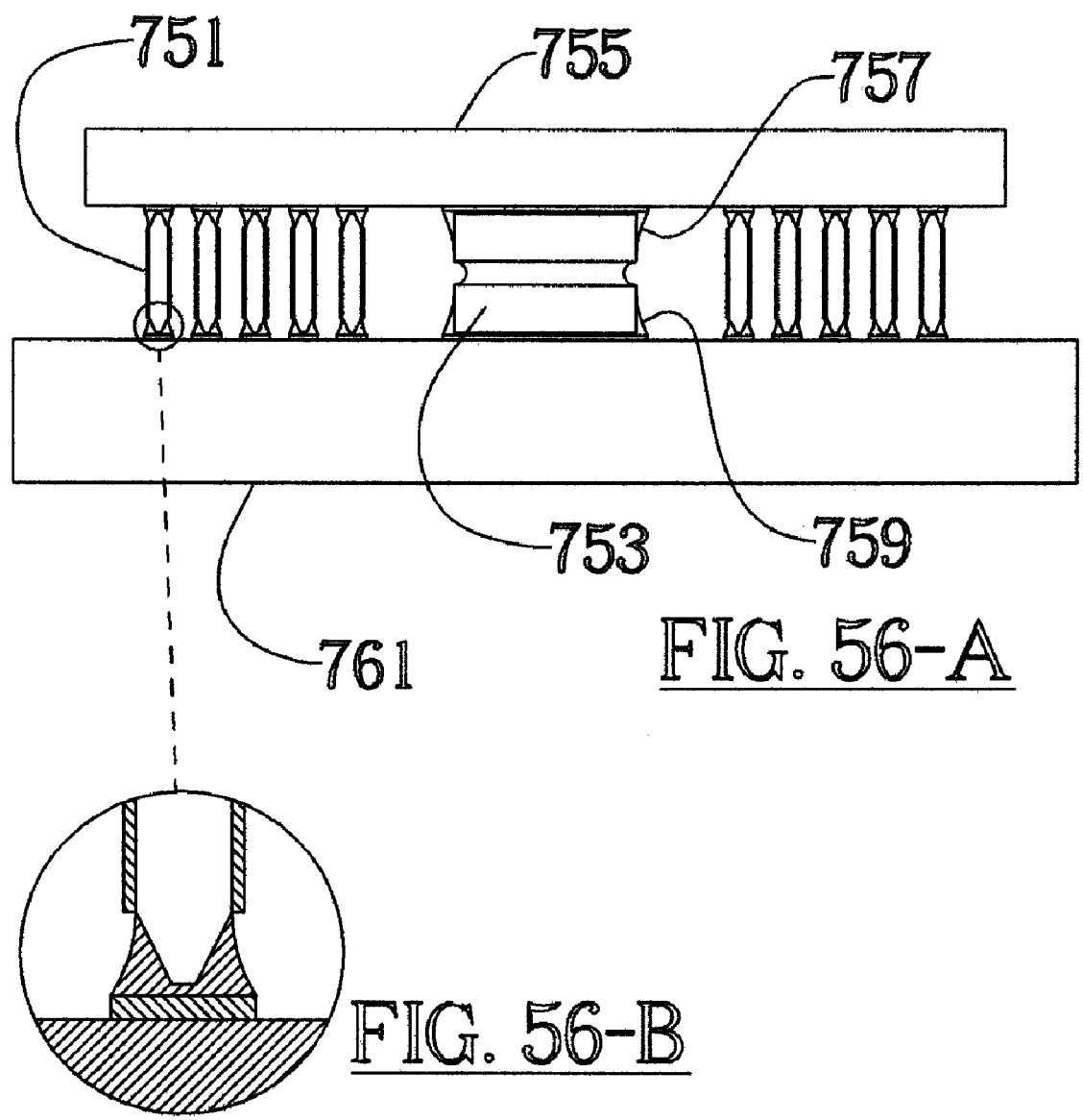

FIGS. 55 and 56 show similar arrangements as in FIGS. 47 and 48, but with two differences. First, the columns 751 are treated columns, i.e. without the solder control dams. The second difference is the appearance of the "anchor" 753.

If the system is expected to encounter excessive shock and vibration during its lifetime, then it would be a good idea to introduce such an anchor in the system. It can be placed near the center of the package 755 and can be soldered in place in one of several different ways. It can be soldered or brazed 757 to the package first, and then the other end 759 would be soldered to the substrate 761 at the same time when the columns get attached to the substrate as well. Or, the anchor can be soldered at the same time when the whole system is reflowed together. Or the anchor can be attached to the substrate first. And it does not need to be soldered. It can be glued on using an appropriate adhesive. The important thing is that the anchor should have a small cross-section or diameter, small enough that the temperature cycling would not affect the joints between the anchor 753 and the package 755 or the substrate 761. It is expected that if the anchor diameter is up to approx. 1/8", it will stay in place with no problem. Even an anchor as large as 1/4" may still be OK.

An anchor, like the one described here, was used with the Cherian Solder Columns, mentioned earlier in the "Group Specific Background Information" (U.S. Pat. Nos. 4,664,309, "CHIP MOUNTING DEVICE"; 4,705,205, "CHIP CARRIER MOUNTING DEVICE" and 4,712,721, "SOLDER DELIVERY SYSTEMS"). The anchor was used in an experiment for cooling purposes. However, the anchor was not combined with any columns that have solder control features as those described in the present invention. The original purpose of using the anchor was to provide heat conduction between the package and the substrate, but was not intended as reinforcement against shock and vibrations, but it can sure double up and would do both functions at the same time.

Another additional feature would be to provide side supports or restraints at the corners or along the sides of the package, for two reasons. They can further help in fighting excessive shock and vibrations, especially if these shocks and vibrations are directed perpendicular to the columns; and also, they could support any cooling devices that may be added to the system.

FIG. 57 shows a "carrying wafer" 771. This is not a silicon wafer. Here the wafer is made of a material that can be removed, or dissolved later, after the wafer has done its intended job. The function of this carrying wafer is to hold and carry the columns 773, so all the columns can be handled as one entity. The first end of all columns can be joined to their corresponding contact pads of the package or the chip, all at one time, instead of being joined to their respective contact pads one at a time. It can also be noticed that the wafer has holes 775 at its four corners 777. These can be used to "register" the carrying wafer together with the package or the chip, and the substrate during reflow.

Such a carrying wafer was used and is still being used with the Cherian Solder Columns mentioned earlier. But again, those old carrying wafers were not combined with the solder controlled columns covered by this present invention.

FIG. 58 shows various ways of implementing the invention. In the figure A, in FIG. 58-A, we can attach one column 781 at a time, both to the package 783 and to the substrate 785. It is rather impractical, but possible. In the figure in FIG. 58-B, we use a carrying wafer 791 with the whole set of columns 793 as needed, then register it to the substrate 795 and to the package 797 and then reflow the whole stack together in one shot. In the figure D, in FIG. 58-D and E, we use a fixture 811 to attach the columns 813 to the package 817, to create what is usually called a dead roach 817 or simply a roach. Then in a subsequent operation, we attach the roach 817 to the substrate 819 in FIG. 58-E. In such a procedure, it is advisable to use two kinds of solder. The solder used in the first step, the "roaching" step, should have a higher melting point than the solder that will be used for the second operation. In figure C, we "wire-bond" 801 the columns 803 to the package 805, or to the chip, again to create a roach, and then mount the roach to the substrate 807.

FIG. 59 shows some details of the method mentioned above in the figure B of FIG. 58-B. A similar method would also be used for the methods in FIGS. 58-C and E as well.

FIG. 60 shows a method to roach chips or packages. The fixture 831 can be used with individual columns 841 as shown, or a comparable way of fixturing can be used if a carrying wafer is used to carry all the columns at once.

FIG. 61 shows the wire bonding method mentioned in the figure of FIG. 58-C and adds a few more details. The top figure, FIG. 61-A, here illustrates a wafer 851, a silicon wafer. The second figure, FIG. 61-B, shows the wires 861 bonded 863 to the proper pads 865 on the silicon wafer 851. The wires are kept straight and cut to the proper length. Prior art by Carlomagno and FormFactor teaches how to accomplish that. If the cut length is not uniform enough, then we can go to the two subsequent figures, FIGS. 61-C and 61-D, where we use a "trimming template" 871 or "trimming fixture" to cut the tops 873 of the wires so they will be coplanar. The last figure at the bottom of FIG. 61, i.e. FIG. 61-E, shows the last step in preparation of coating the wires, as will be explained shortly.

FIG. 62 shows details of a chip or die or package 891, mounted on a substrate or board 893, using the wire bonding approach. First, we see the column 895 at the left of the figure, wire bonded 897 to the chip. We see a layer of solder resist 901 covering the whole length of the column, i.e. its stem and top, except for the lower tip 903, the lower end. Then the two columns 905, 907 to the right of the first one, show another layer of material 909 over the solder resist. This material A 909 can be an optional metallization or any conductive "goop", which would act as a "ground" or barrier to electrical noise, and to balance or negate the "induction" effect of the long leads. We also see an anchor 911, similar to the ones shown in previous figures. The anchor could also be replaced by some adhesive or any equivalent components, as need be.

Then if we look at the substrate 893, we see a few more features. We see that the substrate has a layer of solder resist 913 covering it, except for the areas of the contact pads 915, creating "solder wells" 917. Then we can screen solder paste 919 in the solder wells. Depending on the preference of the operations, the "roach" could be inserted in the solder wells while the paste is still wet and then the stack dried together, or the solder could be dried first and then the roach placed on top later. The stack would then be solder reflowed.

A same procedure would be used if the columns were soldered to the package, instead of being wire bonded. In such a case, it is advisable to use a high temperature solder at the first joints at the package, as explained earlier, so as to follow the traditional "fire-down" process.

If an adhesive is used, as shown at the right side of the figure, then it would be desirable to use an adhesive that would "shrink" during the reflow (heat shrink), so that it would "pull" the die or the package closer to the substrate during the reflow process, so that it would ensure good contact at the solder joints.

Let me elaborate on the layer of solder resist around the contact pad. This would prevent the solder from migrating to adjacent pads. This would be desirable, especially if the center distances between the pads are small. In general, it is known that solder has a tendency to jump and bridge between traces, if the gap between the traces is approx. 0.007" to 0.008" or less. So, if the distance between the contact pads is small and comparable to such a gap between the traces, then we could expect that the solder would jump and bridge. In such cases, it would be preferred to apply the solder resist around the solder pads to fight this tendency of the solder to jump and bridge. An additional precaution would be to provide recesses in the substrate, such that the solder pads would be at or near the bottom of those recesses. This would increase the effective distance between the pads and make it more difficult for the solder to jump. See FIG. 69 below.

FIG. 63 shows more details of the same. The only important additional feature shown here is the grounding joint 921 shown with the column all the way to the right. The conductive coating 923 at this column would be made to reach the exposed end 925 of the column. When this column is reflowed, the conductive layer would make electrical contact and be connected to "ground" or to any desired circuit point.

Figure 64:
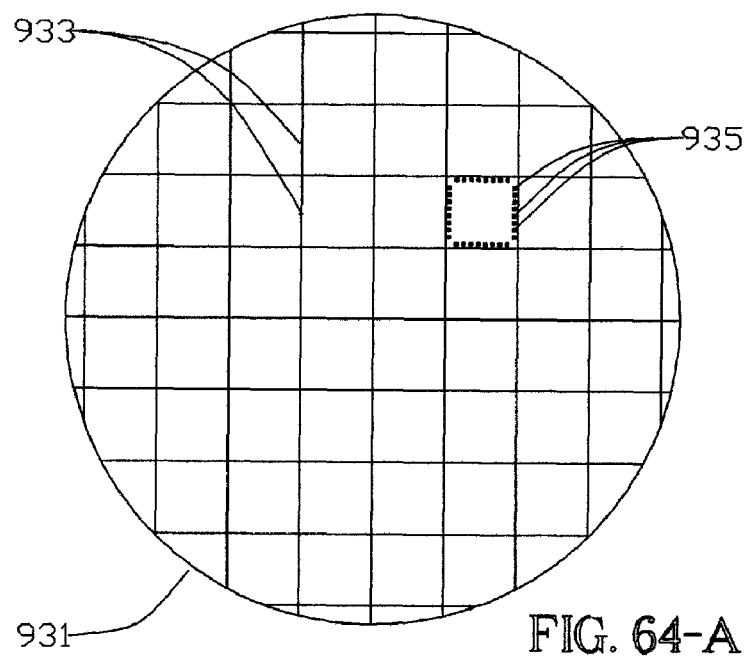
Figure 64:
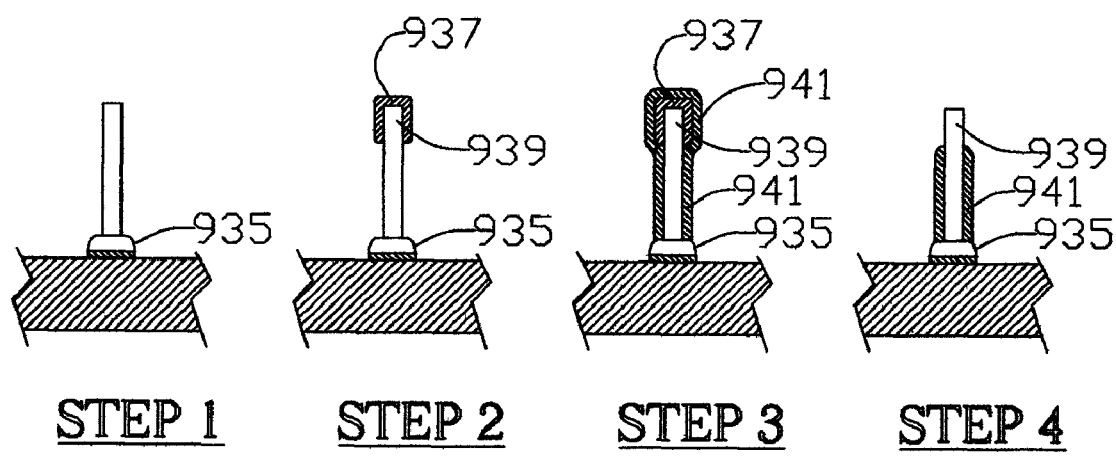

FIG. 64 shows almost a repeat of some of the previous explanations, but with a new twist. It shows one way to coat the columns, but keeping the ends uncoated. Step 1, FIG. 64-B, is to wire bond 935 the columns, as before. Step 2, FIG. 64-C, is to apply some material 937 to the tips 939. Let's call it the "sticky material" 937 for ease of reference. Step 3, FIG. 64-D, is to coat the whole thing with the solder resist 941. This would coat the sticky material as well of course. Step 4, FIG. 64-E, is to remove the sticky material 937 from the columns tips 939. By doing that, we would also remove the (solder resist) 941 coating from the columns tips, exposing the column base material, which in this case is supposed to be "solderable". Step 5 is to dice the wafer and separate the chips. Step 6 is to solder the chips to their substrates.

Figure 65:
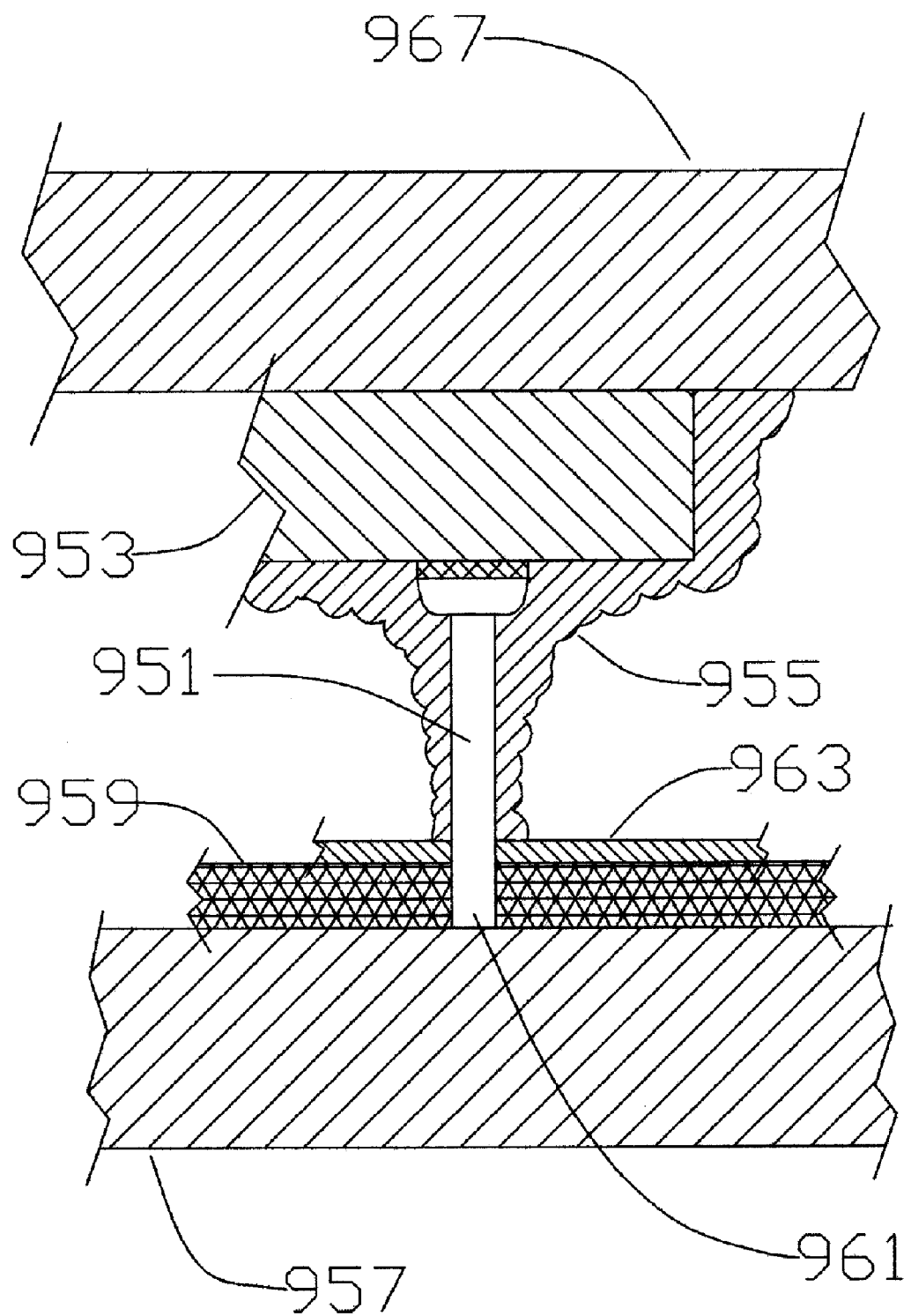

FIGS. 65 through 68 show another way to keep the columns tips uncoated. FIG. 65 shows the column 951 attached to the chip 953. The chip is placed against a solid surface 957, shown at the bottom of the figure. Let's call this the "bottom support" 957. The bottom support has a layer of foam material 959 that has the proper consistency to be penetrated by the tips 961 of the columns. On top of the foam, we could optionally put a layer of "release paper" 963 or the like. On top of the chip, we put another solid surface 967, which we would call the "top support" 967. The top support will exert just enough force, so that the tips 961 of the columns would penetrate through the release paper 963 and the foam 959 and rest gently on the bottom support 957. The foam layer 959 would cover the tips 961 of the columns for a certain distance, just as desired to accomplish the end goal.

Figure 66:
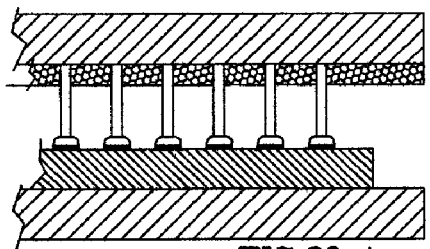
Figure 66:
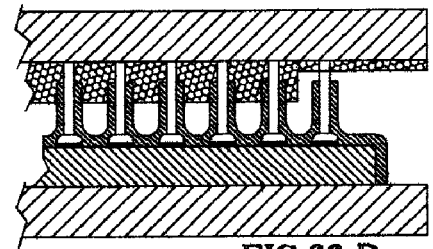
Figure 66:
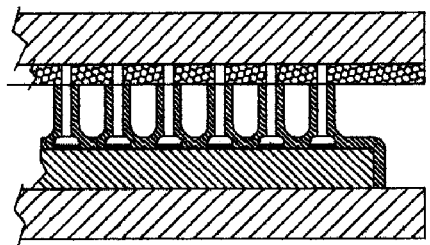
Figure 66:
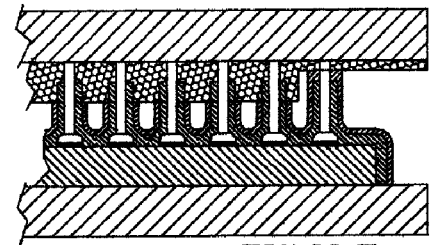
Figure 66:
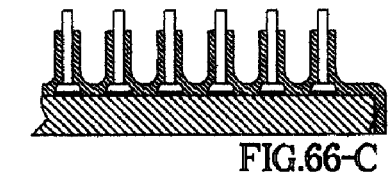
Figure 66:
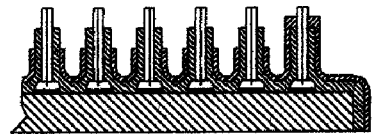
Figure 66:
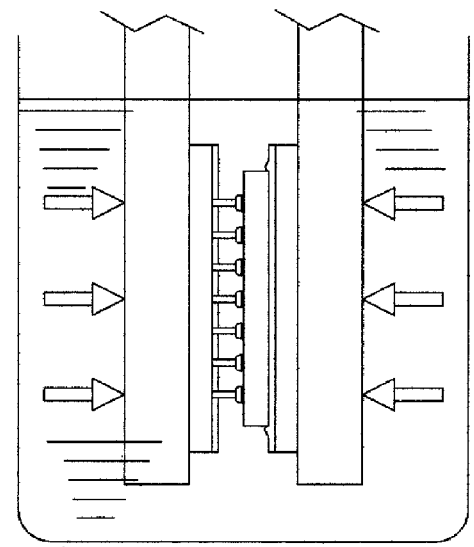
Figure 67:
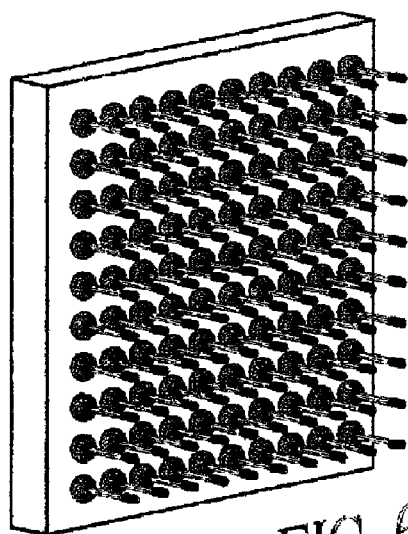
Figure 67:
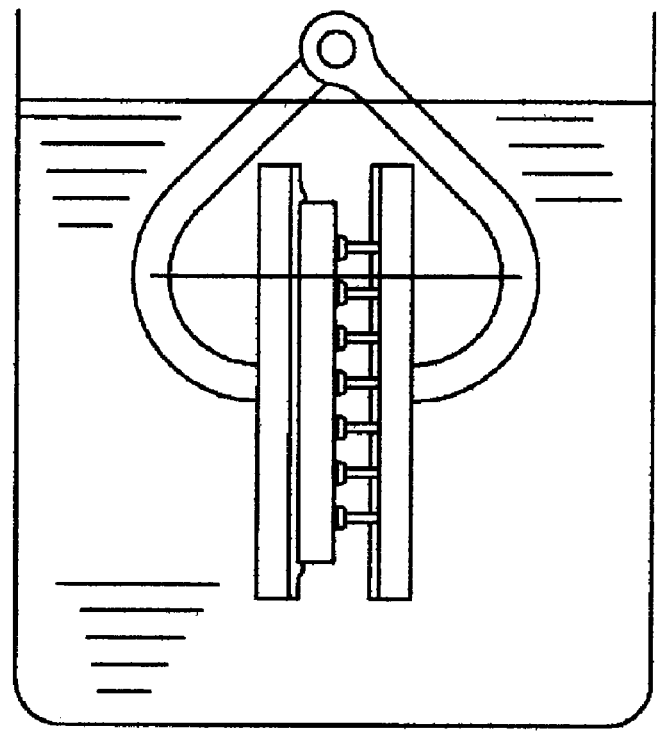
Figure 68:
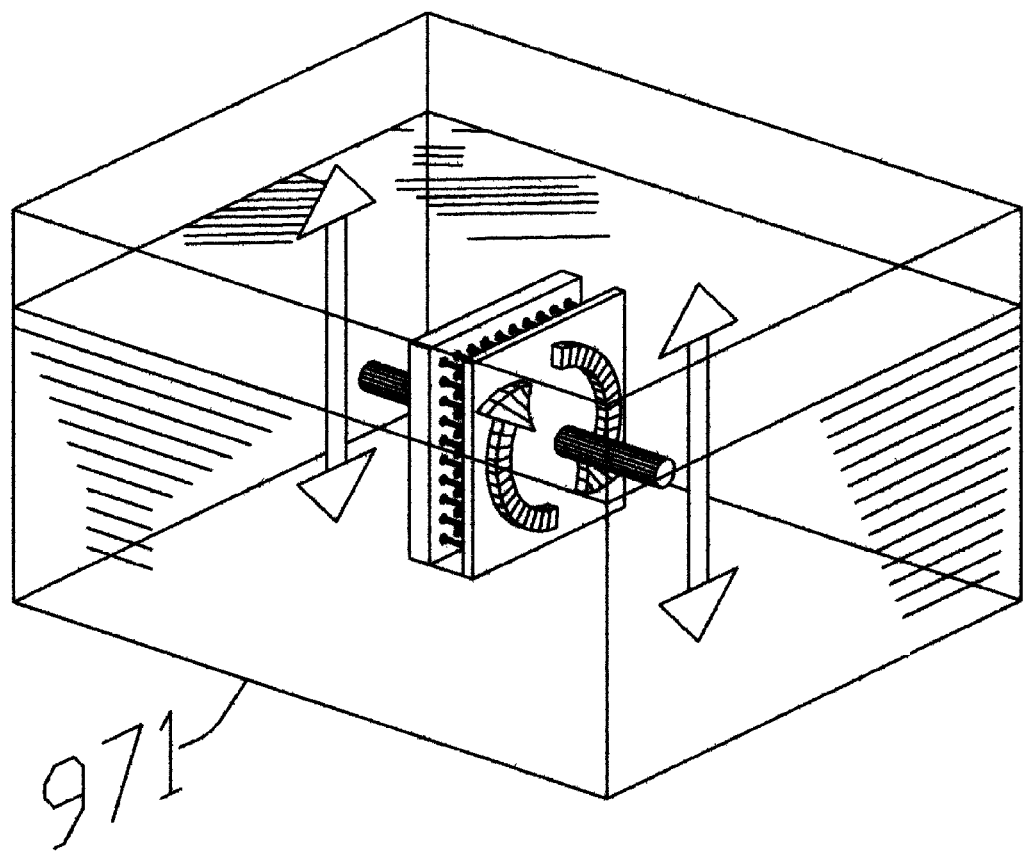

We then place this whole stack in a bath 971, like the one shown in FIGS. 66, 67 and 68. We could rotate the stack to ensure that the coating reaches all the columns and spaces in between. After the process is complete, we can release the two supports to end up with the columns all coated except for their tips, which were covered by the foam (and the release sheet).

This procedure can be done with liquid solder resist, with conductive coatings, or even with "powder coating" assuming that all these coating materials will end up being flexible enough to keep the columns as flexible as needed.

FIG. 69 shows the recesses 981,983 in the substrates. FIG. 69-A shows relatively shallow recesses 981, while FIG. 69-B shows deeper recesses 983. The deeper recesses would be more desirable, because they can make the total height of the stack smaller, or because the column height can be larger to provide more flexibility.

FIG. 70 shows a conceptual machine 1001 that could use discrete wires 1003 and place them on the chips or the packages 1015 for wire bonding. In other words, if we have individual wires 1003, with precut length, then such a machine would do the feeding 1021, 1007 and bonding 1009 of such individual discrete wires. Such a machine would be helpful, if we use the "composite wires" 1003, 1033 that are proposed later in this specification. Composite wires would have one material at the two tips, and a different material in between, i.e. the stem would be made of a material that is different than the material of the two ends. This can be obtained by using the capabilities of "TMI" or "Material Technology, Inc" Company, which specializes in such materials. See Ref3, pages MC-AD-43 through 69, especially 43-46 and 53-54. See also my specification sheets in Ref3, pages MC-S-21 through 23.

FIG. 71 shows a setup like the ones shown in FIGS. 47, 48, 55, 56, 62, 63, 65 and 69, except for one important aspect. It is in essence a typical setup of mounting a chip on a substrate or a package on a board, or any electronic component onto another electronic component. The new aspect here is the "parallel nesting" of the columns. The columns 1051, 1053, and 1055 are not straight as shown in all the previous figures, but they are curvilinear and they are parallel nested.

Ref4, the Non-provisional patent application Ser. No. 09/947,240, filed Sep. 5, 2001, entitled Interconnection Devices covered the subject of parallel nesting and its benefits. It covered also the requirements that need to be present for connecting elements to be capable of parallel nesting.

Ref3 included a section on Test Sockets, which was one of the bases for Ref4. That section on Test Sockets in Ref3 included a sketch, in page TS-D-115, which showed the figure shown in FIG. 71.

The columns 1051 can also be coated 1053, with solder control features and conductive layers, etc., as indicated by the column 1053 and 1055 at the right end of the figure. The big difference here is that the columns are "parallel nested" and do comply with all the requirements of parallel nesting as described in Ref4. Patent claims were written in Ref4 to protect this "parallel nesting" feature. I presume that such a claim will cover this method of mounting components on components as shown in FIG. 71.

Additional Details

There are many ways to accomplish the goals of the present invention. I have tried to collect and to summarize many of them in the following SUMMARY TABLE.

I have also tried to show/illustrate the important methods in the above drawings or sketches.

Summary Table of Factors, Options, Choices, Combinations & Permutations

The following list summarizes various possible methods to be used to accomplish the goals. Most of these either have been explained while describing the drawings, or will be expanded on in the following text.

A. Column Attachment to Chip or Package:
  1. Joint Material or Process:
    Soldered
    Brazed
    Bonded
    Grown
    Adhesive
  2. Methods of Joining:
    a. Roaching:
      Column by column, e.g. Bonding
      Multiple Columns with Fixture
      Multiple Columns with Removable Wafer
    b. Simultaneous:
      With Wafer, Dissolvable
      Simultaneous
      Both ends.
B. Limiting Vertical Solder Migration:
  1. Geometry:
    Tip collar
    Tip shape
  2. Materials, Wettability, Solderability
    Additive
    Subtractive
    Combination, e.g. "TMI"
  3. Amount of Solder at Joint.

C. Limiting Horizontal Solder Migration:
    Solder pad shape, size, material
    Bonding and material
    Solder mask on top
    Solder wells/holes/recesses
    Amount of solder at the joint
D. Column to PCB of to Substrate:
    Solder at lower temp than 1st joint
    Solder, simultaneous with other joint, with dissolvable wafer In the following pages, I will give some additional details as to how to accomplish the goals of the invention.

Basis of Concepts

Material Wettability/Solderability

Solder has a high surface tension and likes to creep along the surfaces of materials that are wettable to solder, like copper and copper alloys.

Solder also likes to "BALL-UP", if left on its own.

The result is that if we make the column out of copper or copper alloy, and if the amount of solder at the joint is more than the bare minimum, then the solder joint will be "TALL", i.e. the solder will wick up along the height of the column (stem), making the column STIFFER than without this additional solder layer.

So, we want to control how far the solder will wick up along the stem of the column.

We propose to do this, by any one of the following options, or by a "combination" of any one or more of these options. (See also the Summary Table above).

We can control the solder flow, by one of the following methods: Additive or enabling method, or subtractive or preventive method. I will elaborate on each method here.

Additive Method/Enabling

Goal/Summary

The base material of the column is essentially NON-SOLDERABLE/DIFFICULT TO SOLDER; and we process it to render only the column tip(s) SOLDERABLE. >>[See sketch # MC-D-24]

We start with the column material that is not solderable, i.e. not wettable to solder. For example, we make the column out of Tungsten, Aluminum or the like.

We plate the tip of the Tungsten pin with Nickel, and then we may overplate it with Solder. We do the Solder-Plating soon after the Nickel plating, so that the Nickel would not have a chance to oxidize.

Now the tip of the column is solderable.

We could use other material for this kind of "Additive" process, such as Stainless Steel, regular steel, etc.

We can utilize various manufacturing methods to accomplish this goal. For example, we could use deposition methods, or use Plasma Technology to aid in the processes, etc.

This will prevent the solder from wicking along the column beyond the plated tip.

The other end of the column can be treated similarly, or it can be brazed or "bonded" to the package or the chip, etc.

Subtractive Method/Preventive

Goal/Summary

The base material of the column is essentially SOLDERABLE/Easy to wet and to solder to; and we process it to render only the column tip(s) solderable, while the rest of the column stem will become NON-SOLDERABLE.

Hence, we prevent the column stem from being solderable.

We start with the column material that is solderable, easy to wet to solder.

We use any one or more of the following methods, to attain the goal, which is to PREVENT the column stem from getting solder on it.

Preventive Methods
  Oxidize the Pin (Column) Stem
  Apply Solder Resist to Stem
  Apply Lacquer to Stem, e.g. a la Magnet Wire.
  Apply Heat Shrink Tubing to Stem
  Apply Powder Coating to Stem
  Apply Teflon Coating on Bonding Wire
  Use Plasma, with Oxygen preferably, to oxidize the pin material/stem
  Coat the whole pin with a proper material, and then use Plasma to "remove" that material form the tips only. The material could be any kind of plastic or epoxy or the like. Preferably, a "mask" would be used, so that only the pin tips would be exposed to the Plasma.
  Photosensitive materials, regardless whether they are "positive" or "negative" materials. This includes also the "solder resist" materials. Dip the pins in the photosensitive Solder Resist, drip, dry. Cover one portion of the pins, expose and develop, depending on whether it is positive or negative. For example, with one material from a company called "ENKON", we would cover the whole pins with the material, put a mask on the pins, which would only leave the tips exposed, expose the tips to UV light and then immerse in a Sodium Carbonate Solution to remove the material from the tips.

Sequences for Preventive Methods

A—Before Joining to Chips or to Packages

1. Wire Bonding
  A) Use wire that has a coating on it, like they use wire that has a "jacket" of Teflon on it, like a coating or sleeve! When they create the ball with the flame, the flame burns the coating away and then the ball is formed. The rest of the wire stays coated. This remaining coating would act as a "solder resist".
  B) Use wire that has been oxidized on the outside surface. Same results as in A) above.
  In any of the above or similar methods, the free tip of the wire/pin may be soldered, as is, in which case the solder would attach to the bare metal in the cross-section of the wire at the "cut", i.e. the tip by the free end of the wire. If such a solder joint is deemed strong enough and acceptable, then that is OK. If on the other hand, it is felt necessary to have a certain length of the wire "stripped" and "exposed", in order to get a better solder joint, then we will have to strip the wire, for that required distance. This can be done by any one of he many methods suggested elsewhere in these Specifications.

2. Brazing
  A) The same approaches can be followed, if we decide to "BRAZE" the pins to the packages.
  B) The packages would look like many of the existing "PGAP" packages. The brazing operation and temperature could "burn-off" the coating or oxides, at this joint.

3. Soldering
  A) With soldering, we will in most cases, need to remove the preventive coating from the wire tip close to the package, in order to get a proper solder joint.
  B) Again, we could solder one pin at a time, or we could "gang-solder" all the pins at the same time.

4. Resistance Soldering/Welding
  A Company (Microjoin, Inc., A Palomar Technologies Company, 13535 Danielson Street, Poway, Calif. 92064; www.microjoin.com; Tel 858-877-2100; FAX 858-877-2120; E-Mail: sales microjoin.com) was exhibiting a machine at "APEX", Long Beach, on Tuesday, Mar. 14, 2000. This company can attach wires to solder pads, using "Resistance Welding/Soldering". They stated that they could do that for a wire standing up-right, perpendicular to the surface of the board or substrate, by using two electrodes, at some 90 degrees to each other, both touching the base of the wire and the solder pad simultaneously.
  I believe that such a method could work and that the heat/spark generated could burn-away the oxides or coatings on the wire at that joint, leaving the rest of the wire still oxidized or coated.

B—After Joining Pins to Chips or to Packages
  After the pin(s) is/are attached to the chip or to the package, do any of the following:

1. Cover Tip with Removable Coat, and then coat the rest of the pins.
  The Package or Chip will look like a "Dead Roach" or a "Brush", say a "wire brush".
  Smear a waxy material on top of a flat surface plate, "DOCTOR" it to obtain a uniform thickness, say about 0.020" to 0.030" thick.
  Hold the "wire brush" on top of the surface plate, such that the free tips of the columns (bristles) may touch the waxy material.
  Tap the wire brush into the waxy material, so that it sticks to the tips of the columns. It will cover the tips of the columns only for the desired height. (approx. 0.020" to 0.030").
  Keep the wire brush in this vertical position, so that if the waxy material wants to drip, it would drip down, away from the pins, not along the stems of the pins.
  Let it dry.
  Then you can coat the rest of the pins with any solder masking material, or you can "oxidize" the stems.
  When this coat is dry, or the oxidation operation is completed, you can heat the whole thing. The waxy material would melt, leaving the pin tips with exposed uncoated bare metal, which would be solderable.
  Note: This is just an example. Other processes could be used and other materials could be used to accomplish the end results. For example, it is conceivable that some material like the finger nail polish can be used instead of the wax, and the finger nail polish remover can be used to remove it, to expose the tips.

2. Cover the tips with a temporary mask, e.g. Foam Tape. (See Figures)
  Apply a layer of FOAM Adhesive Tape to a rigid backing, like a flat piece of sheet metal or plywood or cardboard.
  The foam should be "close cell", so that no liquids would flow through it.
  The foam should be the proper thickness, in this case, approx. 0.020" to 0.030" thick.
  Stick the free ends of the pins of the "wire brush" into the foam tape until the tips reach the solid backing behind the tape.
  Clamp the chip or package against the tape and its backing.
  Preferably the clamp would also have a similar foam layer, to prevent the chip body or the package body from being coated.
  Dip the whole thing into the coating material. This can be a liquid solder mask or the like. See the list of possible coating materials that can be used, under "Preventive Methods".
  Remove, drip, dry and release from the clamping contraption. (See Figures).
  You're done.
  NOTE: In some cases, like with powder coating, you need to apply an electrostatic charge to improve all-around adhesion, and also you need to "cure" the powder coating. Also, the powder coating material should cure "soft", i.e. flexible.

3. Preventive Coatings of Pin Stems.
  Once the pin tips are covered, by any of the above methods, the pin stems can be covered or treated by any of the following methods.

A) Dip in a liquid solder mask, as mentioned above, or with "lacquer" like that used on magnet wires.

B) Apply conformal coating and dry, or use Teflon or the like.

C) Apply powder coating and bake & cure.

D) Use Vapor Deposition, to either apply a non-solderable coat or to oxidize stems and render them non-solderable.

E) Fill space including stems with a foam material or the like, to prevent solder from getting there. This can also be a kind of encapsulant. However, it better stay "flexible".

F) Use "Plasma" with oxygen, to "passivate/oxidize" the stems.

Another totally novel method is to make the columns out of a combination of materials, such that we end up with what we want.

Micro-Columns Made of Combination Materials

Combination materials like those made by TMI—"Technical Materials, Inc.", a Brush Wellman Company, 5 Wellington Road, Lincoln, R.I. 02865.

In their brochure "A Guide to TMI Clad Metals", they show their "Combination Materials", as such: >>[See sketch in Ref3, page MC-D-21]

They have indicated that they can weld copper, which is easily solderable, to other materials that are difficult to solder or not solderable at all. Examples of these are Stainless Steel or Tungsten, etc.

I propose to do the following: >>[See sketch in Ref3, pages MC-D-21 & 22]

TMI Combination Material could be made to have one end solderable, such as copper, which can be "soldered" to the board (PCB/PWB), while the other end made of a different material.

For example, it could be made of Aluminum, so that it can be "wire bonded" to the chip (instead of the BGA), or it can be of any other material that is easy to "BRAZE" to the BGA or any other package.

Or

The TMI can be made of only 2 materials. The solderable tip could be made of copper, and the rest of the column could be made of a different material that does not solder, but that can be wirebonded or brazed. For example copper and aluminum.

Another way to accomplish the same goal, is to do what FormFactor have done, but with some changes. The columns can be grown on the chips or wafer, but they should be arranged so that they can be parallel nested according to the teachings of Ref4, and so that they can be handled easily. Also, the solder resist can also be grown around the columns, as needed. One more improvement, the columns can be grown to be rectangular cross-section, while at the same time, they can be grown in an "oriented" fashion, according to the teachings of the present invention.

Joining of Pins/Columns to Chips

If chip pads are made for Bonding only, then use ball bond (ideally) or wedge bond or any other bonding method.

If chip pads are prepared for soldering, then solder the pins to chip. Ideally use a solder material that has a melting temperature higher than eutectic solder. For example, use 90/10 solder, or solder alloys containing gold, silver, etc.

Use any other joining method available and appropriate/possible.

Notes

In any of the above methods, you can use either a "continuous" pin stock material, i.e. wire or the like and then cut/trim it to some desired length, or You can use "discrete" length of pin stock material, be it one metal of a "composite" as the one from TMI, and place and join on the proper pad/location.

With the discrete pins, we can also have a longer "TAIL" of Copper, which can be used to make handling the discrete pins easier. Then, after the joining, the excess amount of the tail can be trimmed-off, to leave just the proper length of solderable tip.

See sketches in pages MC-S-32 & 33 and see FIG. 71.

Gang-Joining of Pins/Columns

See sketches in pages MC-S-34 and FIGS. 58 through 60.

1. With Fixtures

A fixture, as shown, can be used to gang-solder the pins to the package or to the chip. After reflow, the "Roached" package or chip would be removed and processed further.

A fixture can be used for one package/chip at a time, or

The fixture can be made to accommodate a plurality of packages or chips in one shot.

With a Carrying Wafer

See sketches in pages MC-S-34 and FIG. 57.

Gang Joining can be also accomplished with the use of a "WAFER". I will define the Carrying Wafer, as being a device, that holds the individual pins/columns in a way, so that each pin would match its corresponding pads on both the substrate or PCB/Printed Circuit Board at one end of the pins, and on the chip or package on the other end.

The carrying wafer can be made of a material that would be dissolved or easily removed after the reflow operation. Such materials have been patented and are already public knowledge. See for example U.S. Pat. No. 4,655,382, Wong et al, "DISSOLVABLE . . . HOLDER", which covers a carrying wafer, but which has problems with TCE Mismatch.

A New Wafer

However, I propose a new wafer material, in addition to those that are already in the prior art domain.

My wafer material will have, in addition to the "standard" elements, a set of "threads" which are embedded in the wafer material.

The purpose of the threads would be to impart to the wafer a "Controlled TCE". Controlled Thermal Coefficient of Expansion.

You see, with the Wong wafer material, the wafer has a larger TCE that the ceramic packages. I believe its TCE is even larger than that of FR4 boards. During the reflow process, the wafer expands more than the package, and consequently the solder and the pins follow the wafer. The solder and the pins attach to the substrate at the expanded position. When the total assembly cools down and the solder starts to freeze, the wafer shrinks more and the end result is some distortion in the shape and position of the solder and the pins.

In order to minimize this undesirable effect, we need to find a material for the wafer, which either has an inherent TCE that matches the TCE of the package or the chip; or We need to "doctor" the "Effective/Apparent" TCE of the wafer, so that it does closely match that TCE of the package or chip.

One way to achieve this goal is to "implant" in the wafer something to force it to behave as if is has the desirable TCE.

What I propose to achieve that is basically to create a "composite" wafer material, made of a) the materials mentioned in the prior art, and b) some fibers, that would be criss-crossed inside the a-materials; so that the effective TCE of the resulting material would have a new TCE, which has a value close to the desired one.

Such fibers could be made of fiberglass, or any other materials that have a small TCE or even a negative TCE.

Furthermore, it may be desirable to place these fibers, in the form of "threads", as opposed to loose, bulk fibers.

A further improvement would be to place these threads in a criss-crossing pattern, pretty close to the way threads are woven together to make a cloth", with the thread interwoven over and under the intersecting threads. I believe they call this the Warp and the ??? See Pattern A, in fig. in Ref3, page MC-S-37.

A yet further improvement would be to lay the threads as shown in the fig B in Ref3, page MC-S-37, whereby all the treads going in one direction would lay in one level, while the threads perpendicular to the first group would be laying in another layer, not over and under, i.e. non-woven, but simply oriented and laying in one plane separate from the other plane. See pattern B.

The purpose of the Non-Woven, but Oriented thread arrangement, Pattern B, is to be able to easily pull the threads out, after the reflow operation. We would soak the assembly in an appropriate liquid to loosen up the thread, and then pull these threads out.

If the threads are woven as in Pattern A, it would be more difficult to pull them out, even after soaking them and loosening them.

I claim:

1. A method for
preparing a first device, say a Ball Grid Array (BGA) package or a chip, having a generally flat surface, and having at least a first and a second contact pads arranged along said flat surface, said contact pads of said first device being referred to as the BGA contact pads, to be subsequently attached to a second device, say a Printed Circuit Board (PCB) or a substrate, having a generally flat surface, and having at least a first and a second contact pads arranged along said flat surface, said contact pads of said second device being referred to as the PCB contact pads, said method comprising:
   a) providing at least a first and a second connecting elements, each one of said first and second connecting elements having a tall slender columnar shape body, having a first end portion and a second end portion, with the portion of the body between said two ends being referred to as the stem, said first end of each one of said connecting elements being referred to as the BGA end, and said second end of each one of said connecting elements being referred to as the PCB end, and
   b) joining the BGA end of the first connecting element to a first BGA contact pad on said first device, and joining the BGA end of the second connecting element to the BGA second contact pad of said first device,
resulting in a device with columnar leads, referred to as a dead roach or simply a roach,
wherein
said connecting elements comprise migration prevention means to prevent any joining materials, which may be present during step (b), which could be liquid or molten, from migrating away from the joints at said BGA ends of said connecting elements towards the center of said connecting elements along the stem of said connecting elements, and/or from attaching themselves to said stems.

2. A method as in claim 1, wherein said migration prevention means are provided near both ends of each one of said connecting elements, so that when said roach is joined, in a subsequent joining process, to a second device, having corresponding contact pads, then said migration prevention means will prevent any materials, which may be present during said subsequent joining process, which could be liquid or molten, from migrating away from the joints at said PCB ends of said connecting elements towards the center of said connecting elements along the stem of said connecting elements, and/or from attaching themselves to said stems.

3. A method as in claim 1, wherein said connecting elements are curvilinear and have a generally arcuate shape and are amenable to be parallel nested.

4. A method as in claim 1, wherein step (b) is accomplished by wire-bonding.

5. A method as in claim 1, wherein said migration prevention means is brought about by creating a dam, obstructing the flow of said joining materials, from the end of said connecting element toward the center of said connecting element, wherein said dam can simply be a bulge or a change in the dimension, e.g. the diameter, of said connecting element, so that said joining materials would not have the tendency to flow beyond said dam at the end of said connecting element.

6. A method as in claim 1, wherein said migration prevention means is brought about by controlling the characteristic nature of the connecting elements, from a certain point near the ends of said connecting elements, this characteristic being the affinity of said joining materials to adhere to the surface of the connecting elements, at least two control locations along the connecting elements, where the first control location, having high adherence affinity, has a certain length along the connecting element, from the tip or end of the connecting element, where said joining materials has high affinity to adhere to the connecting element, and the second control location has low adherence affinity, and is located beyond the first control location, towards the center or stem of the connecting element, where said joining materials will not have enough affinity to adhere.

7. A method as in claim 1, wherein controlling the adherence affinity of the joining materials is brought about by making the connecting element out of a material, such as copper when the joining material is solder, which provides a high natural adherence affinity to the joining materials, solder in this example, then by leaving the ends of the connecting element exposed to the joining materials only for a certain distance from the end or tip of the connecting element, thus creating the first control location, then by changing the characteristic nature of the rest of the connecting element to have low adherence affinity, thus creating the second control location, this change of characteristic being brought about by treating this second control location with a process that results in the desired change, such process comprising coating said second control location with a solder mask, or plating said second control location with a material with low adherence affinity to solder, such as nickel, or simply oxidizing said second control location, or the like.

8. A method as in claim 6, wherein controlling the adherence affinity of the joining materials is brought about by making the connecting element out of a material, which provides a low natural adherence affinity to the joining materials, such as tungsten when the joining material is again solder in this example, then by leaving the whole remaining length of the connecting element untreated, except for the ends, thus creating the second control location, and by having the ends of the connecting element plated with a material such as solder or gold, that has high natural adherence affinity with the joining materials, thus creating the first control location.

9. A method as in claim 4, wherein controlling the adherence affinity of the joining materials is brought about by making the connecting element out of a material, such as copper, which provides a high natural adherence affinity to the joining materials, such as solder, and having the first control location, at the end of the connecting element, bare, i.e. with the copper exposed to the joining material, solder in this case, and having the second control location treated to reduce its adherence affinity, say by oxidizing the material in this second control location or by covering it with a material, such as an appropriate plastic coating, which provides a low natural adherence affinity to the joining materials, again solder in this case.

10. A method as in claim 1, wherein a conductive layer is applied to the outside of the connecting elements, over a non-conductive layer, to simulate a coax cable effect, and wherein said conductive layer could eventually be grounded, if desired.

11. A method as in claim 1, wherein an anchor is provided to enhance the mechanical integrity of the ultimate assembly of said first device with said second device.

12. A method as in claim 1, wherein step (a) is carried out by having all said connecting elements grouped together and carried by an appropriate carrying fixture, to be handled as one entity, and then step (b) is carried out by joining the BGA ends of all said connecting elements to each respective BGA contact pads of said first device, all at one time, then the fixture would be taken away, leaving the connecting elements attached to the first device.

13. A method as in claim 1, wherein said devices are prepared so as to have a solder well around each of their contact pads.

14. A method as in claim 1, wherein said interconnection elements are made of discrete composite wires, having one material at the two tips, and a different material in between, wherein the tips material would have high affinity to adhere to the joining material, such as copper when used with solder, while the stem material would have low affinity to adhere to the joining material, such as stainless steel, tungsten, or aluminum.

15. A method as in claim 14, wherein one end of said discrete composite wires is made of a material that is easy to wire bond, such as aluminum, while the other end is made of a material that is easy to solder, such as copper, while the stem material is made of a material that has low affinity to adhere to the joining material, such as stainless steel, tungsten, or aluminum.

16. A method for attaching a first device, say a Ball Grid Array (BGA) package or a chip, having a generally flat surface and having at least a first and a second contact pads arranged along said flat surface of said first device, said contact pads of said first device being referred to as the BGA contact pads, to a second device, say a Printed Circuit Board (PCB) or a substrate, having a generally flat surface and having at least a first and a second contact pads arranged along said flat surface of said second device, said contact pads of said second device being referred to as the PCB contact pads, each one of said PCB contact pads on said second device matching a corresponding BGA contact pad on said first device, said method comprising:
 a) providing at least a first and a second connecting elements, each one of said connecting elements having a tall slender columnar shape body, having a first end portion and a second end portion, with the portion of the body between said two ends being referred to as the stem, said first end of each one of said connecting elements being referred to as the BGA end, and said second end of each one of said connecting elements being referred to as the PCB end,
 b) joining the BGA end of the first connecting element to a first BGA contact pad on said first device, and joining the BGA end of the second connecting element to the second BGA contact pad of said first device, and
 c) joining the PCB end of the first connecting element to a first PCB contact pad on said second device, and joining the PCB end of the second connecting element to the second PCB contact pad of said second device,
wherein
said connecting elements comprise migration prevention means to prevent any joining materials, which may be present during step (b) and step (c), which could be liquid or molten, from migrating away from the joints at said ends of said connecting elements towards the center of said connecting elements along the stem of said connecting elements, and/or from attaching themselves to said stems.

17. A method as in claim 16, wherein step (a) is accomplished by providing all said connecting elements as one group, carried together by a carrying means, referred to hereinafter as carrying wafer, to be handled as one entity, and then step (b) and step (c) are completed all at one time.

18. A method as in claim 17, wherein said carrying wafer comprises registration features, to ensure that the individual connecting elements align properly with their respective contact pads.

19. A method as in claim 17, wherein said carrying wafer is disposable.

20. A method as in claim 17, wherein said carrying wafer is dissolvable.

21. A method as in claim 17, wherein said carrying wafer is made such that it has a Thermal Coefficient of Expansion that matches as close as possible the Thermal Coefficients of Expansion of the two devices being attached.

22. A method as in claim 16, wherein said step (b) is completed at one time, and then step (c) is completed at a different time.

23. A method as in claim 22, wherein said step (c) is completed at a lower temperature than the temperature used during step (b).

24. A method as in claim 16, wherein both said step (b) as well as step (c) are completed simultaneously.

25. A method as in claim 16, wherein an anchor is provided to enhance the mechanical integrity of the ultimate assembly of said first device with said second device.

26. A method as in claim 16, wherein said migration prevention means is brought about by creating a dam, obstructing the flow of said joining materials, from the end of said connecting element toward the center of said connecting element, wherein said dam can simply be a bulge or a change in the dimension, e.g. the diameter, of said connecting element, so that said joining materials would not have the tendency to flow beyond said dam at the end of said connecting element.

27. A method as in claim 16, wherein said migration prevention means is brought about by controlling the characteristic nature of the connecting elements, from a certain point near the ends of said connecting elements, this characteristic being the affinity of said joining materials to adhere to the surface of the connecting elements, at least two control locations along the connecting elements, where the first control location, having high adherence affinity, has a certain length along the connecting element, from the tip or end of the connecting element, where said joining materials has high affinity to adhere to the connecting element, and the second control location has low adherence affinity, and is located beyond the first control location, towards the center or stem of the connecting element, where said joining materials will not have enough affinity to adhere.

28. A method as in claim 27, wherein controlling the adherence affinity of the joining materials is brought about by making the connecting element out of a material, which provides a high natural adherence affinity to the joining materials, such as copper when the joining material is solder, then by leaving the ends of the connecting element exposed to the joining materials only for a certain distance from the end or tip of the connecting element, thus creating the first control location, then by changing the characteristic nature of the rest of the connecting element to have low adherence affinity, thus creating the second control location, this change of characteristic being brought about by treating this second control location with a process that results in the desired change, such process comprising coating said second control location with a solder mask, or plating said second control location with a material with low adherence affinity to solder, such as nickel, or simply oxidizing said second control location, or the like.

29. A method as in claim 27, wherein controlling the adherence affinity of the joining materials is brought about by making the connecting element out of a material, which provides a low natural adherence affinity to the joining materials, such as tungsten when the joining material is solder in this example, then by leaving the whole remaining length of the connecting element untreated, except for the ends, thus creating the second control location, and by having the ends of the connecting element treated to have high affinity with the joining materials, such as by plating these ends with a material such as solder or gold, that has high natural adherence affinity with the joining materials, thus creating the first control location.

30. A method as in claim 16, wherein said connecting elements are curvilinear and have a generally arcuate shape and are amenable to be parallel nested.

31. A method as in claim 16, wherein said devices are prepared so as to have a solder well around their contact pads.

32. A method as in claim 16, wherein said interconnection elements are made of discrete composite wires, having one material at the two tips, and a different material in between, wherein the tips material would have high affinity to adhere to the joining material, such as copper when used with solder, while the stem material would have low affinity to adhere to the joining material, such as stainless steel, tungsten, or aluminum.

33. A method for preparing a first device, say a Ball Grid Array (BGA) package or a chip or a wafer, having a generally flat surface, and having at least a first and a second contact pads arranged along said flat surface, said contact pads of said first device being referred to as the chip contact pads, to be subsequently attached to a second device, say a Printed Circuit Board (PCB) or a substrate, having a generally flat surface, and having at least a first and a second contact pads arranged along said flat surface, said contact pads of said second device being referred to as the substrate contact pads, said method comprising:
  a) providing at least a first and a second connecting elements, each one of said first and second connecting elements having a tall slender columnar shape body, having a first end portion and a second end portion, with the portion of the body between said two ends being referred to as the stem, said first end of each one of said connecting elements being referred to as the chip end, and said second end of each one of said connecting elements being referred to as the substrate end,
  wherein said connecting elements are grown on said first device, using methods already known in the industry,
  and wherein said chip end of the first connecting element is attached to a first chip contact pad on said first device, and said chip end of the second connecting element is attached to the second chip contact pad of said first device,
  resulting in a device with columnar leads, referred to as a dead roach chip or simply a roach chip,
  wherein
  said connecting elements comprise migration prevention means to prevent any joining materials, which may be present during step (a), which could be liquid or molten, from migrating away from the joints at said chip ends of said connecting elements towards the center of said connecting elements along the stem of said connecting elements, and/or from attaching themselves to said stems.

34. A method as in claim 33, wherein said migration prevention means are provided near both ends of each one of said connecting elements, so that when said roach chip is joined, in a subsequent joining process, to a second device, having corresponding contact pads, then said migration prevention means will prevent any materials, which may be present during said subsequent joining process, which could be liquid or molten, from migrating away from the joints at said substrate ends of said connecting elements towards the center of said connecting elements along the stem of said connecting elements, and/or from attaching themselves to said stems.

35. A method as in claim 33, wherein said connecting elements are curvilinear and have a generally arcuate shape and are amenable to be parallel nested.

36. A method as in claim 33, wherein said migration prevention means is brought about by creating a dam obstructing the flow of said joining materials, from the end of said connecting element toward the center of said connecting element, wherein said dam can simply be a bulge or a change in the dimension, e.g. the diameter, of said connecting element, so that said joining materials would not have the tendency to flow beyond said dam at the end of said connecting element.

37. A method as in claim 33, wherein said migration prevention means is brought about by controlling the characteristic nature of the connecting elements, from a certain point near the ends of said connecting elements, this characteristic being the affinity of said joining materials to adhere to the surface of the connecting elements, at least two control locations along the connecting elements, where the first control location, having high adherence affinity, has a certain length along the connecting element, from the tip or end of the connecting element, where said joining materials has high affinity to adhere to the connecting element, and the second control location has low adherence affinity, and is located beyond the first control location, towards the center or stem of the connecting element, where said joining materials will not have enough affinity to adhere.

38. A method as in claim 33, wherein a conductive layer is applied to the outside of the connecting elements, over a non-conductive layer, to simulate a coax cable effect, and wherein said conductive layer could eventually be grounded, if desired.

39. A method as in claim 33, wherein the connecting elements are grown so that they have a rectangular cross-section, and so that they would be oriented to provide the least resistance to bending in the direction of the expected thermal deformation.

40. A method as in claim 33, wherein said devices are prepared so as to have a solder well around their contact pads.

* * * * *